United States Patent
Yamamoto et al.

(10) Patent No.: US 10,804,472 B2
(45) Date of Patent: Oct. 13, 2020

(54) LIGHT-EMITTING ELEMENT, LIGHT-EMITTING DEVICE, LIGHT SOURCE, AUTHENTICATION DEVICE, AND ELECTRONIC APPARATUS

(71) Applicant: SEIKO EPSON CORPORATION, Tokyo (JP)

(72) Inventors: Hidetoshi Yamamoto, Suwa (JP); Yuiga Hamade, Fujimi-machi (JP); Tetsuji Fujita, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 305 days.

(21) Appl. No.: 15/913,047

(22) Filed: Mar. 6, 2018

(65) Prior Publication Data

US 2018/0261773 A1   Sep. 13, 2018

(30) Foreign Application Priority Data

Mar. 13, 2017   (JP) ................. 2017-047586

(51) Int. Cl.
  *H01L 51/00*   (2006.01)
  *G06K 9/00*    (2006.01)
  *H01L 51/50*   (2006.01)

(52) U.S. Cl.
  CPC ........ *H01L 51/0061* (2013.01); *G06K 9/0004* (2013.01); *H01L 51/0054* (2013.01);
  (Continued)

(58) Field of Classification Search
  None
  See application file for complete search history.

(56) References Cited

U.S. PATENT DOCUMENTS

2012/0262057 A1* 10/2012 Fujita ............... C07D 471/04
                                                                313/504
2012/0267615 A1* 10/2012 Fujita ............... C09K 11/06
                                                                257/40

(Continued)

FOREIGN PATENT DOCUMENTS

JP   2012-219078 A   11/2012
JP   2013-35784 A    2/2013
(Continued)

OTHER PUBLICATIONS

Tao et al. "Efficient Near-Infrared-Emitting Cationic Iridium Complexes as Dopants for OLEDs with Small Efficiency Roll-Off" J. Phys. Chem. C. 2012, 116, 11658-11664. (Year: 2012).*
(Continued)

*Primary Examiner* — Robert S Loewe
(74) *Attorney, Agent, or Firm* — Oliff PLC

(57) ABSTRACT

A light-emitting element according to the invention includes an anode, a cathode, and a light-emitting layer which is provided between the anode and the cathode, contains a light-emitting material and a host material that holds the light-emitting material, and emits light having a peak wavelength in a near-infrared region by applying a current between the anode and the cathode, wherein the content of the light-emitting material in the light-emitting layer is 30 wt % or more and 70 wt % or less. Further, it is preferred that the light-emitting layer emits light having the peak wavelength of 700 nm or more and 960 nm or less.

13 Claims, 5 Drawing Sheets

(52) U.S. Cl.
CPC ...... *H01L 51/0059* (2013.01); *H01L 51/0071* (2013.01); *G06K 9/00087* (2013.01); *G06K 2009/00932* (2013.01); *H01L 51/508* (2013.01); *H01L 51/5012* (2013.01); *H01L 51/5024* (2013.01); *H01L 51/5056* (2013.01); *H01L 51/5072* (2013.01); *H01L 51/5088* (2013.01); *H01L 51/5092* (2013.01)

(56) References Cited

U.S. PATENT DOCUMENTS

| | | | | |
|---|---|---|---|---|
| 2013/0037784 | A1* | 2/2013 | Yamamoto | C07D 487/04 257/40 |
| 2013/0037785 | A1* | 2/2013 | Fujita | H01L 51/0059 257/40 |
| 2013/0168654 | A1* | 7/2013 | Fujita | H01L 51/0071 257/40 |
| 2013/0221334 | A1* | 8/2013 | Yamamoto | C07D 513/04 257/40 |
| 2014/0110686 | A1* | 4/2014 | Fujita | H01L 51/0058 257/40 |
| 2015/0295182 | A1* | 10/2015 | Fujita | H01L 51/0061 257/40 |
| 2016/0359117 | A1* | 12/2016 | Hamade | H01L 51/0061 |
| 2017/0200901 | A1* | 7/2017 | Fujita | C07D 513/04 |

FOREIGN PATENT DOCUMENTS

| | | |
|---|---|---|
| JP | 2013-177327 A | 9/2013 |
| JP | 2013-179123 A | 9/2013 |
| JP | 2015-207759 A | 11/2015 |

OTHER PUBLICATIONS

Qian et al. "Synthesis and Application of Thiadiazoloquinozaline-Containing Chromophores as Dopants for Efficient Near-Infrared Organic Light-Emitting Diodes" J. Phys. Chem. C 2009, 113, 1589-1595. (Year: 2009).*

Qian et al. "Simple and Efficient Near-Infrared Organic Chromophores for Light-Emitting Diodes with Single Electroluminescent Emission above 1000 nm" Adv. Mater. 2009, 21, 111-116. (Year: 2009).*

Qian et al. "Band Gap Tunable, Donor-Acceptor-Donor Charge-Transfer Heteroquinoid-Based Chromophores: Near Infrared Photoluminescence and Electroluminescence" Chem. Mater, 2008, 20, 6208-6216. (Year: 2008).*

* cited by examiner

LIGHT-EMITTING ELEMENT, LIGHT-EMITTING DEVICE, LIGHT SOURCE, AUTHENTICATION DEVICE, AND ELECTRONIC APPARATUS

BACKGROUND

1. Technical Field

The present invention relates to a light-emitting element, a light-emitting device, a light source, an authentication device, and an electronic apparatus.

2. Related Art

An organic electroluminescence element (so-called organic EL element) is a light-emitting element having a structure in which at least one layer of a luminous organic layer is interposed between an anode and a cathode. In such a light-emitting element, by applying an electric field between the cathode and the anode, an electron is injected into a light-emitting layer from the cathode side and also a hole is injected into the light-emitting layer from the anode side, and the electron and the hole are recombined in the light-emitting layer, whereby an exciton is generated, and energy generated when this exciton is returned to a ground state is released as light.

As such a light-emitting element, there is known a light-emitting element which emits light in a long wavelength region exceeding 700 nm (see, for example, JP-A-2012-219078 (Patent Document 1), JP-A-2013-35784 (Patent Document 2), or JP-A-2015-207759 (Patent Document 3)).

In a light-emitting element disclosed in Patent Documents 1 to 3, by configuring a light-emitting layer to contain a light-emitting material and a host material that holds the light-emitting material, and further by setting the content of the light-emitting material in the light-emitting layer to about 10% or less, high efficiency of the light-emitting element is realized.

However, in such a light-emitting element, high efficiency of the light-emitting element is achieved by setting the content of the light-emitting material in the light-emitting layer low such that it is about 10% or less, however, on the contrary, there is a problem that the emission wavelength of the light-emitting layer shifts to the shorter wavelength side from the original emission wavelength of the light-emitting material, and therefore, the light-emitting element which emits light in a longer wavelength region cannot be obtained.

SUMMARY

An advantage of some aspects of the invention is to provide a light-emitting element including a light-emitting layer which emits light having a longer wavelength in a near-infrared region while achieving high efficiency, and a light-emitting device, a light source, an authentication device, and an electronic apparatus, each of which includes this light-emitting element, and has excellent reliability.

The advantage can be achieved by the following configurations.

A light-emitting element according to an aspect of the invention includes an anode, a cathode, a light-emitting layer which is provided between the anode and the cathode, contains a light-emitting material and a host material that holds the light-emitting material, and emits light having a peak wavelength in a near-infrared region by applying a current between the anode and the cathode, wherein the content of the light-emitting material in the light-emitting layer is 30 wt % or more and 70 wt % or less.

According to this configuration, the light-emitting element including a light-emitting layer which emits light having a longer wavelength in a near-infrared region while achieving high efficiency can be realized.

In the light-emitting element according to the aspect of the invention, it is preferred that the light-emitting material contains at least one of a compound represented by the following general formula (IRD1) and a compound represented by the following general formula (IRD2).

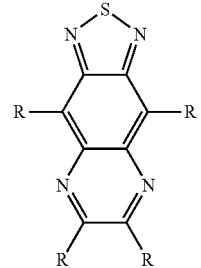

(IRD1)

In the formula (IRD1), R each independently represents an aryl group, an arylamino group, triarylamine, or a group containing at least one of the derivatives thereof.

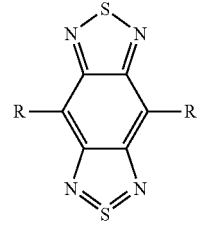

(IRD2)

In the formula (IRD2), R each independently represent a phenyl group, a thiophenyl group, a furyl group, or a group containing at least one of the derivatives thereof.

According to this configuration, the light-emitting element more reliably includes a light-emitting layer which emits light having a longer wavelength in a near-infrared region while achieving high efficiency.

In the light-emitting element according to the aspect of the invention, it is preferred that the compound represented by the general formula (IRD1) is a compound represented by the following formula IRD1-1.

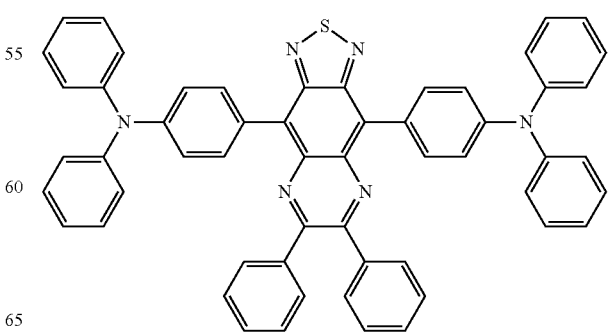

IRD1-1

According to this configuration, the light-emitting element more reliably includes a light-emitting layer which emits light having a longer wavelength in a near-infrared region while achieving high efficiency.

In the light-emitting element according to the aspect of the invention, it is preferred that the compound represented by the general formula (IRD2) is a compound represented by the following formula IRD2-1.

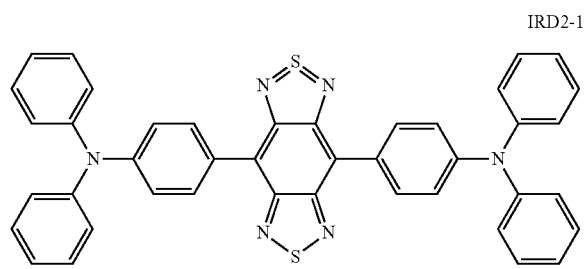

IRD2-1

According to this configuration, the light-emitting element more reliably includes a light-emitting layer which emits light having a longer wavelength in a near-infrared region while achieving high efficiency.

In the light-emitting element according to the aspect of the invention, it is preferred that the host material contains a compound represented by the following formula IRH1.

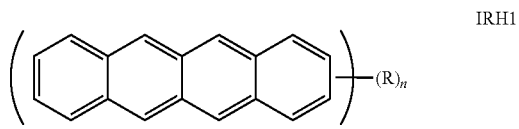

IRH1

In the formula IRH1, n represents a natural number of 1 to 12, and R each independently represents a hydrogen atom, an alkyl group, an aryl group which may have a substituent, or an arylamino group.

Such a tetracene-based material (particularly, a compound represented by the above formula IRH1) is a compound having low polarity (small polarization). Therefore, by using the tetracene-based material as the host material, the interaction between the molecules of the light-emitting material can be reduced. Therefore, the concentration quenching property attributed to this interaction can be reduced.

In the light-emitting element according to the aspect of the invention, it is preferred that the light-emitting layer emits light having the peak wavelength of 700 nm or more and 960 nm or less.

By applying the configuration of the invention, the peak wavelength of the light emitted from the light-emitting layer can be set within the above range.

In the light-emitting element according to the aspect of the invention, it is preferred that the content of the light-emitting material in the light-emitting layer is 50 wt % or more and 70 wt % or less.

According to this configuration, even in a case where the light-emitting material is contained at a higher concentration in the light-emitting layer in this manner, while more accurately suppressing the occurrence of concentration quenching, the shift of the emission wavelength to the shorter wavelength side can be more accurately suppressed.

A light-emitting device according to an aspect of the invention includes the light-emitting element according to the aspect of the invention.

Such a light-emitting device can emit light having a longer wavelength in a near-infrared region while achieving high efficiency, and has excellent reliability.

A light source according to an aspect of the invention includes the light-emitting element according to the aspect of the invention.

Such a light source can emit light having a longer wavelength in a near-infrared region while achieving high efficiency, and has excellent reliability.

An authentication device according to an aspect of the invention includes the light-emitting element according to the aspect of the invention.

Such an authentication device can emit light having a longer wavelength in a near-infrared region while achieving high efficiency, and has excellent reliability.

An electronic apparatus according to an aspect of the invention includes the light-emitting element according to the aspect of the invention.

Such an electronic apparatus can emit light having a longer wavelength in a near-infrared region while achieving high efficiency, and has excellent reliability.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Hereinafter, a light-emitting element, a light-emitting device, a light source, an authentication device, and an electronic apparatus according to the invention will be described with reference to preferred embodiments shown in the accompanying drawings.

Figure 1:
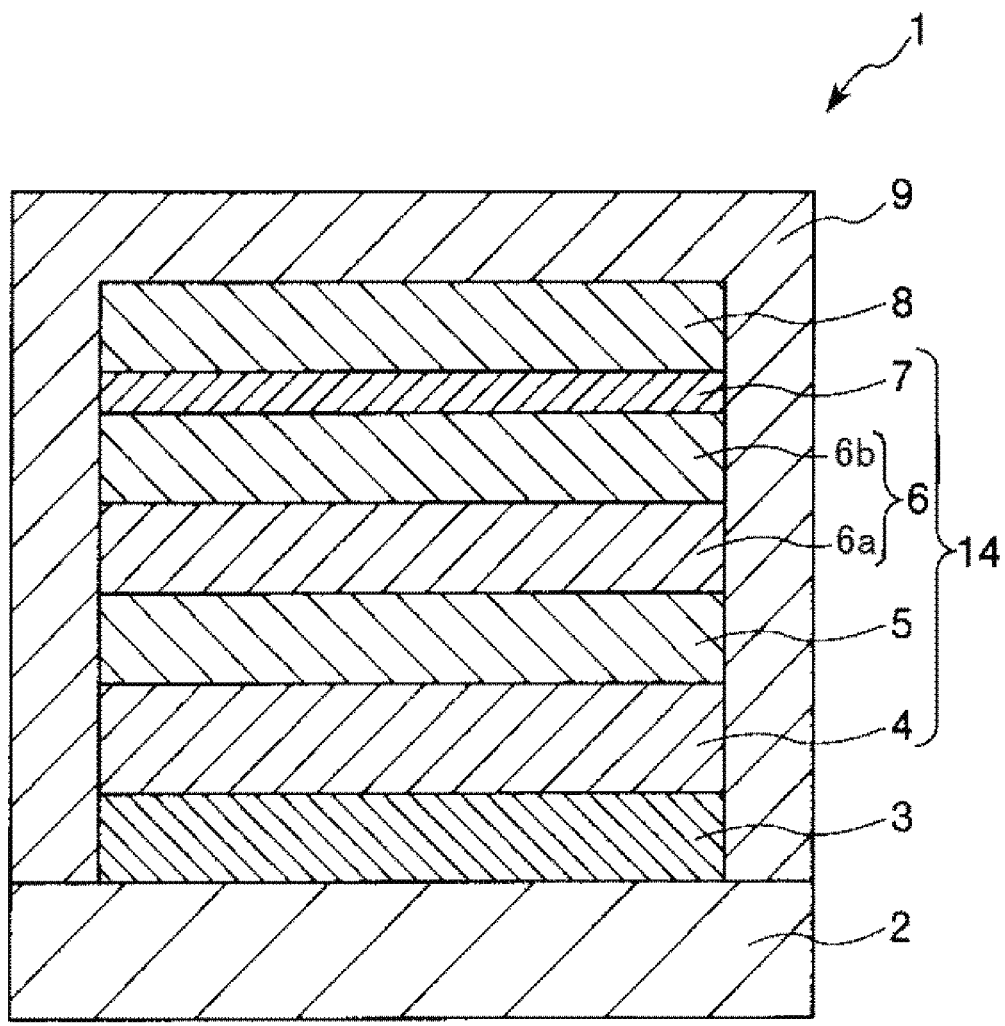
FIG. 1 is a cross-sectional view schematically showing a light-emitting element according to an embodiment of the invention.

FIG. 1 is a cross-sectional view schematically showing a light-emitting element according to an embodiment of the invention. Hereinafter, for the sake of convenience of explanation, a description will be given by referring to the upper side and the lower side in FIG. 1 as "upper" and "lower", respectively.

In this embodiment, as shown in FIG. 1, a light-emitting element (electroluminescence element) 1 is constituted by stacking an anode 3, a hole injection layer 4, a light-emitting layer 5, an electron transport layer 6, an electron injection layer 7, and a cathode 8 in this order. That is, the light-emitting element 1 includes the anode 3, the cathode 8, and a stacked body 14, which is interposed between the anode 3 and the cathode 8, and in which the hole injection layer 4, the light-emitting layer 5, the electron transport layer 6, and the electron injection layer 7 are stacked in this order from the anode 3 side to the cathode 8 side.

The entire light-emitting element 1 is provided on a substrate 2 and sealed with a sealing member 9.

Such a light-emitting element 1 includes the anode 3, the cathode 8, and the light-emitting layer 5 provided between the anode 3 and the cathode 8. By applying a driving voltage to the anode 3 and the cathode 8 so as to apply a current between the anode 3 and the cathode 8, that is, to the light-emitting layer 5, an electron is supplied (injected) to the light-emitting layer 5 from the cathode 8 side, and also a hole is supplied (injected) to the light-emitting layer 5 from the anode 3 side. Then, the hole and the electron are recombined in the light-emitting layer 5, and an exciton is generated by energy released at the time of this recombination, and when the exciton is returned to a ground state, energy (fluorescence or phosphorescence) is released (light is emitted). In this manner, the light-emitting element 1 (light-emitting layer 5) emits light in a wavelength region as described later.

In this embodiment, as described later, this light-emitting element 1 contains a thiadiazole-based compound which is a compound represented by the following general formula (IRD1) or a benzo-bis-thiadiazole-based compound which is a compound represented by the following general formula (IRD2) as a light-emitting material. According to this, the light-emitting element 1 (light-emitting layer 5) emits light in a near-infrared region which is a wavelength region such that the peak wavelength is 700 nm or more (preferably 700 nm or more and 960 nm or less). The "near-infrared region" as used herein refers to a wavelength region with a peak wavelength of 700 nm or more and 1500 nm or less.

The substrate 2 supports the anode 3. The light-emitting element 1 of this embodiment is configured to extract light from the substrate 2 side (bottom emission type), and therefore, the substrate 2 and the anode 3 are each configured to be substantially transparent (colorless and transparent, colored and transparent, or semi-transparent).

Examples of the constituent material of the substrate 2 include resin materials such as polyethylene terephthalate, polyethylene naphthalate, polypropylene, a cycloolefin polymer, polyamide, polyether sulfone, polymethyl methacrylate, polycarbonate, and polyarylate, and glass materials such as quartz glass and soda glass, and among these, it is possible to use one type or two or more types in combination.

The average thickness of such a substrate 2 is not particularly limited, but is preferably about 0.1 mm or more and 30 mm or less, more preferably about 0.1 mm or more and 10 mm or less.

In a case where the light-emitting element 1 is configured to extract light from the side opposite to the substrate 2 (top emission type), both a transparent substrate and a non-transparent substrate can be used as the substrate 2.

Examples of the non-transparent substrate include a substrate constituted by a ceramic material such as alumina, a substrate having an oxide film (insulating film) formed on the surface of a metal substrate such as stainless steel, and a substrate constituted by a resin material.

Further, in such a light-emitting element 1, the distance between the anode 3 and the cathode 8 (that is, the average thickness of the stacked body 14) is preferably 100 nm or more and 500 nm or less, more preferably 100 nm or more and 300 nm or less, further more preferably 100 nm or more and 250 nm or less. According to this, the driving voltage of the light-emitting element 1 can be easily and reliably decreased within a practical range.

Hereinafter, the respective sections constituting the light-emitting element 1 will be sequentially described.

Anode

The anode 3 is an electrode which injects holes into the hole injection layer 4. As the constituent material of the anode 3, a material having a large work function and excellent electrical conductivity is preferably used.

Examples of the constituent material of the anode 3 include oxides such as ITO (Indium Tin Oxide), IZO (Indium Zinc Oxide), $In_2O_3$, $SnO_2$, Sb-doped $SnO_2$, and Al-doped ZnO, Au, Pt, Ag, Cu, and an alloy containing any of these metals, and among these, it is possible to use one type or two or more types in combination.

In particular, the anode 3 is preferably constituted by ITO. ITO is a material which is transparent, and also has a large work function and excellent electrical conductivity. According to this, holes can be efficiently injected from the anode 3 into the hole injection layer 4.

Further, it is preferred that the surface of the anode 3 on the hole injection layer 4 side (the upper surface in FIG. 1) is subjected to a plasma treatment. According to this, the chemical and mechanical stability of the joining surface of the anode 3 and the hole injection layer 4 can be increased. As a result, the hole injection property from the anode 3 into the hole injection layer 4 can be improved. Such a plasma treatment will be described in detail in the description of the below-mentioned production method for the light-emitting element 1.

The average thickness of such an anode 3 is not particularly limited, but is preferably about 10 nm or more and 200 nm or less, more preferably about 50 nm or more and 150 nm or less.

Cathode

The cathode 8 is an electrode which injects electrons into the electron transport layer 6 through the below-mentioned electron injection layer 7. As the constituent material of the cathode 8, a material having a small work function is preferably used.

Examples of the constituent material of the cathode 8 include Li, Mg, Ca, Sr, La, Ce, Er, Eu, Sc, Y, Yb, Ag, Cu, Al, Cs, Rb, and an alloy containing any of these metals, and among these, it is possible to use one type or two or more types in combination (for example, as a stacked body of a plurality of layers, a mixed layer of a plurality of types, or the like).

In particular, in a case where an alloy is used as the constituent material of the cathode 8, it is preferred to use an alloy containing a stable metal element such as Ag, Al, or Cu, specifically, an alloy such as MgAg, AlLi, or CuLi. By using such an alloy as the constituent material of the cathode 8, the electron injection efficiency and stability of the cathode 8 can be improved.

The average thickness of such a cathode 8 is not particularly limited, but is preferably about 100 nm or more and 10000 nm or less, more preferably about 100 nm or more and 500 nm or less.

The light-emitting element 1 of this embodiment is of a bottom emission type, and therefore, a light transmission property is not particularly required for the cathode 8. In a case where the light-emitting element 1 is of a top emission type, it is necessary that light be transmitted from the cathode 8 side, and therefore, the average thickness of the cathode 8 is preferably about 1 nm or more and 50 nm or less.

Hole Injection Layer

The hole injection layer 4 has a function to improve the hole injection efficiency from the anode 3 (that is, has a hole injection property). According to this, the luminous efficiency of the light-emitting element 1 can be increased. Here, the hole injection layer 4 also has a function to transport holes injected from the anode 3 to the light-emitting layer 5 (that is, has a hole transport property). Therefore, since the hole injection layer 4 has a hole transport property as described above, it can also be said that the hole injection layer 4 is a hole transport layer. A hole transport layer constituted by a material different from that of the hole injection layer 4 (for example, an amine-based compound such as a benzidine derivative) may be separately provided between the hole injection layer 4 and the light-emitting layer 5.

This hole injection layer 4 contains a material having a hole injection property (a hole injection material).

The hole injection material contained in this hole injection layer 4 is not particularly limited, and examples thereof include copper phthalocyanine and amine-based materials such as 4,4',4"-tris(N,N-phenyl-3-methylphenylamino)triphenylamine (m-MTDATA) and N,N'-bis-(4-diphenylamino-phenyl)-N,N'-diphenyl-biphenyl-4-4'-diamine.

Above all, as the hole injection material contained in the hole injection layer 4, from the viewpoint of excellent hole injection property and hole transport property, it is preferred to use an amine-based material, and it is more preferred to use a diaminobenzene derivative, a benzidine derivative (a material having a benzidine skeleton), a triamine-based compound and a tetraamine-based compound, each having both a "diaminobenzene" unit and a "benzidine" unit in the molecule (specifically, for example, compounds represented by the following formulae HIL-1 to HIL-27).

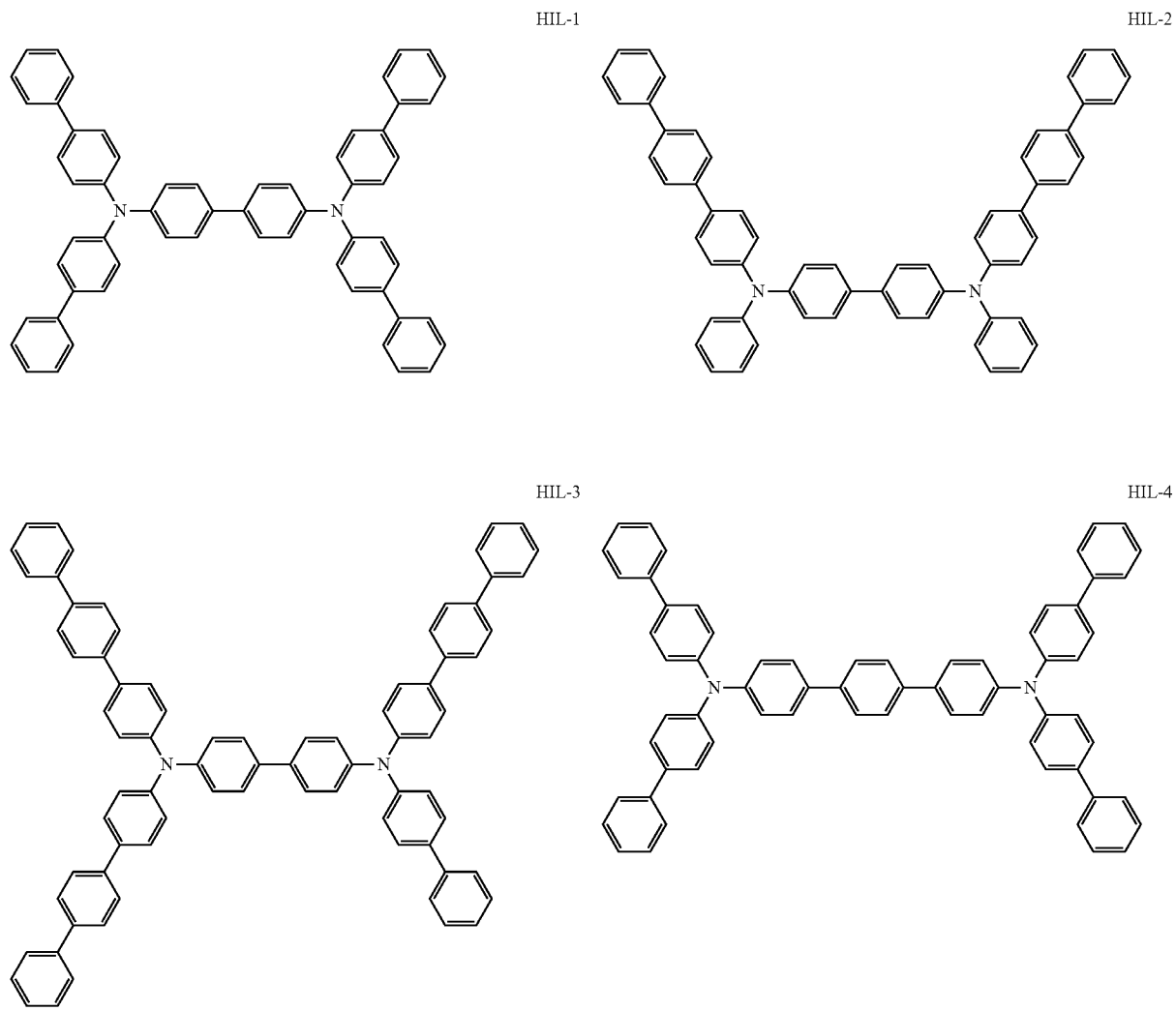

-continued
HIL-5
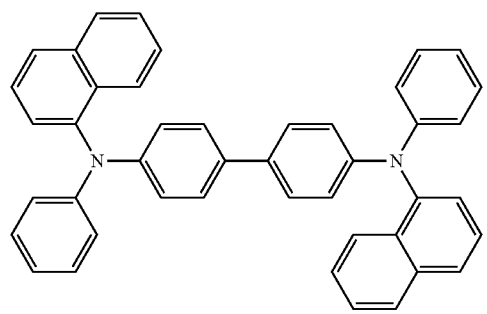
HIL-6
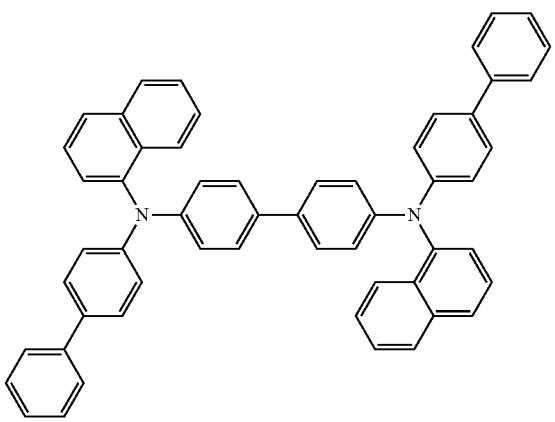
HIL-7
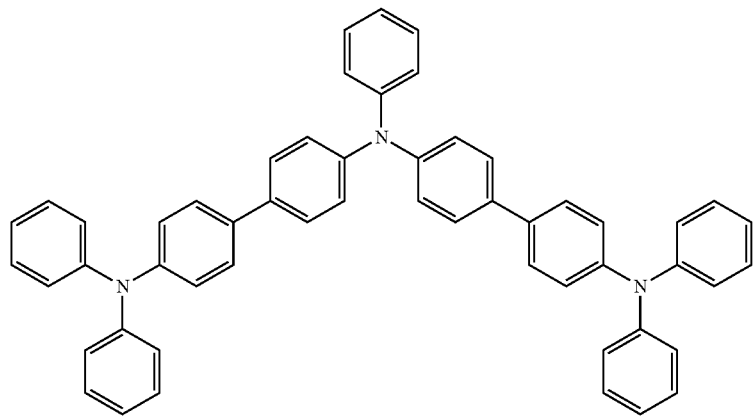
HIL-8
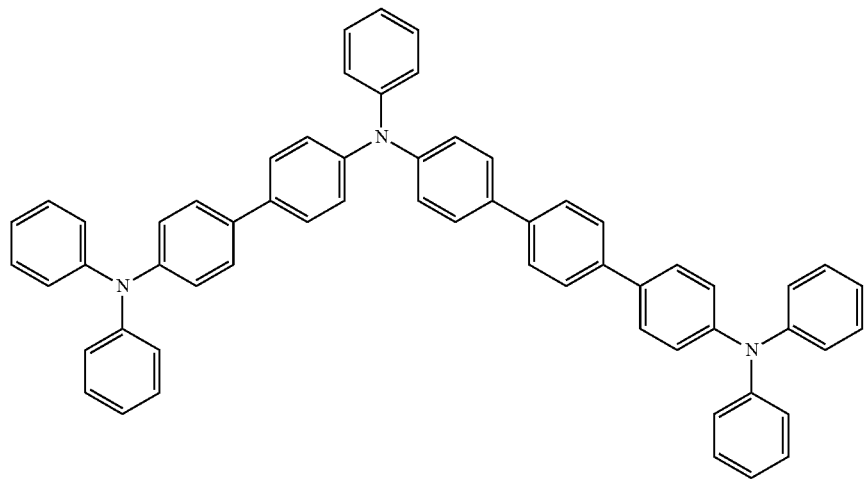
HIL-9
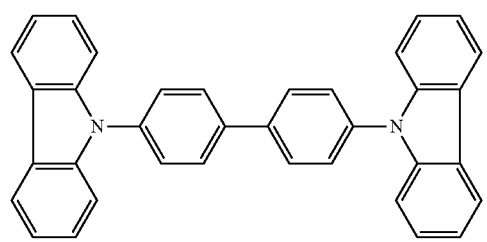
HIL-10
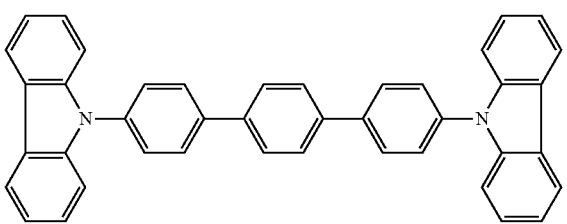

-continued
HIL-11
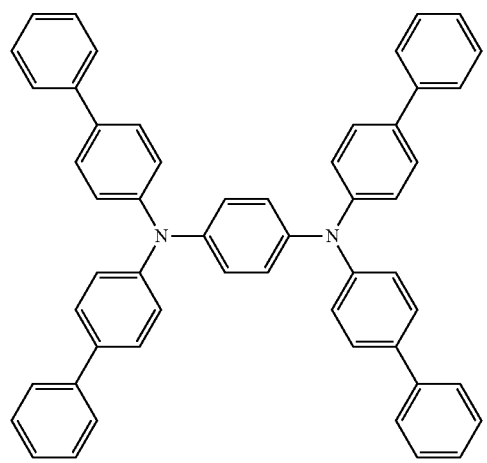
HIL-12
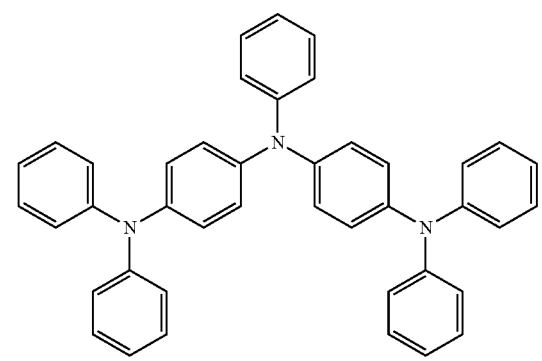
HIL-13
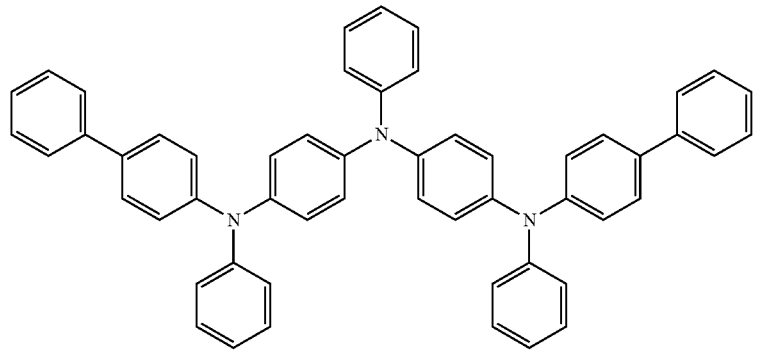
HIL-14
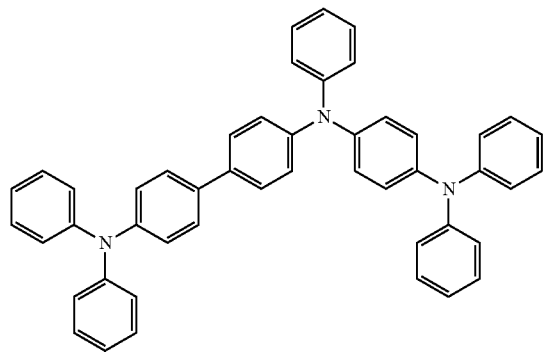
HIL-15
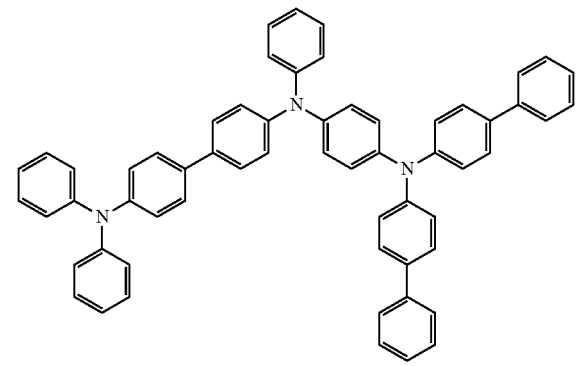

HIL-16
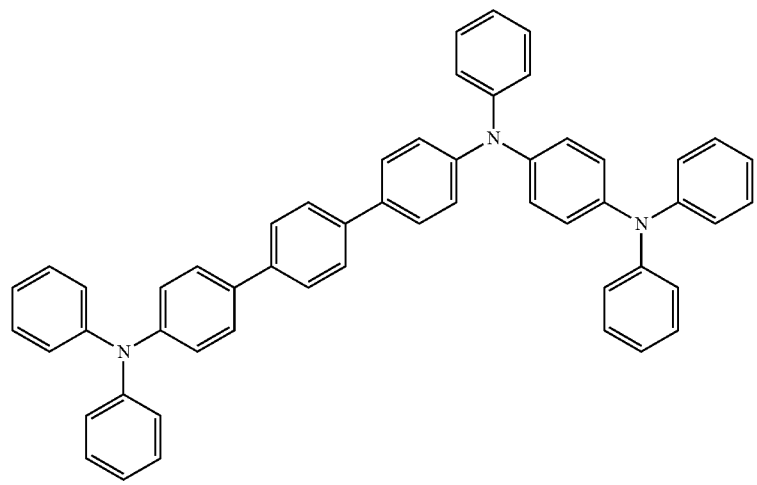
HIL-17
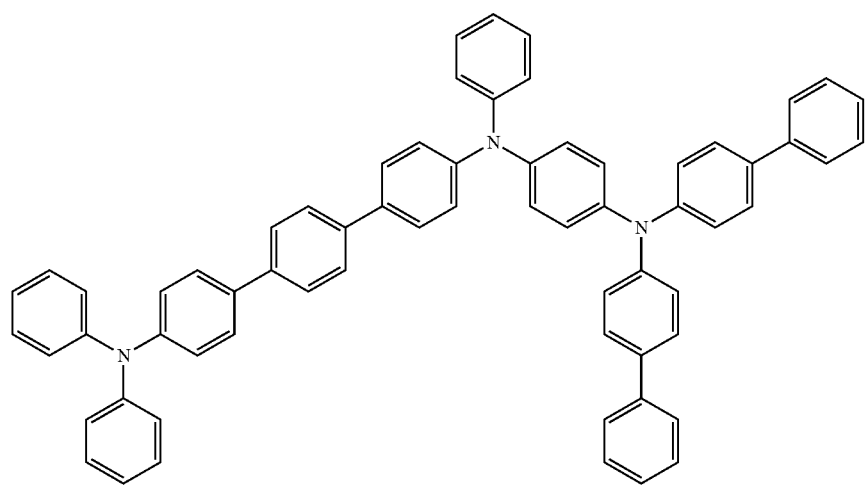
HIL-18
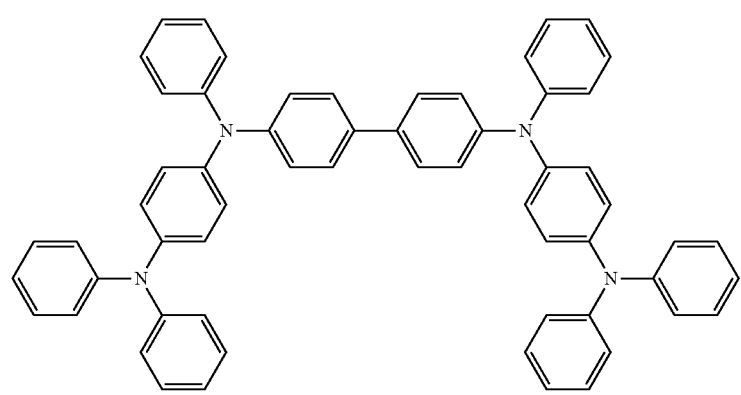

-continued
HIL-19
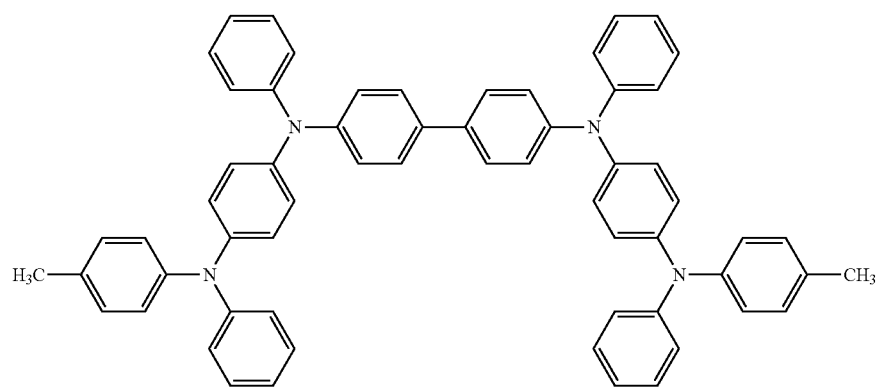
HIL-20
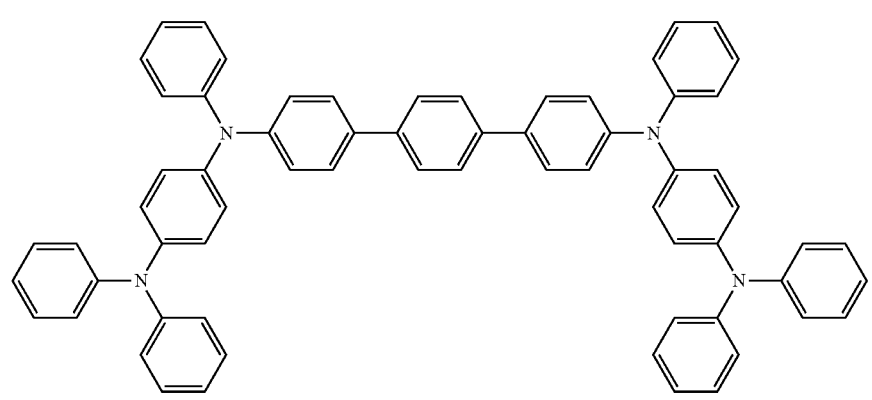
HIL-21
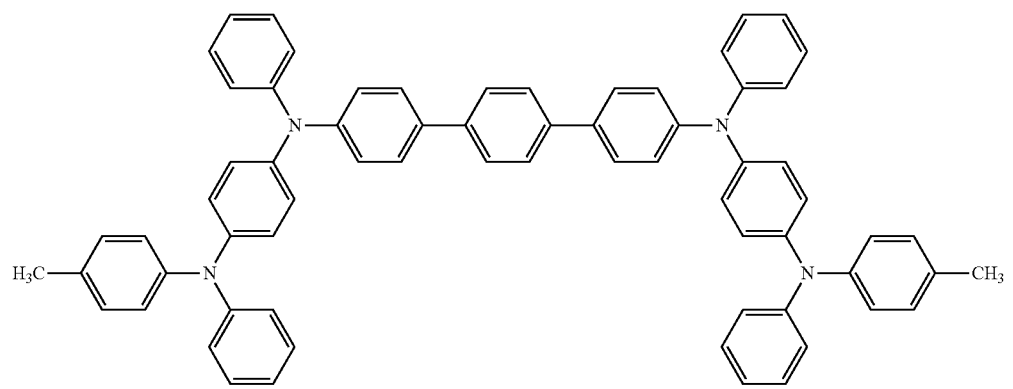
HIL-22
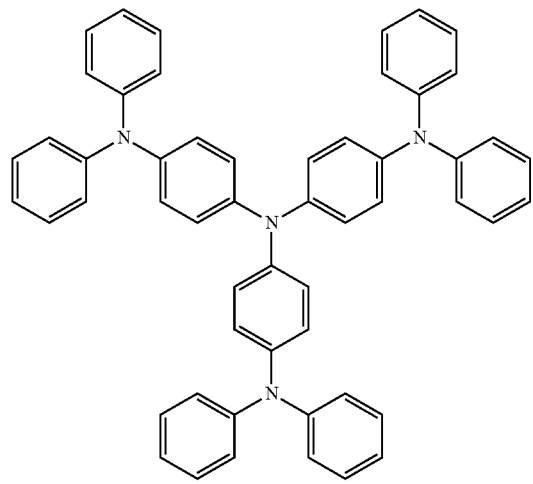
HIL-23
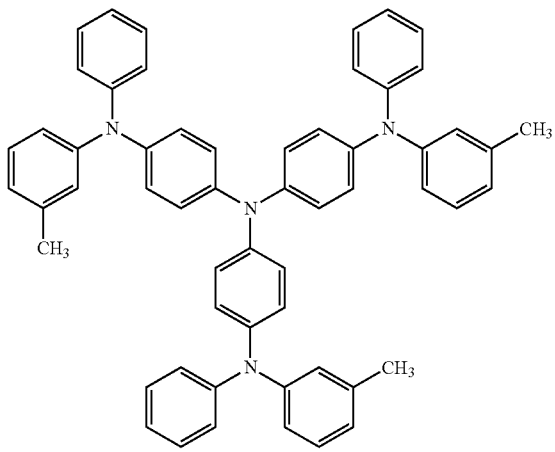

-continued

HIL-24

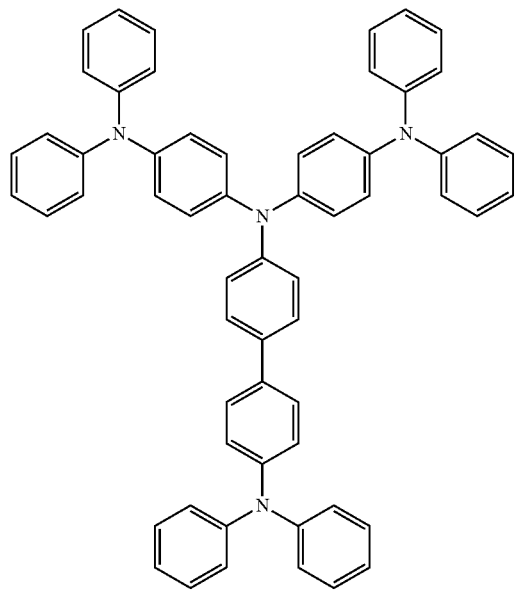

HIL-25

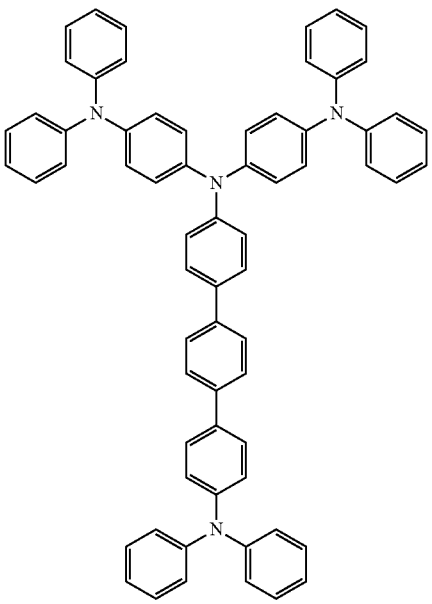

HIL-26

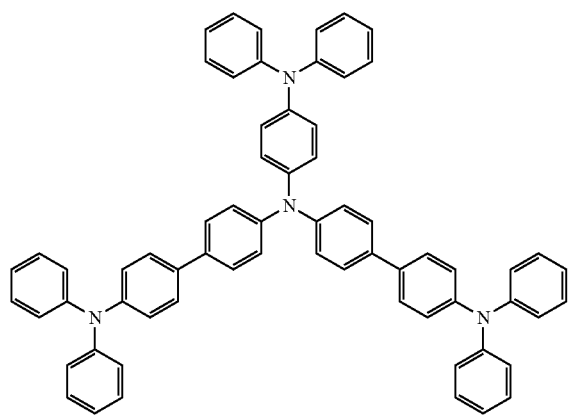

HIL-27

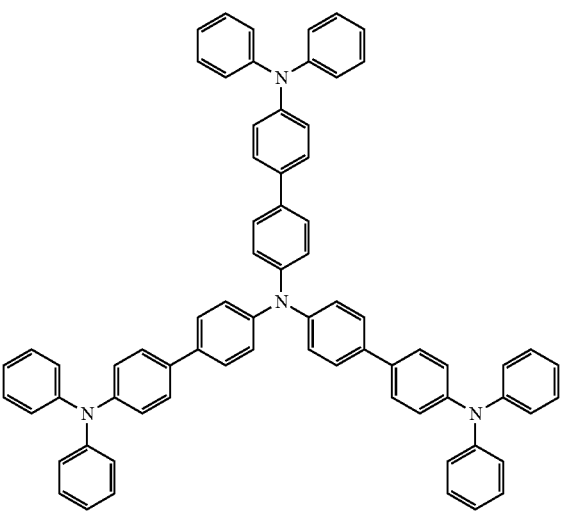

It is preferred that a difference between the LUMO of the constituent material of the hole injection layer 4 and the LUMO of a host material to be used in the light-emitting layer 5 is 0.5 eV or more. According to this, electrons coming out of the light-emitting layer 5 to the hole injection layer are reduced, and thus, the luminous efficiency can be increased.

Further, the HOMO of the constituent material of the hole injection layer 4 is preferably 4.7 eV or more and 5.8 eV or less, and the LUMO of the constituent material of the hole injection layer 4 is preferably 2.2 eV or more and 3.0 eV or less.

The average thickness of such a hole injection layer 4 is not particularly limited, but is preferably about 5 nm or more and 90 nm or less, more preferably about 10 nm or more and 70 nm or less.

This hole injection layer 4 may be omitted depending on the combination of the constituent materials of other layers or the like.

Light-Emitting Layer

The light-emitting layer 5 emits light by applying a current between the anode 3 and the cathode 8 described above.

In the invention, the light-emitting layer 5 contains a light-emitting material that functions as a light-emitting dopant and a host material that holds the light-emitting material.

In the light-emitting layer 5, the light-emitting material is constituted by including a material which enables the light-emitting layer 5 to emit light having a peak wavelength in a near-infrared region (700 nm or more, preferably 700 nm or more and 960 nm or less).

Examples of the light-emitting material include a thiadiazole-based compound which is a compound represented by the following general formula (IRD1) (hereinafter also simply referred to as "thiadiazole-based compound") and a benzo-bis-thiadiazole-based compound which is a compound represented by the following general formula (IRD2)

(hereinafter also simply referred to as "benzo-bis-thiadiazole-based compound"), and among these, it is possible to use one type or two or more types in combination. According to this, the light-emitting layer 5 can be reliably made to emit light having a peak wavelength of 700 nm or more in a near-infrared region.

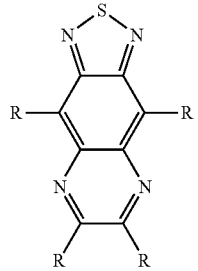

(IRD1)

In the general formula (IRD1), R each independently represents an aryl group, an arylamino group, triarylamine, or a group containing at least one of the derivatives thereof.

Examples of the group R in the general formula (IRD1) include an aryl group, an arylamino group, triarylamine, and derivatives thereof, and it is possible to use a combination of two or more types among these. The light-emitting layer 5 containing the thiadiazole-based compound including such a group R as a light-emitting dopant can emit light in a wavelength region of 700 nm or more (in a near-infrared region).

Specific examples of the thiadiazole-based compound including the group R as described above include compounds represented by the following formulae IRD1-1 to IRD1-12 and derivatives thereof.

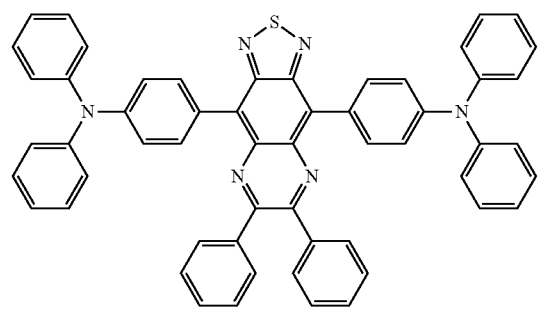

IRD1-1

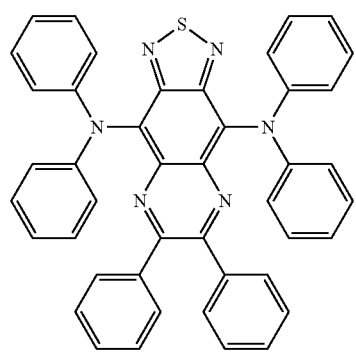

IRD1-2

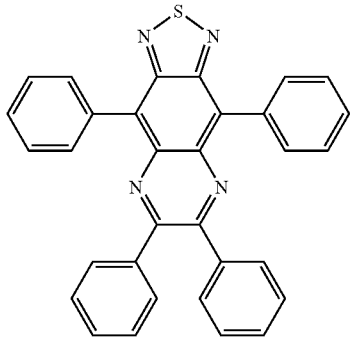

IRD1-3

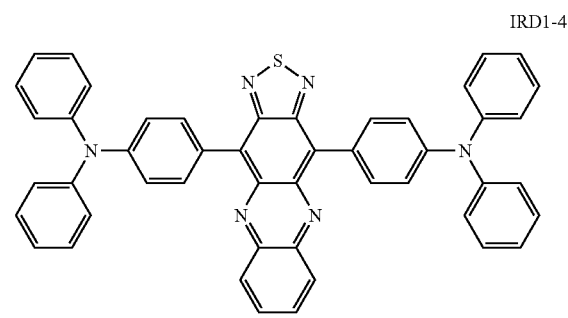

IRD1-4

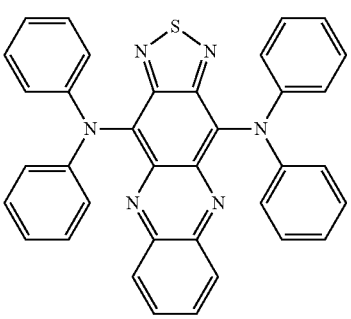

IRD1-5

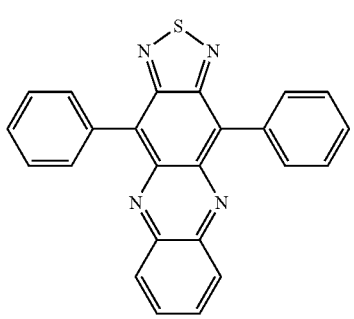

IRD1-6

IRD1-7
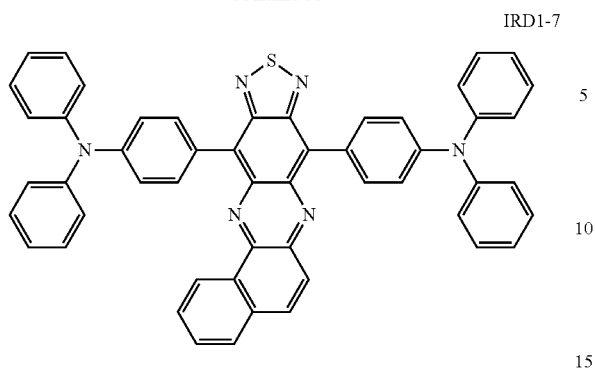

IRD1-11
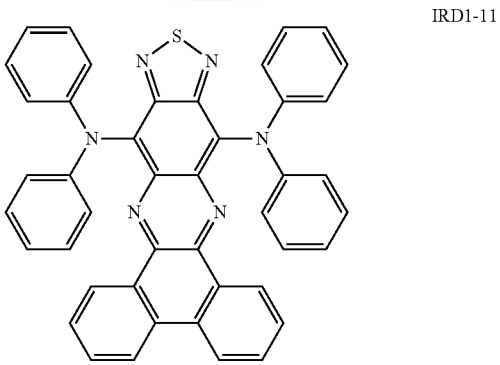

IRD1-8

IRD1-12
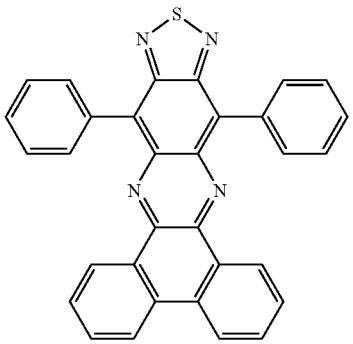

IRD1-9
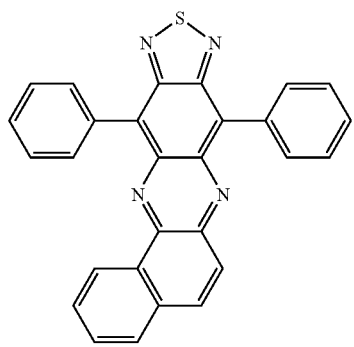

(IAD 2)
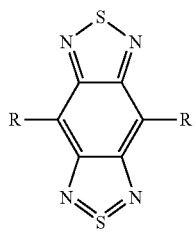

In the general formula (IRD2), each R independently represents a phenyl group, a thiophenyl group, a furyl group, or a group containing at least one of the derivatives thereof.

Each group R in the general formula (IRD2) is not particularly limited as long as it is a phenyl group, a thiophenyl group, a furyl group, or a group containing at least one of the derivatives thereof, however, for example, a group which contains a phenyl group, a thiophenyl group (thiophene group), a furyl group (furan group), an oxazole group, and an oxadiazole group or the like is exemplified, and the group R is preferably a group in which two or more types among these are combined. According to this, the light-emitting layer 5 containing the benzo-bis-thiadiazole-based compound including such a group R as a light-emitting dopant can emit light in a wavelength region of 700 nm or more (in a near-infrared region), particularly can emit light in a wavelength region of 850 nm or more and 1500 nm or less, which can be said to be a longer wavelength region.

IRD1-10
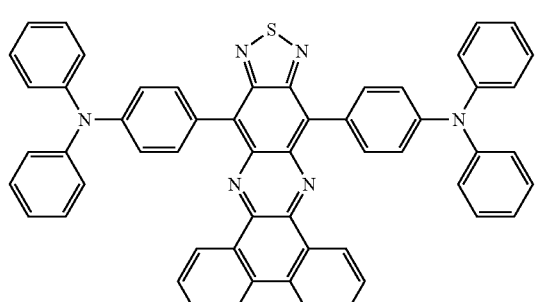

Specific examples of the benzo-bis-thiadiazole-based compound including the group R as described above include compounds represented by the following formulae IRD2-1 to IRD2-21 and derivatives thereof.

IRD2-1
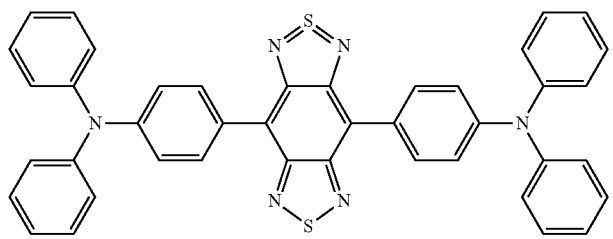
IRD2-2
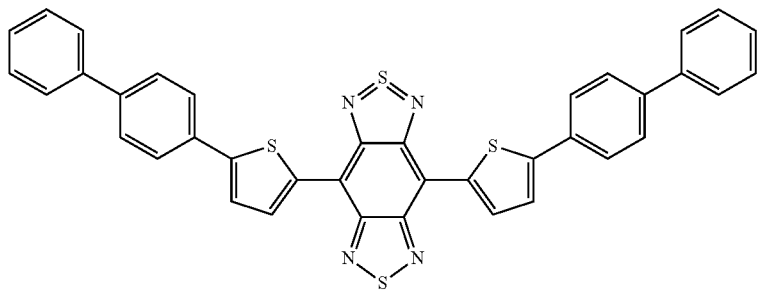
IRD2-3                     IRD2-4
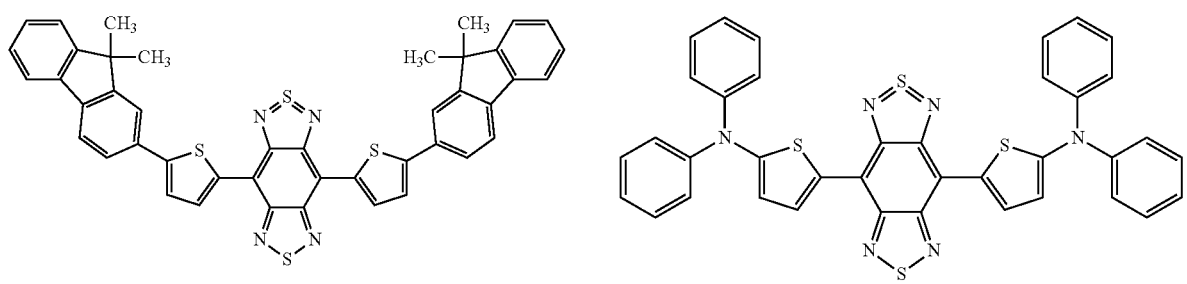
IRD2-5
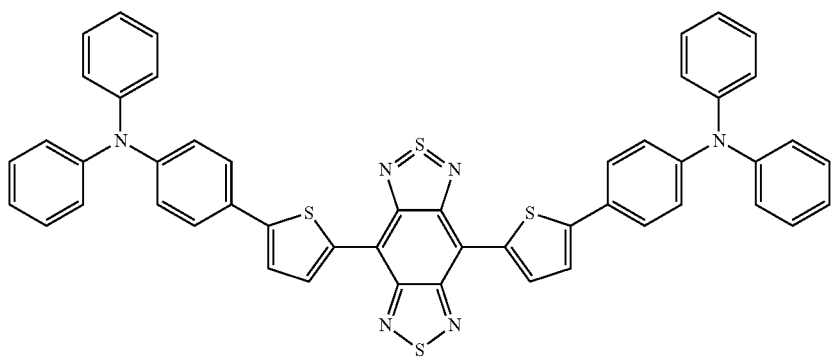
IRD2-6
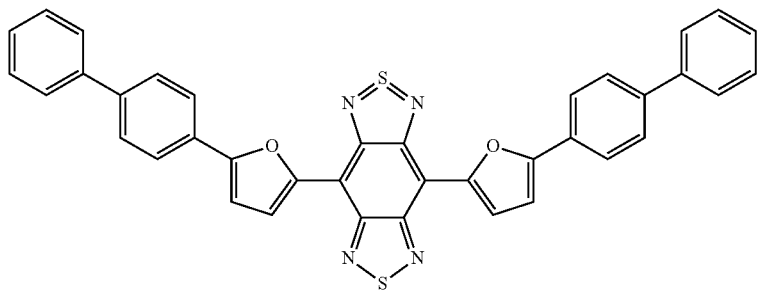

IRD2-7
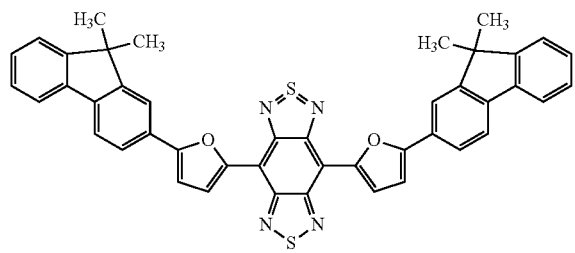
IRD2-8
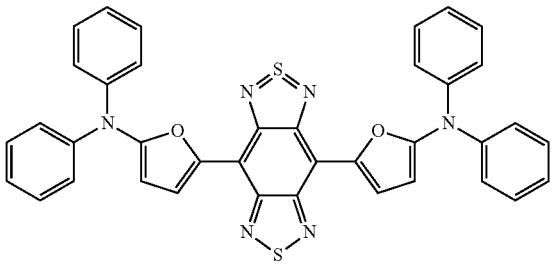
IRD2-9
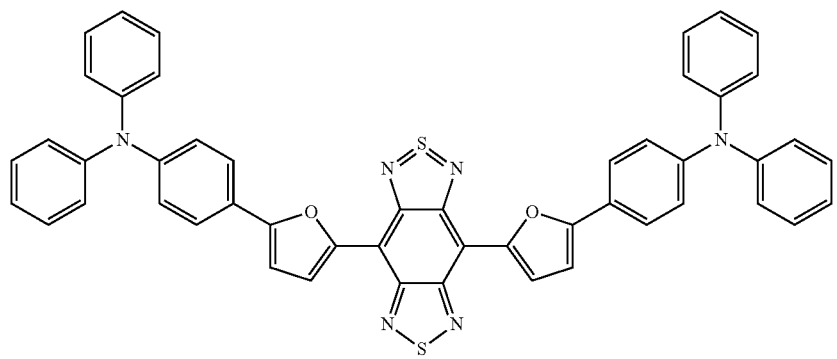
IRD2-10
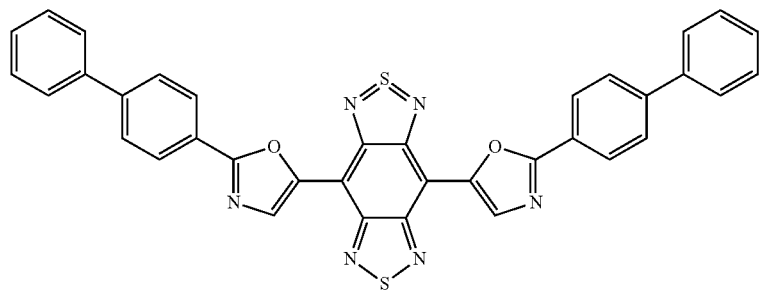
IRD2-11
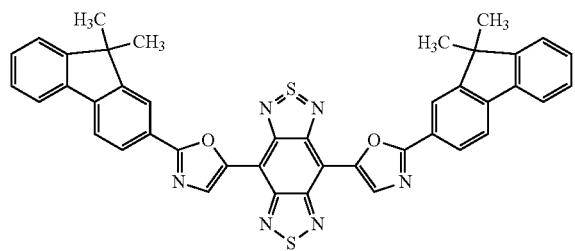
IRD2-12
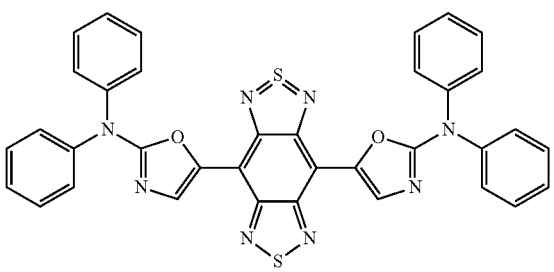
IRD2-13
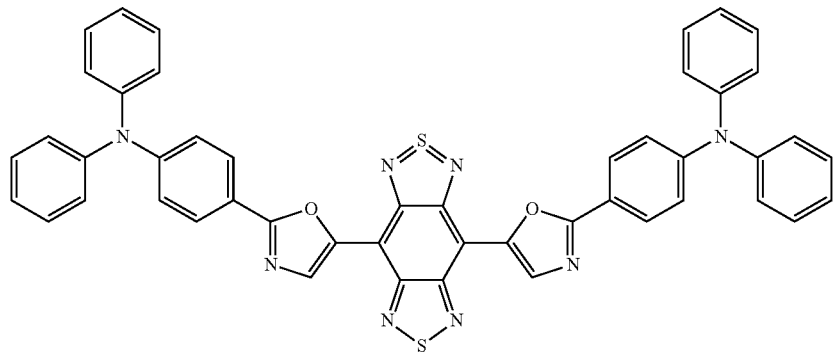

-continued
IRD2-14
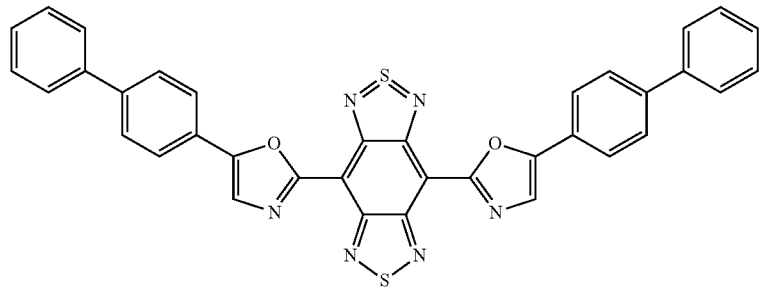
IRD2-15
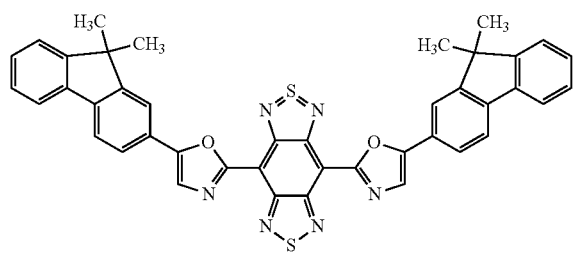
IRD2-16
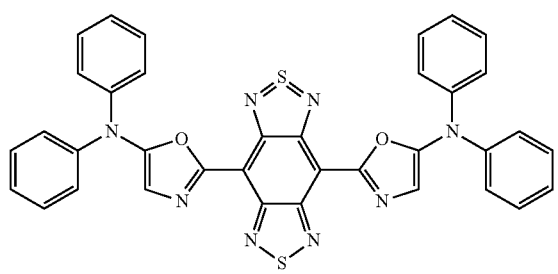
IRD2-17
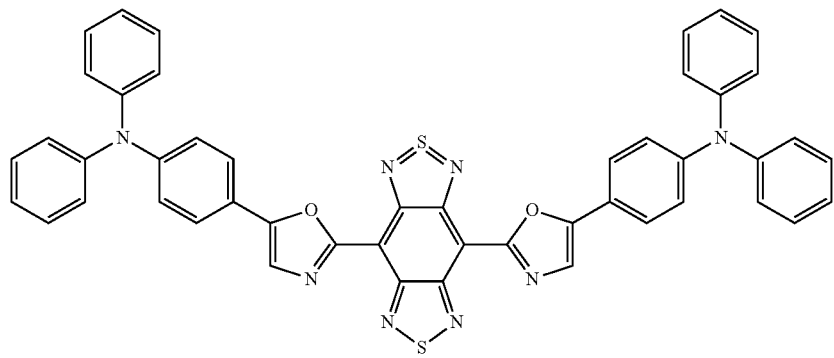
IRD2-18
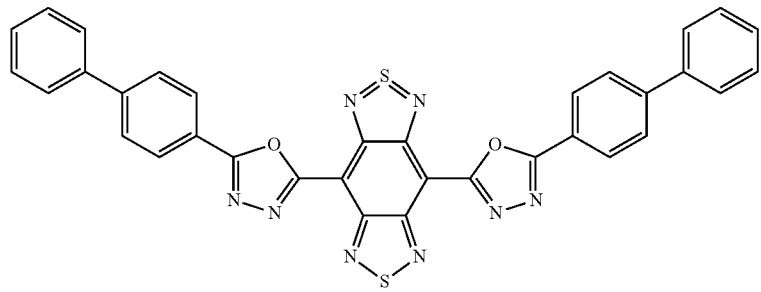
IRD2-19
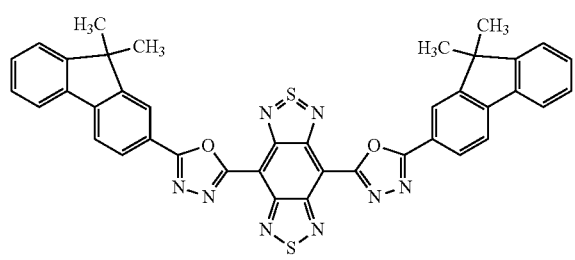
IRD2-20
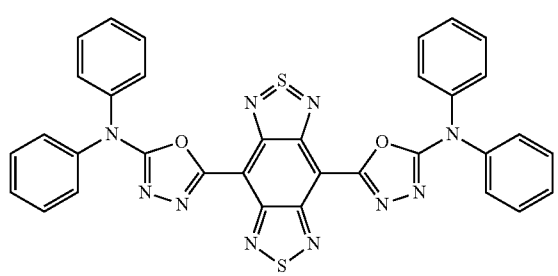

IRD2-21

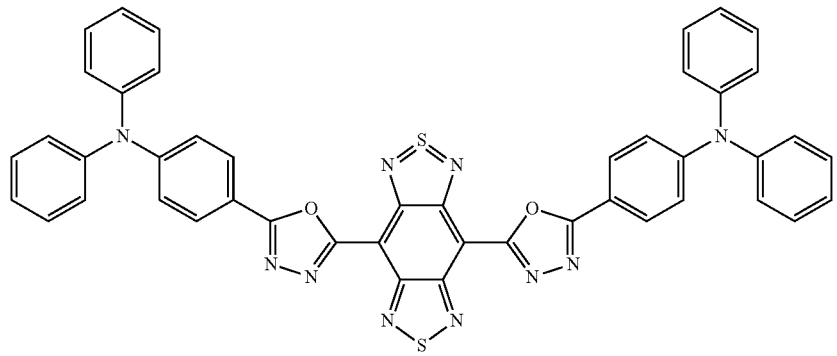

The light-emitting layer 5 may contain another light-emitting material (any of various types of fluorescent materials and various types of phosphorescent materials) other than the above-mentioned light-emitting materials.

Further, the light-emitting layer 5 is configured to contain, in addition to the light-emitting material as described above, a host material that holds this light-emitting material as a guest material (dopant).

This host material has a function to recombine a hole and an electron to generate an exciton, and also to transfer the energy of the exciton (Forster-transfer or Dexter-transfer) to the light-emitting material to excite the light-emitting material. Due to this, by configuring the light-emitting layer 5 to contain the host material in addition to the light-emitting material (guest material), the luminous efficiency of the light-emitting element 1 can be increased. Such a host material can be used by, for example, doping the light-emitting material which is the guest material as the dopant into the host material.

Such a host material is not particularly limited as long as the material exhibits the function as described above with respect to the guest material to be used, however, examples thereof include distyrylarylene derivatives, acene-based materials such as naphthacene derivatives and anthracene derivatives, perylene derivatives, distyrylbenzene derivatives, distyrylamine derivatives, quinolinolato-based metal complexes such as bis(2-methyl-8-quinolinolato) (p-phenyl-phenolato)aluminum (BAlq) and a tris(8-quinolinolato)aluminum complex ($Alq_3$), triarylamine derivatives such as triphenylamine tetramers, oxadiazole derivatives, rubrene and rubrene derivatives, silole derivatives, dicarbazole derivatives, oligothiophene derivatives, benzopyran derivatives, triazole derivatives, benzoxazole derivatives, benzothiazole derivatives, quinoline derivatives, 4,4'-bis(2,2'-diphenylvinyl)biphenyl (DPVBi), carbazole derivatives such as 3-phenyl-4-(1'-naphthyl)-5-phenylcarbazole and 4,4'-N,N'-dicarbazole biphenyl (CBP), and among these, it is also possible to use one type alone or two or more types in combination.

Among these, as the host material, it is preferred to use an acene-based material or a quinolinolato-based metal complex, and it is more preferred to use an acene-based material.

An acene-based material has fewer undesirable interactions with the guest material as described above. Therefore, the alteration or deterioration of the guest material (light-emitting material) due to the coexistence of the guest material (light-emitting material) and the acene-based material as the host material can be reliably suppressed or prevented. Further, when the acene-based material (particularly, an antracene-based material or a tetracene-based material) is used as the host material, the energy transfer from the host material to the guest material (light-emitting material) can be efficiently achieved. Due to this, the luminous efficiency of the light-emitting element 1 can be made excellent. This is considered to be because (a) it is possible to generate the singlet excited state of the guest material due to energy transfer from the triplet excited state of the acene-based material, (b) the overlap of the π electron cloud of the acene-based material with the electron cloud of the guest material is increased, and so on.

Accordingly, when the acene-based material is used as the host material, the luminous efficiency of the light-emitting element 1 can be increased.

In addition, the acene-based material has excellent resistance to electrons and holes. Further, the acene-based material also has excellent thermal stability. Due to this, not only the lifetime of the light-emitting layer 5, but also the lifetime of the light-emitting element 1 can be extended. Further, the acene-based material has excellent thermal stability, and therefore, in a case where the light-emitting layer 5 is formed using a gas phase deposition method, the decomposition of the host material due to heat during deposition can be prevented. Therefore, the light-emitting layer 5 having excellent film quality can be formed. As a result, also from this point of view, the luminous efficiency of the light-emitting element 1 can be increased and also the lifetime thereof can be extended.

In addition, the acene-based material hardly emits light itself, and therefore, it is also possible to prevent the host material from adversely affecting the emission spectrum of the light-emitting element 1.

Such an acene-based material is not particularly limited as long as it has an acene skeleton and exhibits the effect as described above, and examples thereof include naphthalene derivatives, anthracene derivatives, naphthacene derivatives (tetracene derivatives), and pentacene derivatives, and among these, it is possible to use one type or two or more types in combination. However, it is preferred to use an anthracene-based material (anthracene derivative) or a tetracene-based material (tetracene derivative), and it is more preferred to use a tetracene-based material.

The tetracene-based material is not particularly limited as long as it has at least one tetracene skeleton per molecule and can exhibit the function as the host material as described above, however, it is preferred to use, for example, a compound represented by the following formula IRH1.

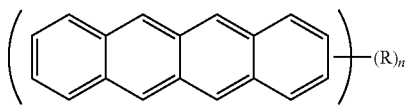

IRH1

In the formula IRH1, n represents a natural number of 1 to 12, and R each independently represents a hydrogen atom, an alkyl group, an aryl group which may have a substituent, or an arylamino group.

Such a tetracene-based material (particularly, a compound represented by the above formula IRH1) is a compound having low polarity (small polarization). Therefore, by using the tetracene-based material as the host material, the interaction between the molecules of the light-emitting material can be reduced. Therefore, the concentration quenching property attributed to this interaction can be reduced.

On the other hand, for example, in a case where $Alq_3$ having high polarity (large polarization) is used as the host material, the interaction between the molecules of the light-emitting material is likely to occur as a result of this, and thus, the concentration quenching property would be enhanced.

Further, an anthracene-based material which is an acene-based material in the same manner as the tetracene-based material has an effect of reducing the concentration quenching property in a case where it is used as the host material, however, the luminous efficiency is decreased as compared with a case where the tetracene-based material is used as the host material. It is considered to be because when the anthracene-based material is used as the host material, the energy transfer from the host material to the light-emitting material is not sufficient, and the probability that an electron injected into the LUMO of the host material penetrates toward the anode side is high. In view of this, when the anthracene-based material and the tetracene-based material are compared, the tetracene-based material is particularly preferably used as the host material.

Accordingly, by using the tetracene-based material (acene-based material) as the host material, the luminous efficiency of the light-emitting element 1 can be increased.

Further, the tetracene-based material has excellent resistance to electrons and holes. In addition, the tetracene-based material also has excellent thermal stability. Due to this, the lifetime of the light-emitting element 1 can be extended. Further, since the tetracene-based material has excellent thermal stability, in a case where the light-emitting layer 5 is formed using a gas phase deposition method, the decomposition of the host material due to heat during deposition can be prevented. Therefore, the light-emitting layer 5 having excellent film quality can be formed. As a result, also from this point of view, the luminous efficiency of the light-emitting element 1 can be increased and also the lifetime thereof can be extended.

In addition, the tetracene-based material hardly emits light itself, and therefore, it is also possible to prevent the host material from adversely affecting the emission spectrum of the light-emitting element 1.

Further, the tetracene-based material to be used as the host material is not particularly limited as long as it is represented by the above formula IRH1 and also can exhibit the function as the host material as described above, however, it is preferred to use a compound represented by the following formula IRH1-A, and it is more preferred to use a compound represented by the following formula IRH1-B.

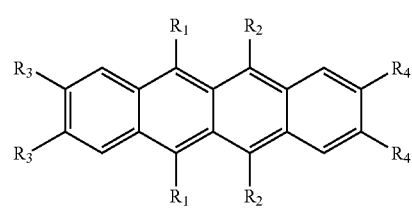

IRH1-A

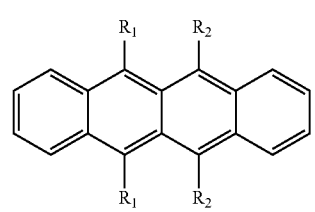

IRH1-B

In the formulae IRH1-A and IRH1-B, $R_1$ to $R_4$ each independently represent a hydrogen atom, an alkyl group, an aryl group which may have a substituent, or an arylamino group. Further, $R_1$ to $R_4$ may be the same as or different from one another.

Further, the tetracene-based material, that is, the host material is preferably constituted by a carbon atom and a hydrogen atom. According to this, the polarity of the host material is decreased, and thus, an undesirable interaction between the host material and the light-emitting material can be prevented from occurring. Due to this, the luminous efficiency of the light-emitting element 1 can be increased. In addition, the resistance of the host material to a potential and holes can be increased. As a result, the lifetime of the light-emitting element 1 can be extended.

Specifically, as the tetracene-based material, for example, it is preferred to use compounds represented by the following formulae IRH1-1 to IRH1-27.

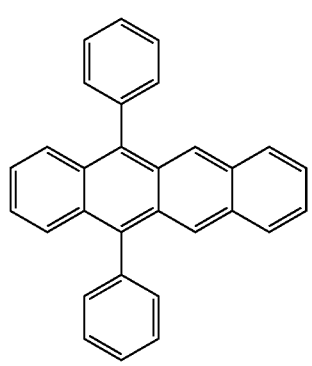

IRH1-1

IRH1-2
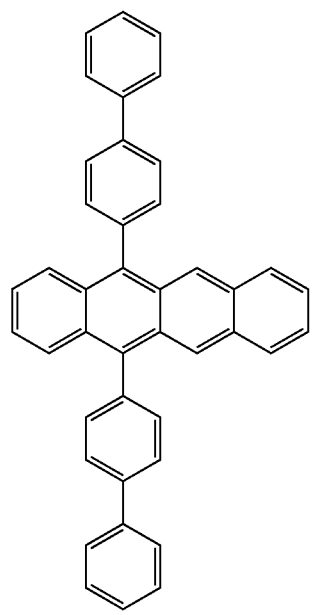
IRH1-3
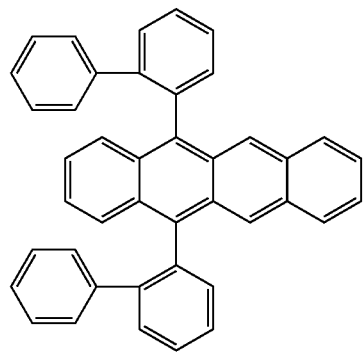
IRH1-4
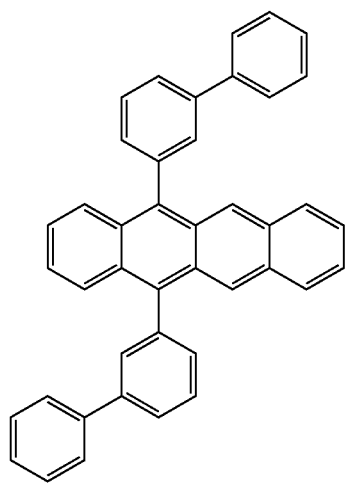
IRH1-5
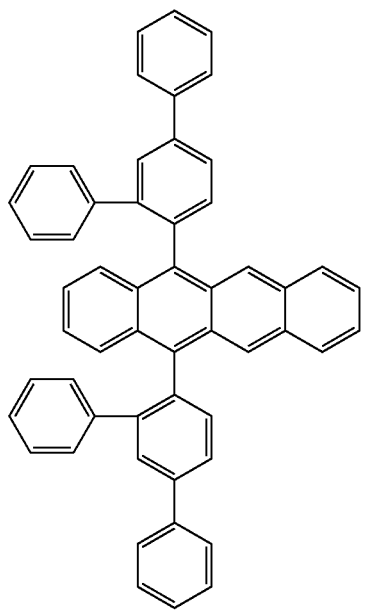
IRH1-6
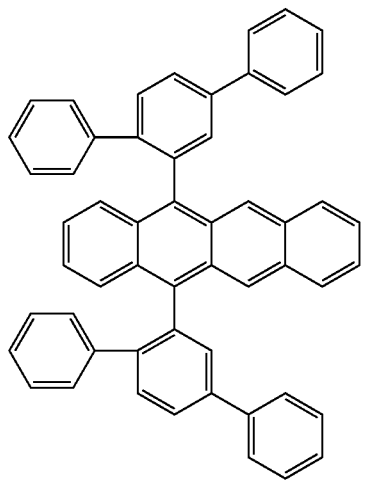
IRH1-7
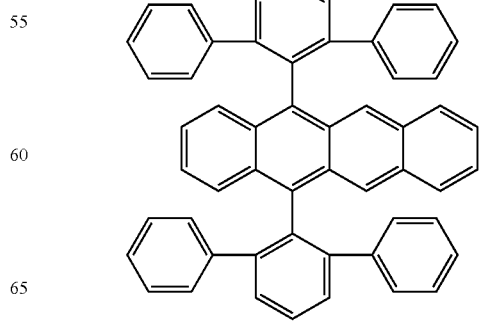

-continued
IRH1-8
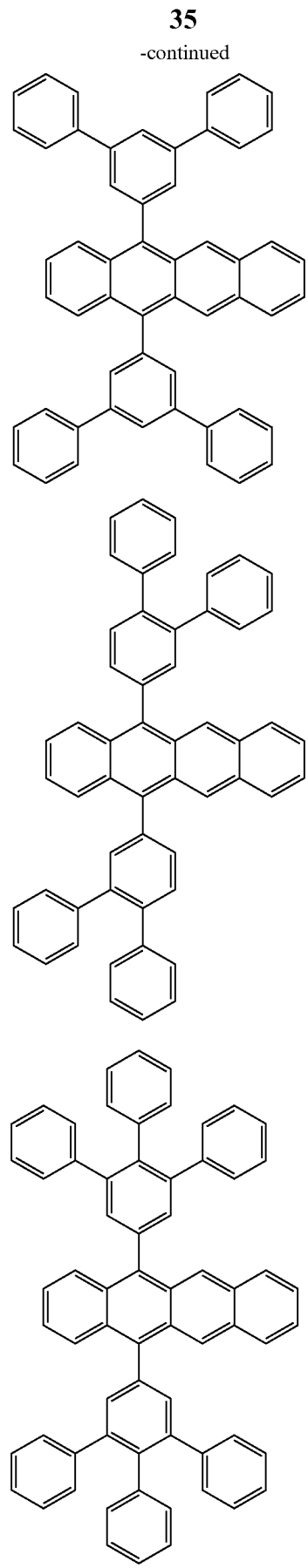
IRH1-9
IRH1-10
-continued
IRH1-11
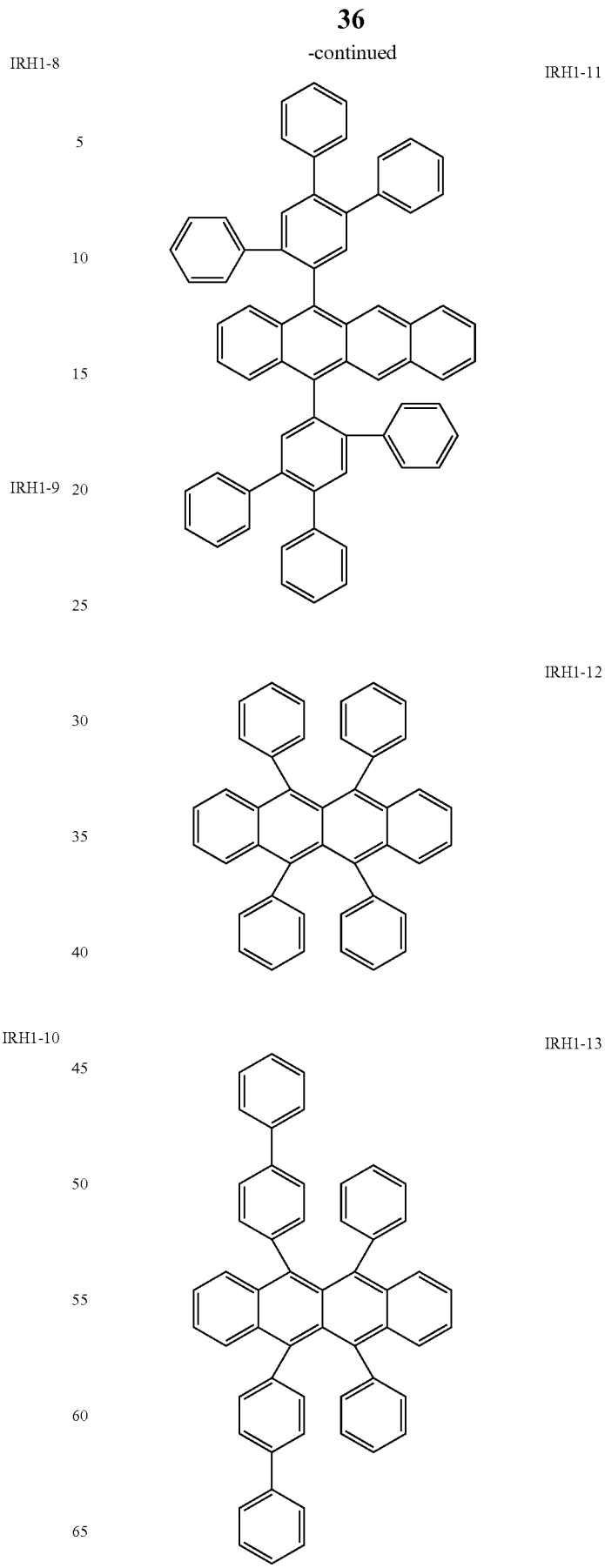
IRH1-12
IRH1-13

IRH1-14
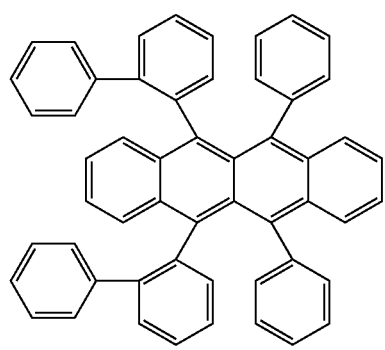
IRH1-15
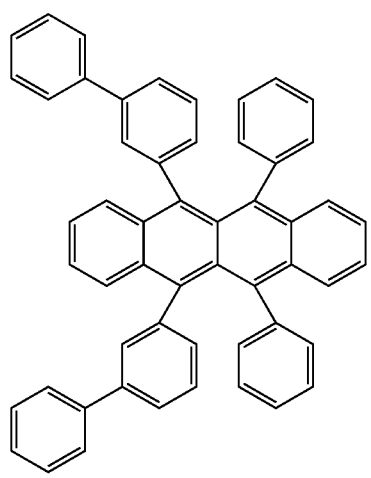
IRH1-16
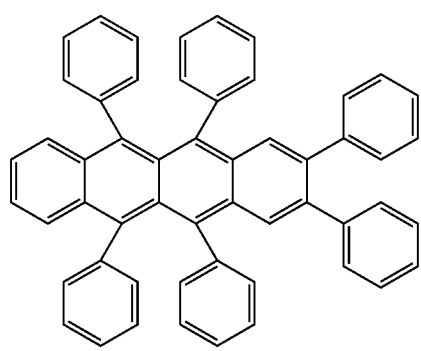
IRH1-17
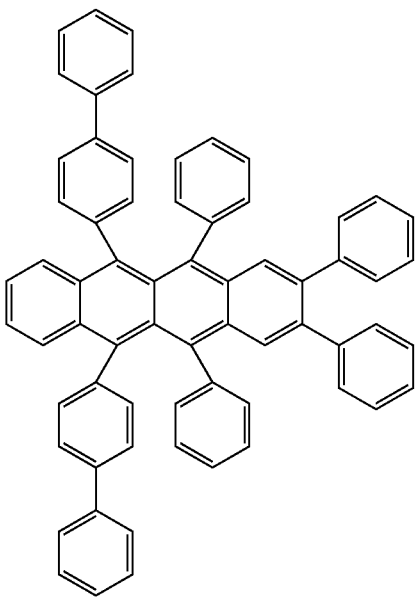
IRH1-18
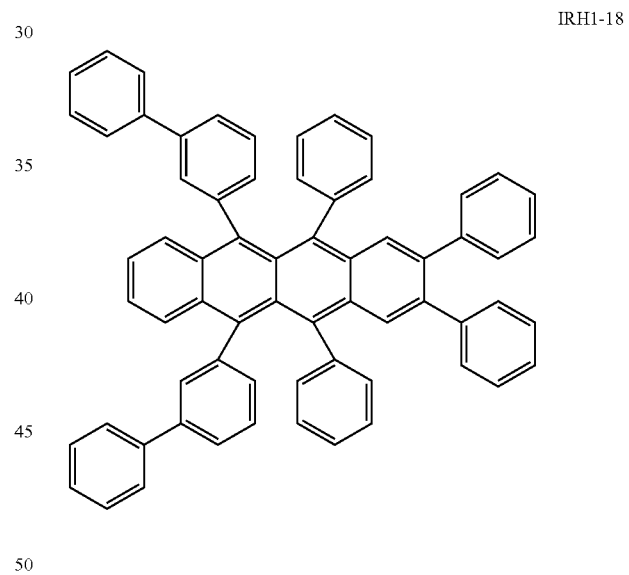
IRH1-19
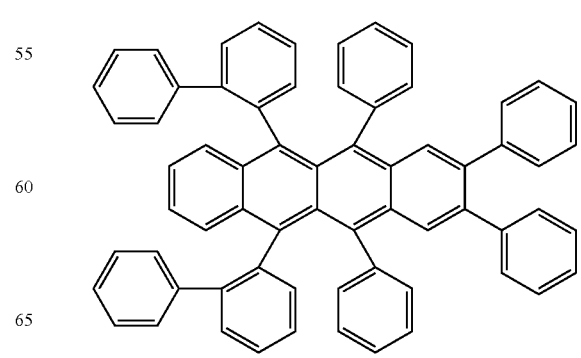

-continued
IRH1-20
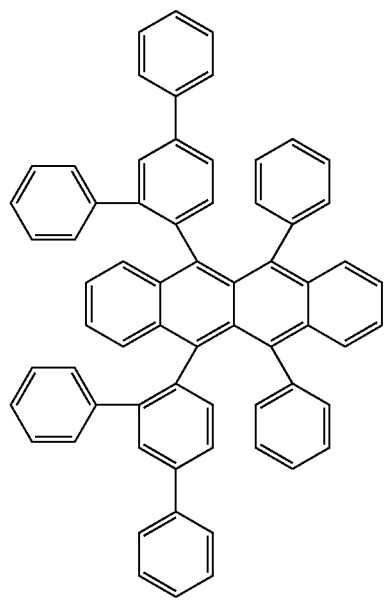
IRH1-21
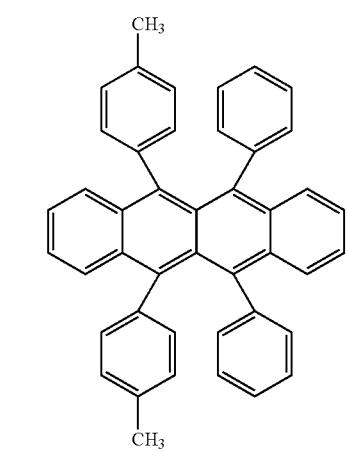
IRH1-22
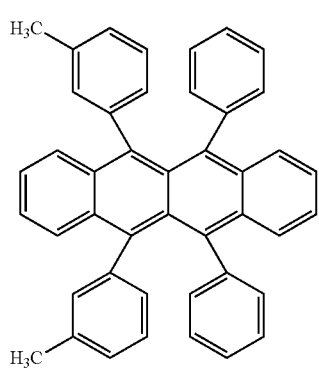
-continued
IRH1-23
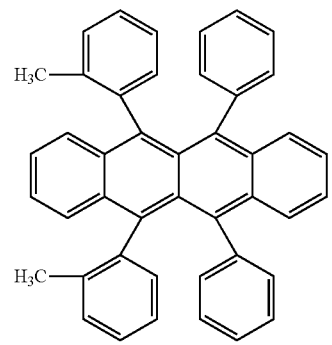
IRH1-24
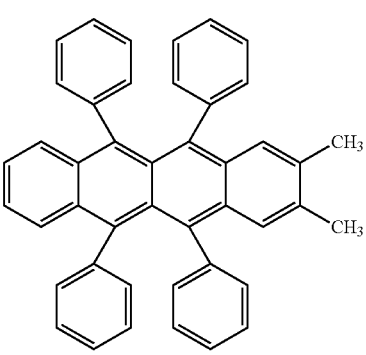
IRH1-25
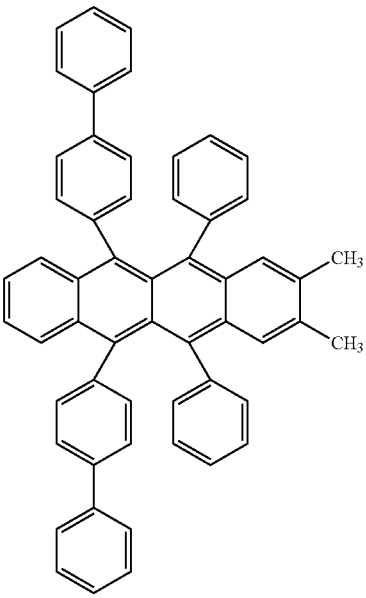
IRH1-26
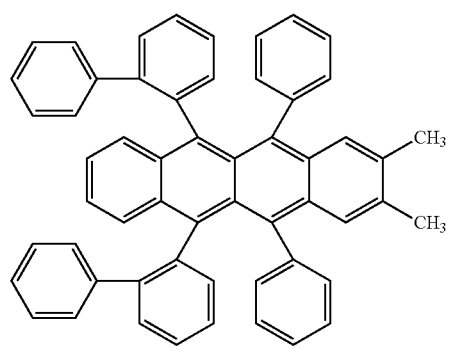

IRH1-27

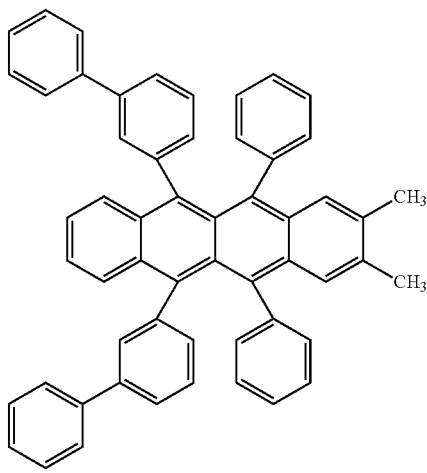

The anthracene-based material is not particularly limited as long as it has at least one anthracene skeleton per molecule and can exhibit the function as the host material as described above, however, it is preferred to use, for example, a compound represented by the following formula IRH2, and examples thereof include compounds represented by the following formula IRH2-A, the following formula IRH2-B, the following formula IRH2-C, and the following formula IRH2-D. More specific examples thereof include compounds represented by the following formulae IRH2-1 to IRH2-56.

| IRH2 (general formula) | n | R: a hydrogen atom an alkyl group  aryl which may have a substituent arylamine  n represents a natural number of 1 to 10 |

| IRH2-A | anthracene with $R_1$, $R_2$ | $R_1$ and $R_2$ may be the same as or different from one another: a hydrogen atom an alkyl group  aryl which may have a substituent arylamine |

| IRH2-B | benz[a]anthracene with $R_1$, $R_2$ | $R_1$ and $R_2$ may be the same as or different from one another: a hydrogen atom an alkyl group  aryl which may have a substituent arylamine |

| IRH2-C | 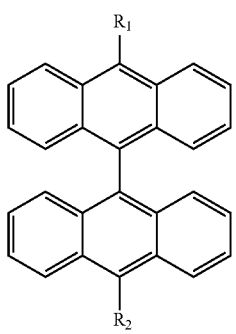 | $R_1$ and $R_2$ may be the same as or different from one another: a hydrogen atom an alkyl group  aryl which may have a substituent arylamine |

| IRH2D | 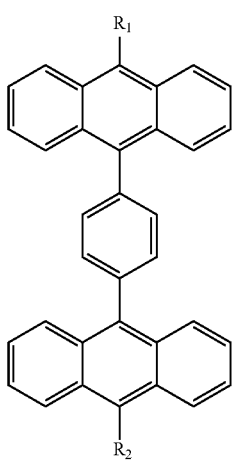 | $R_1$ and $R_2$ may be the same as or different from one another: a hydrogen atom an alkyl group  aryl which may have a substituent arylamine |

IRH2-1

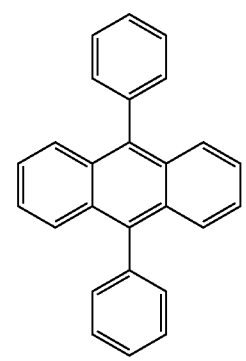

IRH2-2
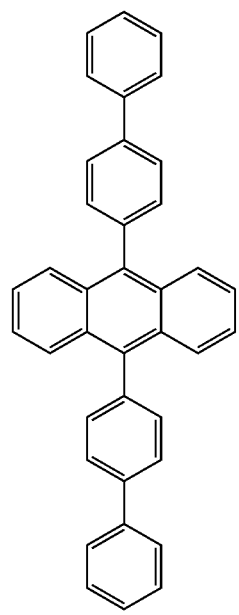
IRH2-3
IRH2-4
IRH2-5
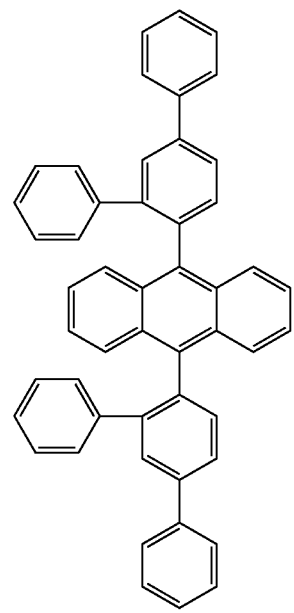
IRH2-6
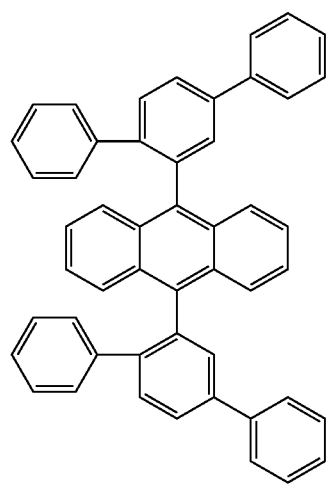
IRH2-7
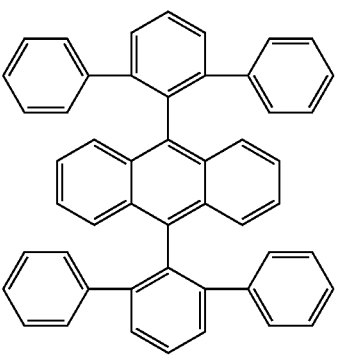

IRH2-8
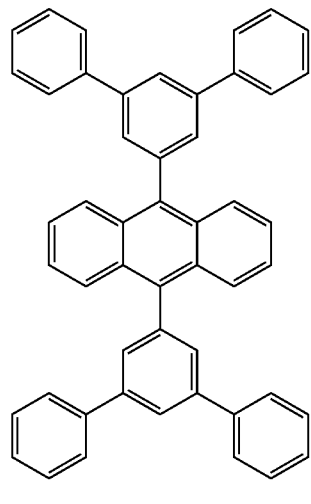
IRH2-9
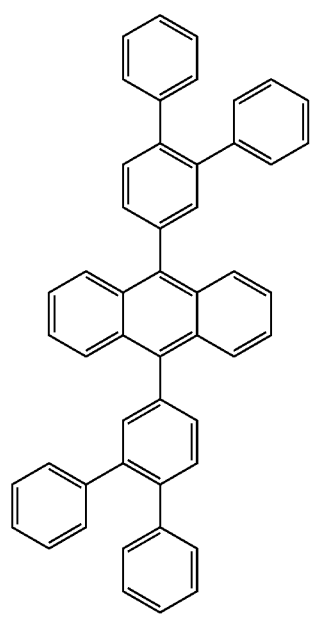
IRH2-10
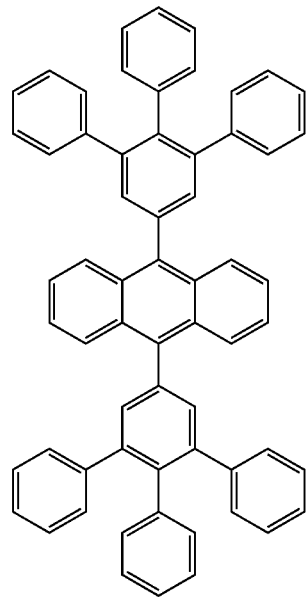
IRH2-11
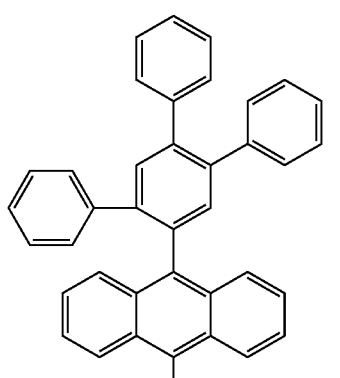
IRH2-12
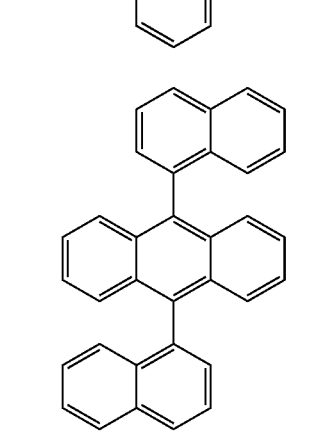

IRH2-13
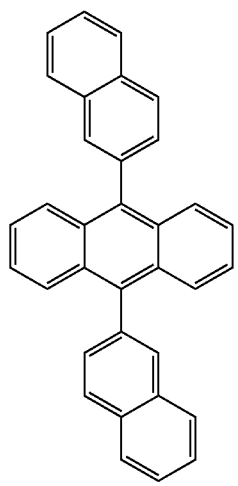
IRH2-14
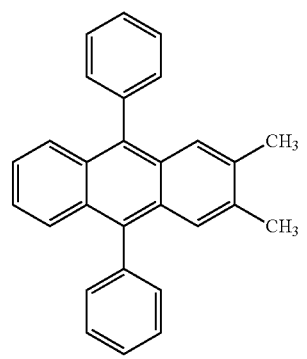
IRH2-15
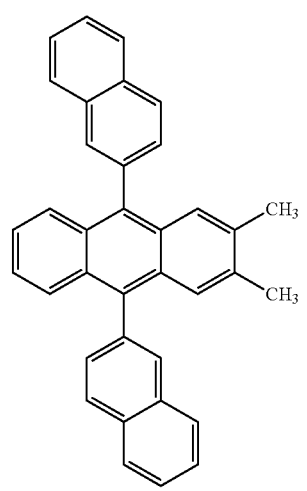
IRH2-16
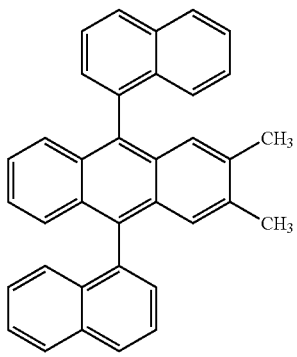
IRH2-17
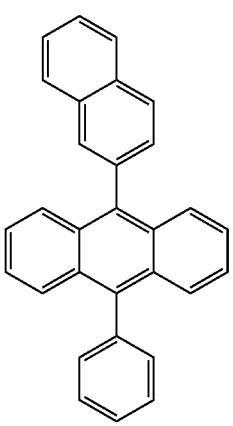
IRH2-18
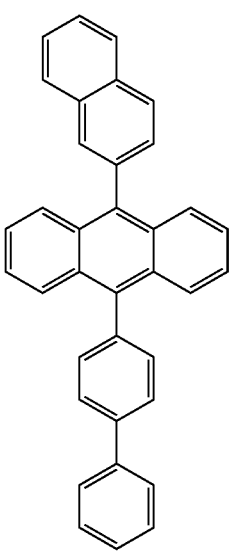

IRH2-19
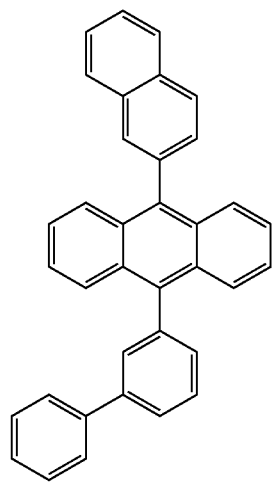
IRH2-20
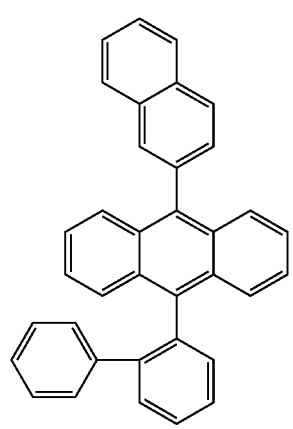
IRH2-21
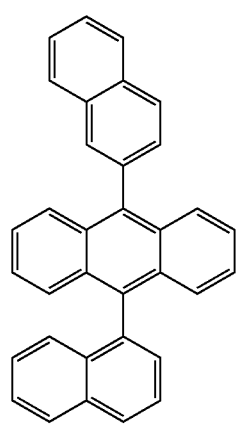
IRH2-22
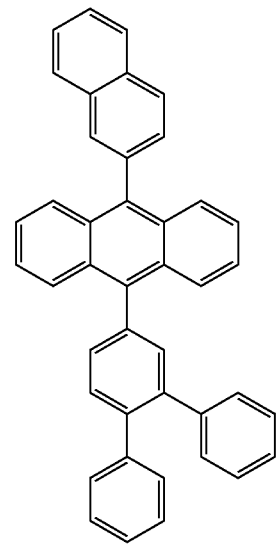
IRH2-23
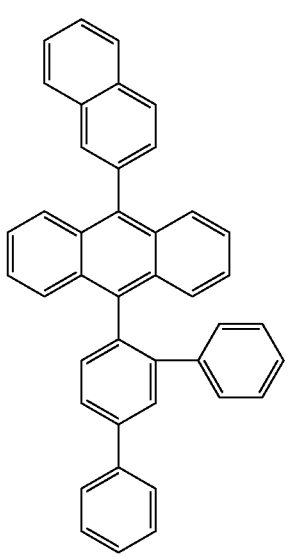
IRH2-24
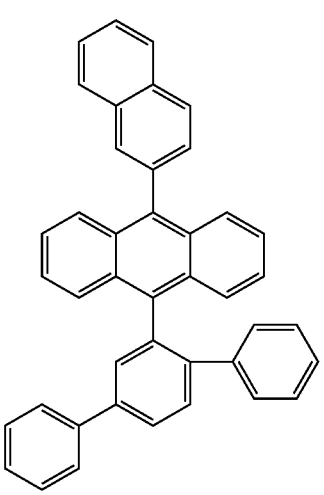

IRH2-25
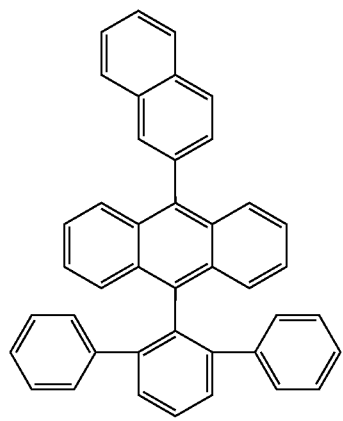
IRH2-26
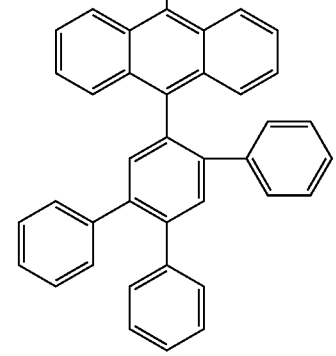
IRH2-27
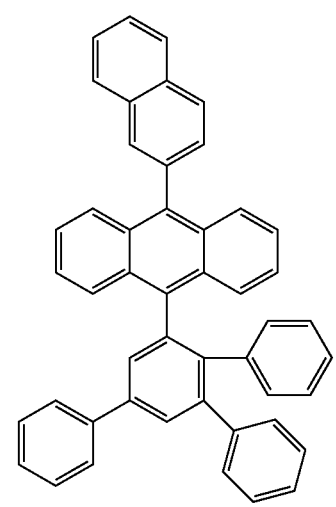
IRH2-28
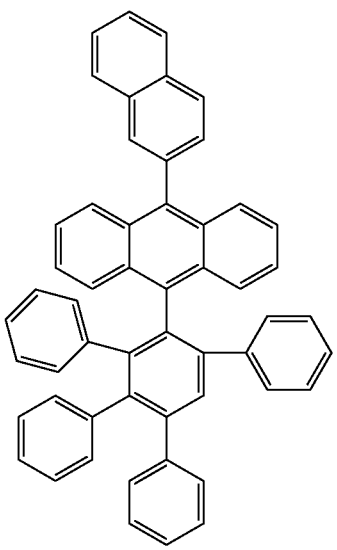
IRH2-29
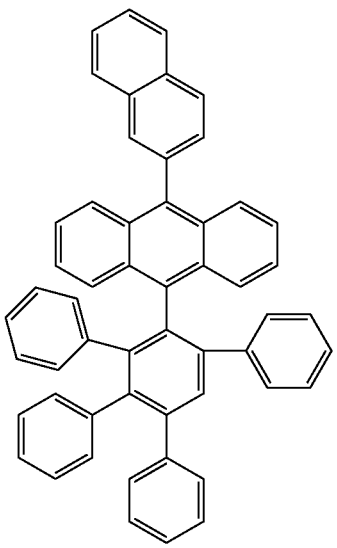

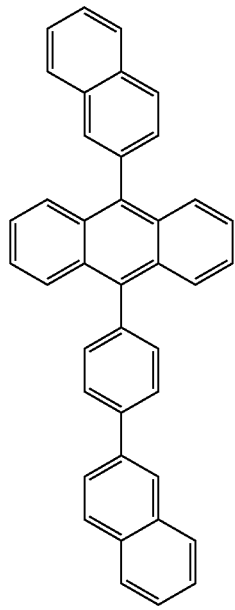 IRH2-30
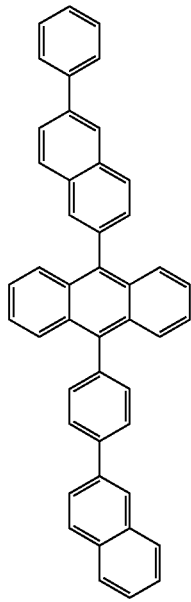 IRH2-32
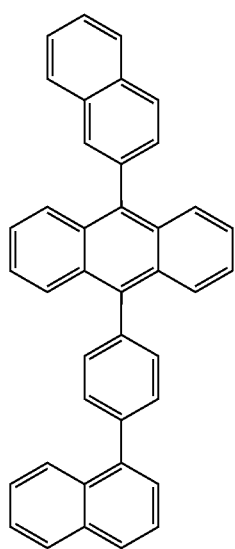 IRH2-31
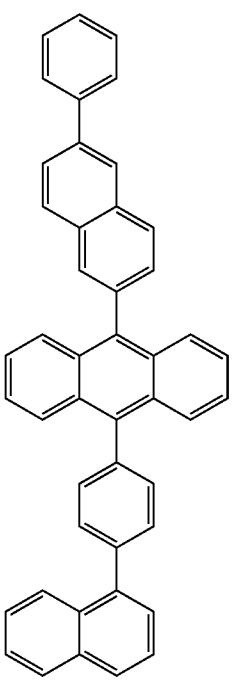 IRH2-33

IRH2-34
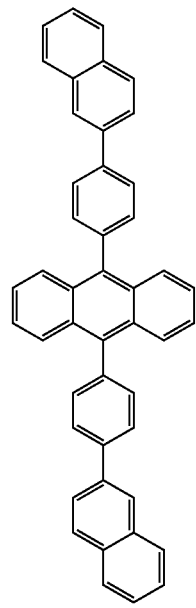
IRH2-35
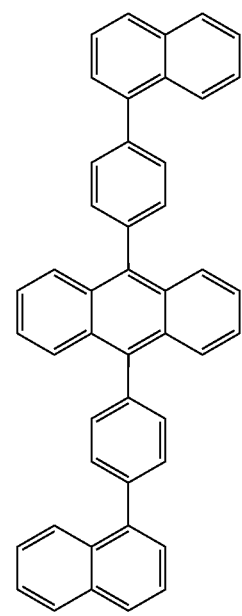
IRH2-36
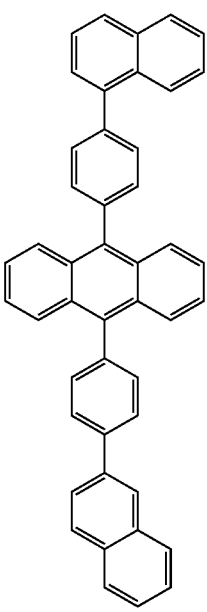
IRH2-37
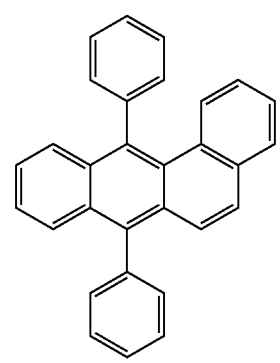
IRH2-38
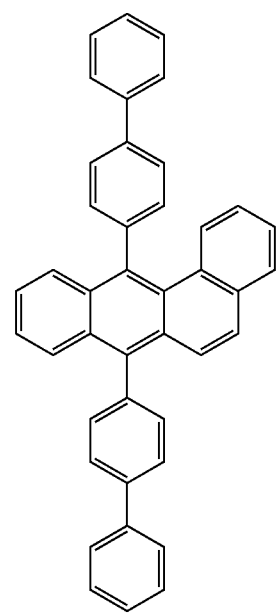

-continued
IRH2-39
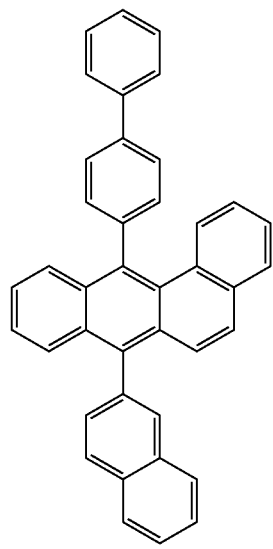
IRH2-40
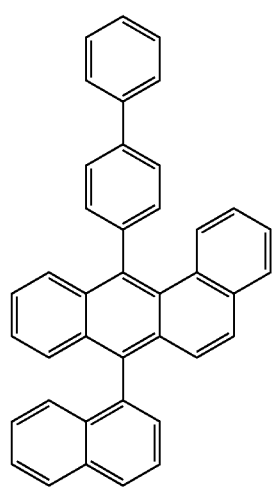
IRH2-41
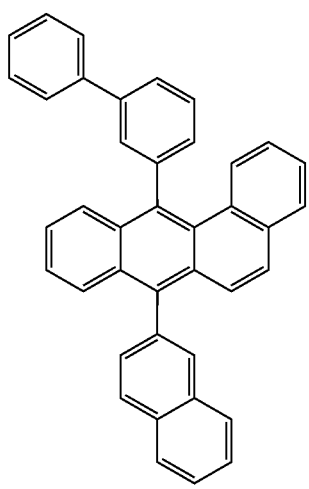
-continued
IRH2-42
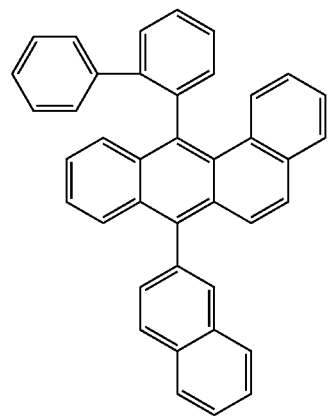
IRH2-43
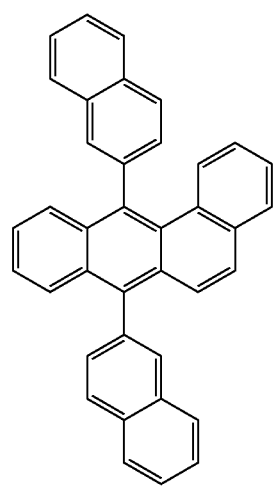
IRH2-44
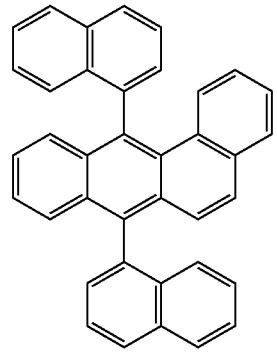

-continued
IRH2-45
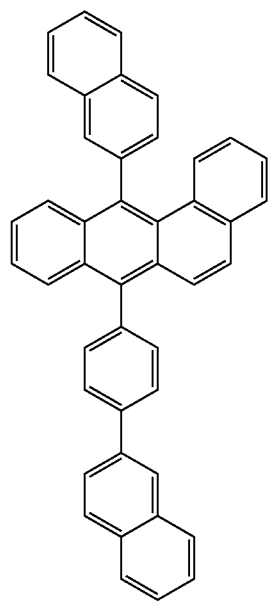
IRH2-47
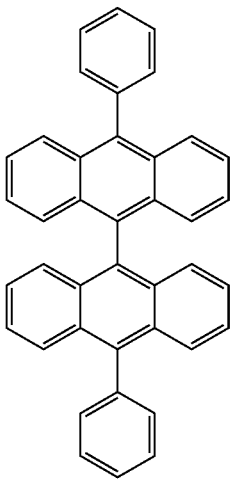
IRH2-46
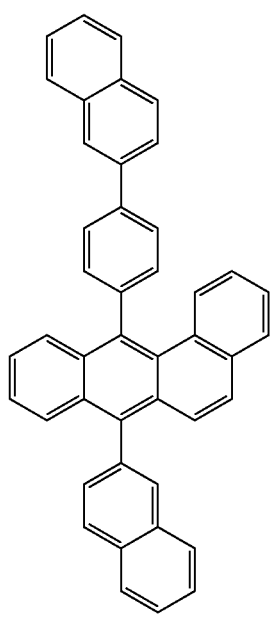
IRH2-48
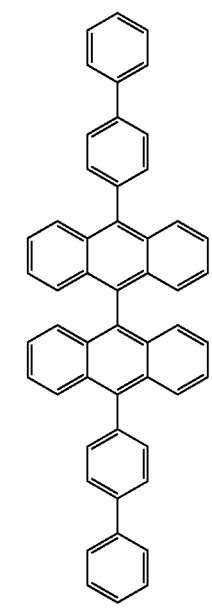

IRH2-49
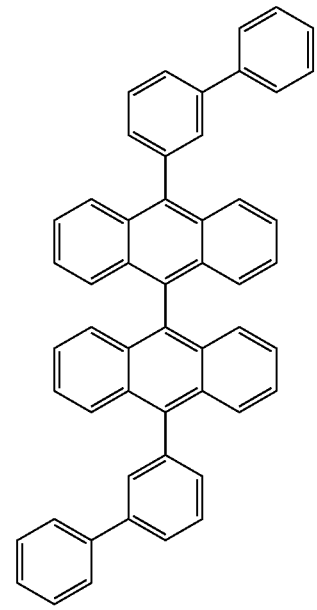
IRH2-50
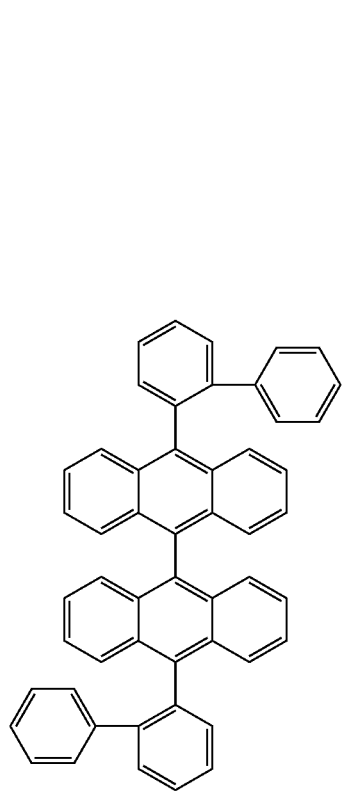
IRH2-51
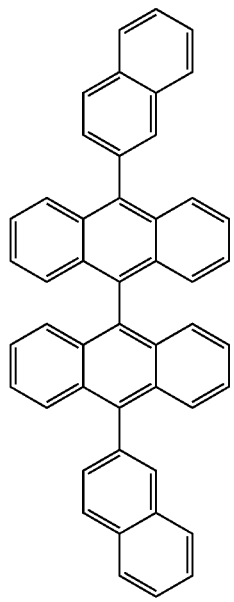
IRH2-52
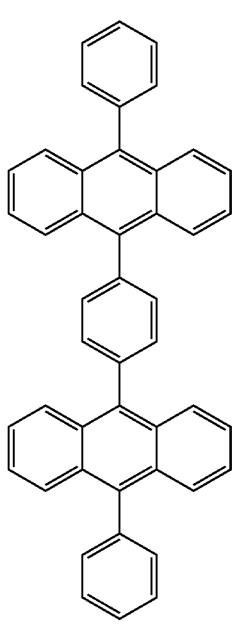

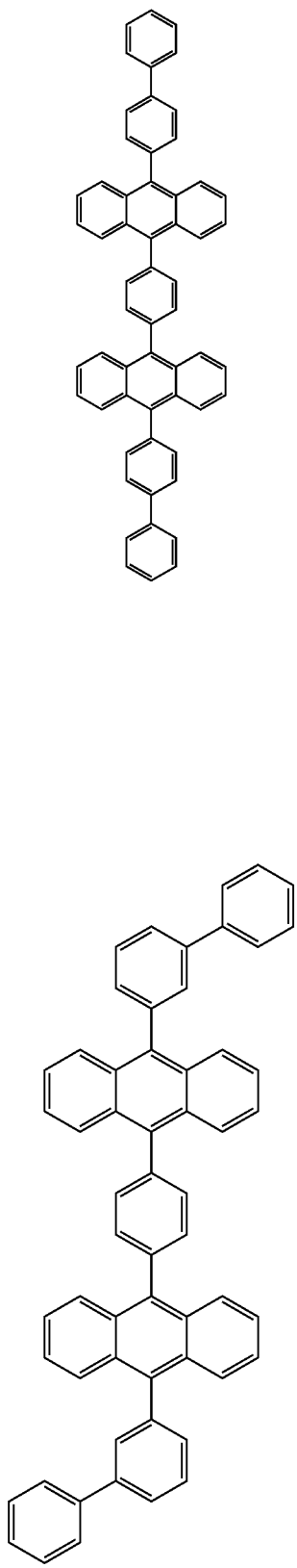

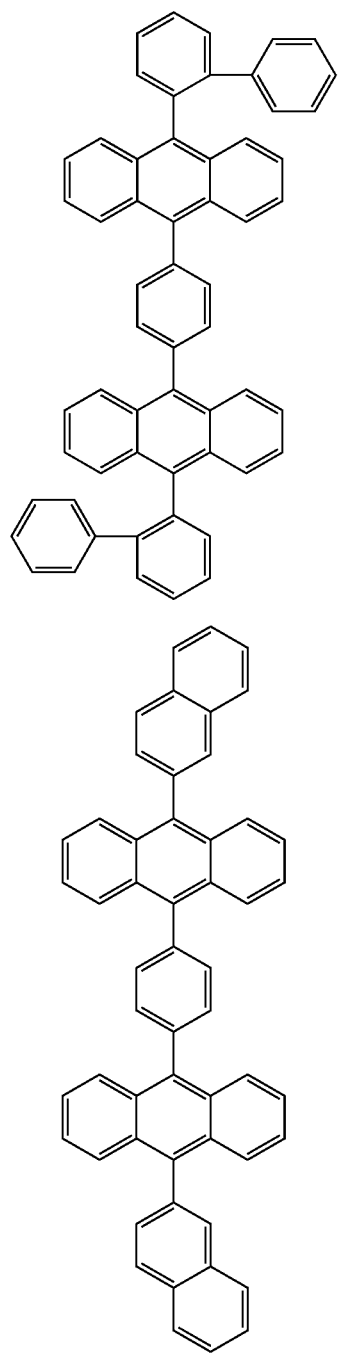

Further, the HOMO of the host material to be used in the light-emitting layer 5 is preferably 5.0 eV or more and 6.0 eV or less, and the LUMO of the host material is preferably 2.5 eV or more and 3.6 eV or less.

As described above, the light-emitting layer 5 contains the light-emitting material and the host material, and therefore emits light having a peak wavelength of 700 nm or more in a near-infrared region, however, in this invention, the content of the light-emitting material in the light-emitting layer 5 is 30 wt % or more and 70 wt % or less.

Here, generally as the light-emitting material (light-emitting dopant), a material having high polarity is often used, and therefore, when the concentration of such a material in the light-emitting layer is increased, the interaction between the molecules of the light-emitting material occurs, and thus, concentration quenching which is a phenomenon in which luminous efficiency is decreased due to the interaction is known to occur.

Therefore, the content (doping amount) of the light-emitting material in the light-emitting layer is generally set to about 0.5 wt % or more and 10.0 wt % or less. By setting the content of the light-emitting material within such a range, the occurrence of concentration quenching is accurately suppressed or prevented, and as a result, a light-emitting element in which high efficiency is achieved can be obtained. However, when the content of the light-emitting material is set within such a range, there is a problem that the emission wavelength of the light-emitting layer shifts to the shorter wavelength side from the original emission wavelength of the light-emitting material, and therefore, the light-emitting element which emits light in a longer wavelength region cannot be obtained.

On the other hand, in the invention, as the light-emitting material, a material which emits light having a peak wavelength of 700 nm or more in a near-infrared region is used. Even in a case of a light-emitting material which emits light having a peak wavelength in a near-infrared region in this manner, when the concentration of the light-emitting material in the light-emitting layer is increased, a tendency in which concentration quenching occurs is shown, however, it was found that this tendency is decreased in a given concentration range as a result of examination by the present inventors.

Accordingly, in the invention, in the light-emitting element 1 including the anode 3, the cathode 8, and the light-emitting layer 5 which is provided therebetween and contains the light-emitting material and the host material, by setting the content of the light-emitting material (light-emitting dopant) in the light-emitting layer 5 to 30 wt % or more and 70 wt % or less, the light-emitting layer 5 capable of suppressing the shift of the emission wavelength to the shorter wavelength side while suppressing the occurrence of concentration quenching in the light-emitting layer 5, that is, the light-emitting layer 5 which emits light having a longer wavelength in a near-infrared region while achieving high light emission efficiency of the light-emitting layer 5 can be obtained. That is, when the content of the light-emitting material in the light-emitting layer 5 is less than 30 wt %, the emission wavelength of the light-emitting layer 5 shifts to the shorter wavelength side, and the light-emitting layer 5 cannot emit light in a longer wavelength region. Further, when the content of the light-emitting material in the light-emitting layer 5 exceeds 70 wt %, the luminous efficiency of the light-emitting layer 5 is decreased, and high light emission efficiency of the light-emitting layer 5 cannot be obtained.

Such a tendency is remarkably observed in the compound represented by the above general formula (IRD1) (particularly, the above formula IRD1-1) and the compound represented by the above general formula (IRD2) (particularly, the above formula IRD2-1) among the above-mentioned light-emitting materials which emit light having a peak wavelength in a near-infrared region. That is, in a case where the light-emitting layer 5 contains the compound represented by the above general formula (IRD1) (particularly, the above formula IRD1-1) or the compound represented by the above general formula (IRD2) (particularly, the above formula IRD2-1) as the light-emitting material, by setting the content of the light-emitting material (light-emitting dopant) in the light-emitting layer 5 to 30 wt % or more and 70 wt % or less, the light-emitting element 1 more reliably includes the light-emitting layer 5 which emits light having a longer wavelength in a near-infrared region while achieving high efficiency.

By using such a material as the light-emitting material, the above-mentioned effect is remarkably exhibited, and specifically, the peak wavelength of the light emitted from the light-emitting layer 5 can be set to preferably about 700 nm or more and 960 nm or less, more preferably about 800 nm or more and 950 nm or less.

The content of the light-emitting material (light-emitting dopant) in the light-emitting layer 5 may be 30 wt % or more and 70 wt % or less, but is preferably 50 wt % or more and 70 wt % or less. According to the invention, even in a case where the light-emitting material is contained at a higher concentration in the light-emitting layer 5 in this manner, the shift of the emission wavelength to the shorter wavelength side can be more accurately suppressed while more accurately suppressing the occurrence of concentration quenching.

The average thickness of the light-emitting layer 5 is preferably 10 nm or more and 50 nm or less, more preferably 25 nm or more and 50 nm or less. When the average thickness of the light-emitting layer 5 is less than the above lower limit, a tendency in which recombination increases in the peripheral layers of the light-emitting layer 5 is shown depending on the type of the light-emitting material, and therefore, unnecessary light emission may increase. Further, when the average thickness of the light-emitting layer 5 exceeds the above upper limit, a tendency in which the voltage in the light-emitting layer 5 gradually increases is shown depending on the type of the light-emitting material, and therefore, a decrease in the luminous efficiency of the light-emitting layer 5 may be caused, and therefore, by setting the thickness of the light-emitting layer 5 within the above range, while suppressing the driving voltage of the light-emitting element 1, the light-emitting element 1 which has high efficiency and a long lifetime can be realized.

Electron Transport Layer

The electron transport layer 6 is provided between the light-emitting layer 5 and the cathode 8, and has a function to transport electrons injected from the cathode 8 through the electron injection layer 7 to the light-emitting layer 5.

Examples of the constituent material (electron transport material) of the electron transport layer 6 include phenanthroline derivatives such as 2,9-dimethyl-4,7-diphenyl-1,10-phenanthroline (BCP), quinoline derivatives of organic metal complexes having 8-quinolinol or a derivative thereof as a ligand such as tris(8-quinolinolato)aluminum ($Alq_3$), azaindolizine derivatives, oxadiazole derivatives, perylene derivatives, pyridine derivatives, pyrimidine derivatives, quinoxaline derivatives, diphenylquinone derivatives, nitro-substituted fluorene derivatives, and acene-based materials such as anthracene-based materials, and among these, it is possible to use one type or two or more types in combination.

Among these, as the electron transport material to be used in the electron transport layer 6, it is preferred to use a compound having an anthracene skeleton. In addition, it is preferred to use a phenanthroline derivative or a nitrogen-containing compound including a nitrogen atom in the skeleton similarly to a phenanthroline derivative. In view of this, in particular, it is more preferred to use an azaindolizine-based compound having both of an azaindolizine skeleton and an anthracene skeleton in the molecule (hereinafter also simply referred to as "azaindolizine-based compound"). According to this, electrons can be efficiently transported and injected into the light-emitting layer 5. As a result, the luminous efficiency of the light-emitting element 1 can be increased.

Further, in a case where two or more types of materials among the electron transport materials as described above are used in combination, the electron transport layer 6 may be constituted by a mixed material in which two or more types of electron transport materials are mixed, or may be constituted by a stacked body in which a plurality of layers constituted by different electron transport materials are stacked. In this embodiment, the electron transport layer 6 is constituted a stacked body as in the latter case, and specifically, as shown in FIG. 1, the electron transport layer 6 is a stacked body including a first electron transport layer 6b and a second electron transport layer 6a provided between the first electron transport layer 6b and the light-emitting layer 5.

The compound having an anthracene skeleton to be used as the constituent material of the first electron transport layer 6b is preferably an azaindolizine-based compound having both of an azaindolizine skeleton and an anthracene skeleton in the molecule. Further, the compound having an anthracene skeleton to be used as the constituent material of the second electron transport layer 6a is preferably an anthracene-based compound having an anthracene skeleton in the molecule and also constituted by a carbon atom and a hydrogen atom. According to this, electrons can be efficiently transported and injected into the light-emitting layer 5, and also the deterioration of the electron transport layer 6 can be reduced. As a result, the luminous efficiency of the light-emitting element 1 can be increased, and also the lifetime of the light-emitting element 1 can be extended.

Here, the lifetime can be extended by decreasing the thickness of the first electron transport layer 6b while ensuring the thickness of the electron transport layer 6 necessary for extracting optical light by the second electron transport layer 6a.

In the azaindolizine-based compound to be used in the electron transport layer 6, the number of azaindolizine skeletons and the number of anthracene skeletons contained in one molecule are each preferably one or two. According to this, the electron transport property and the electron injection property of the electron transport layer 6 can be made excellent.

Specific Examples of the azaindolizine-based compound to be used in the electron transport layer 6 include compounds represented by the following general formula ETL1, and specifically, compounds represented by the following formulae ETL1-1 to ETL1-24, compounds represented by the following formulae ETL1-25 to ETL1-36, and compounds represented by the following formulae ETL1-37 to ETL1-56 can be exemplified.

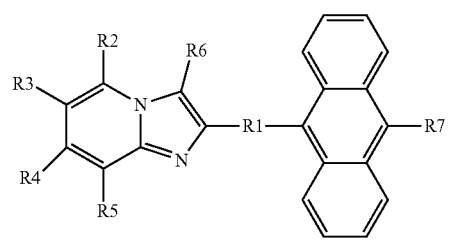

ETL1

In the formula ETL1, R1 to R7 each independently represent a hydrogen atom, an alkyl group, an aryl group which may have a substituent, or an arylamino group. Further, R1 to R7 may be the same as or different from one another.

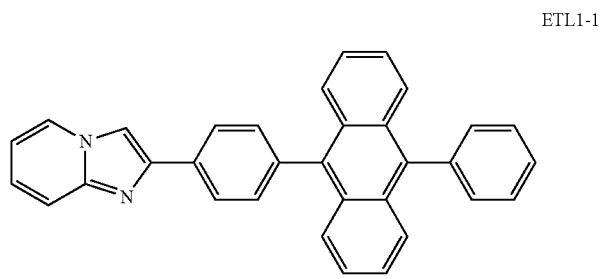

ETL1-1

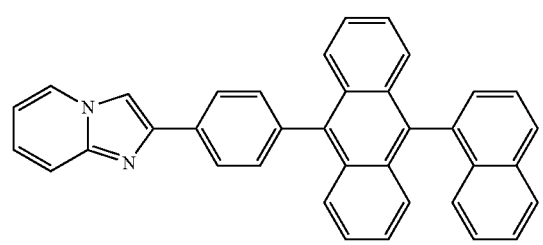

ETL1-2

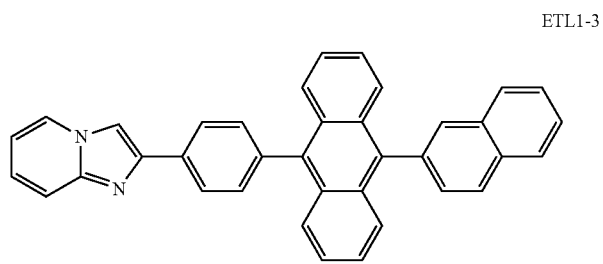

ETL1-3

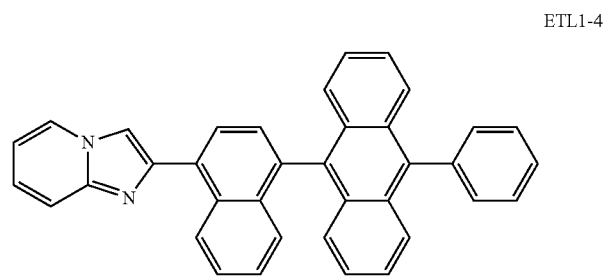

ETL1-4

-continued
ETL1-5
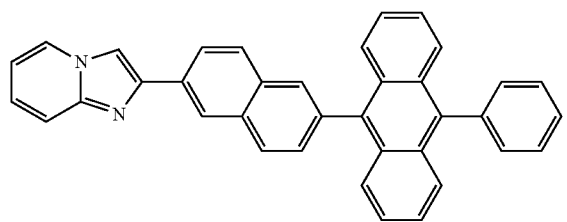
ETL1-6
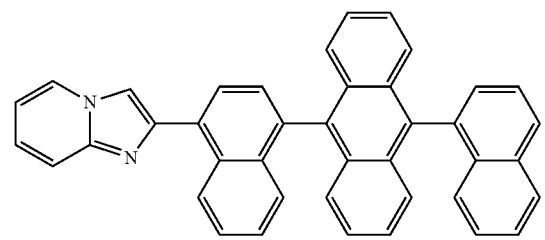
ETL1-7
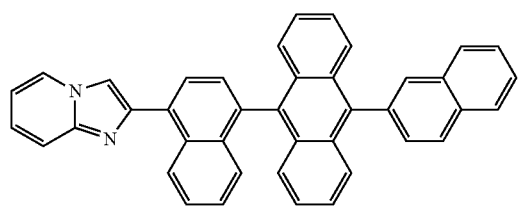
ETL1-8
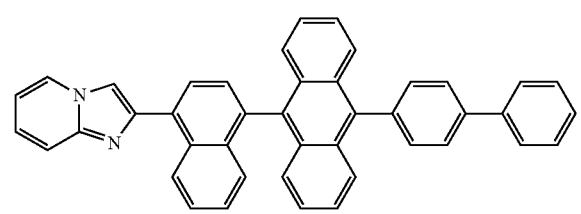
ETL1-9
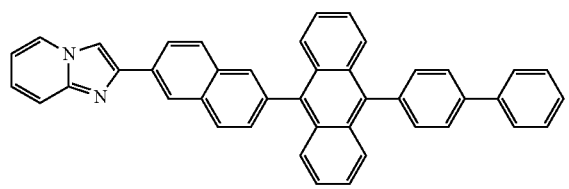
ETL1-10
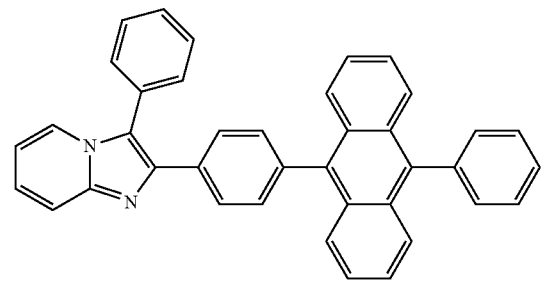
ETL1-11
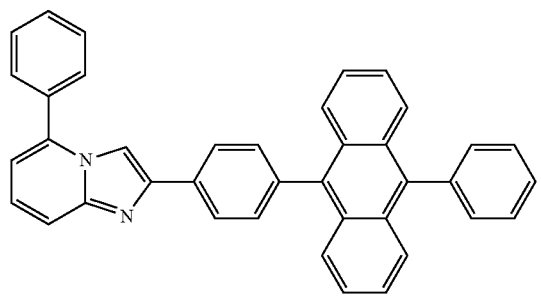
ETL1-12
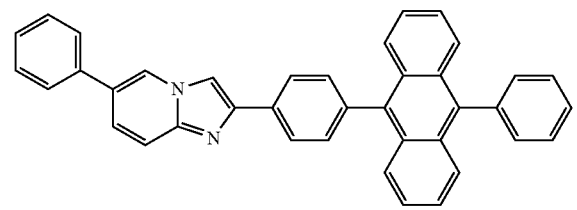
ETL1-13
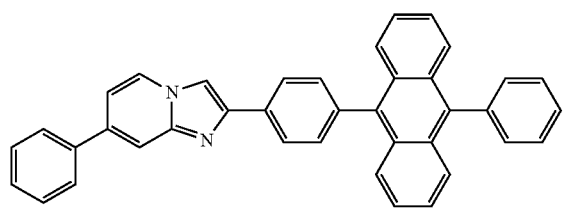
ETL1-14
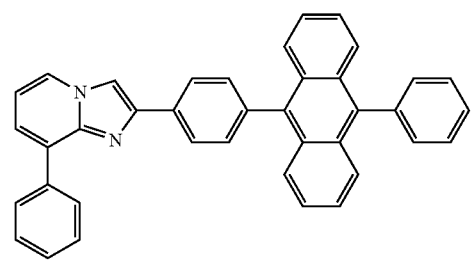

-continued
ETL1-15
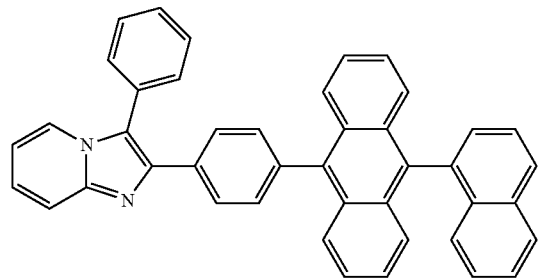
ETL1-16
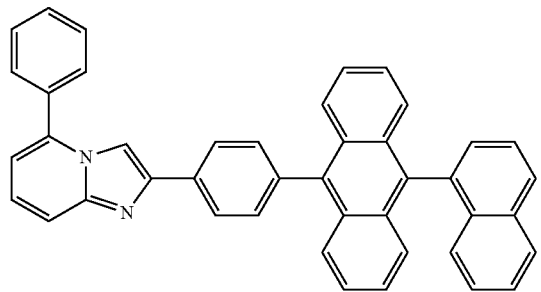
ETL1-17
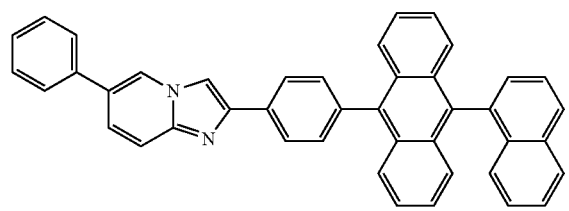
ETL1-18
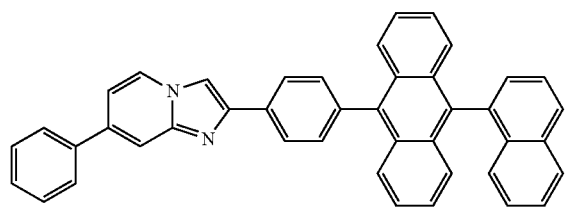
ETL1-19
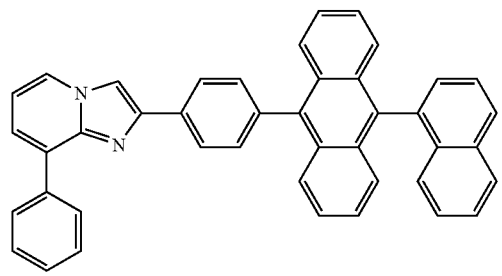
ETL1-20
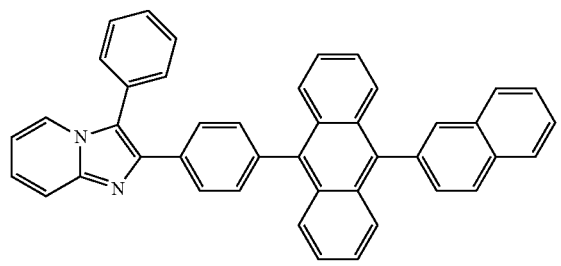
ETL1-21
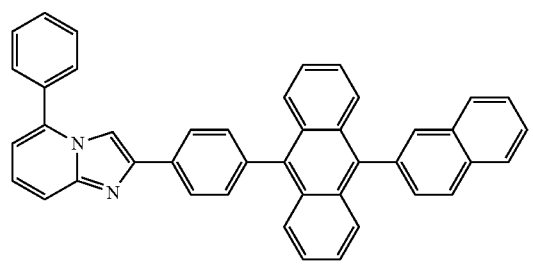
ETL1-22
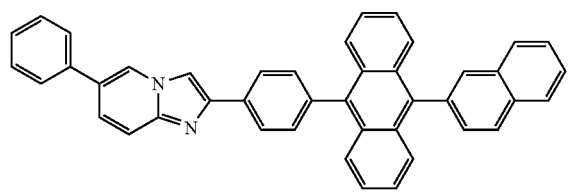
ETL1-23
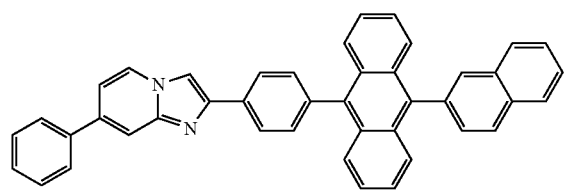
ETL1-24
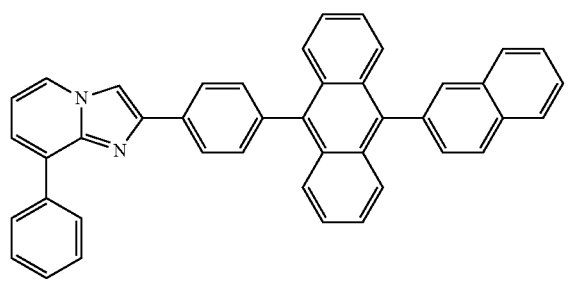

-continued
ETL1-25
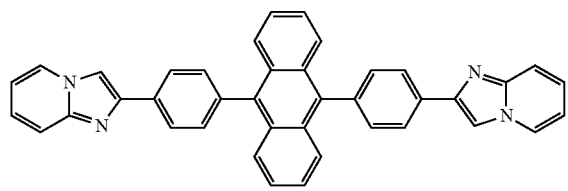
ETL1-26
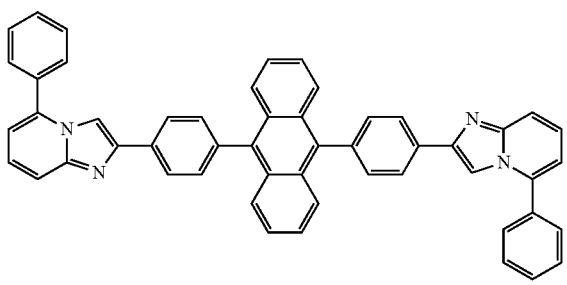
ETL1-27
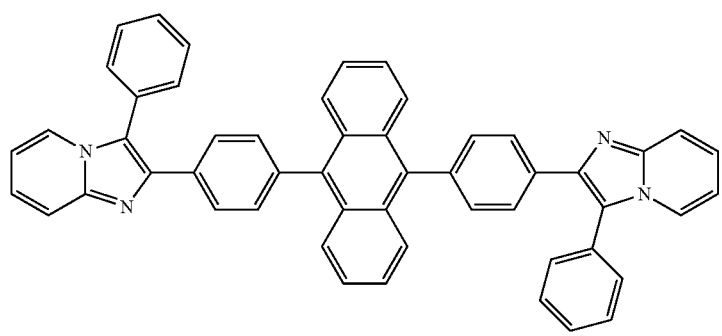
ETL1-28
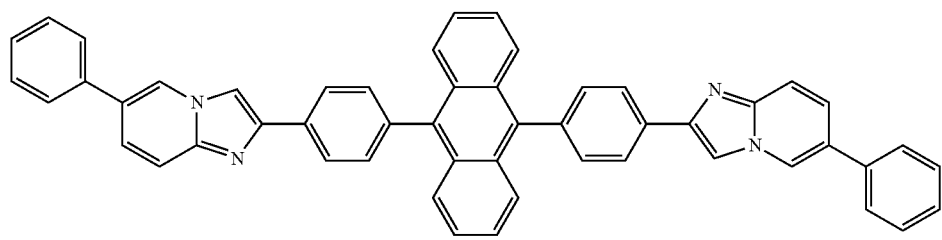
ETL1-29
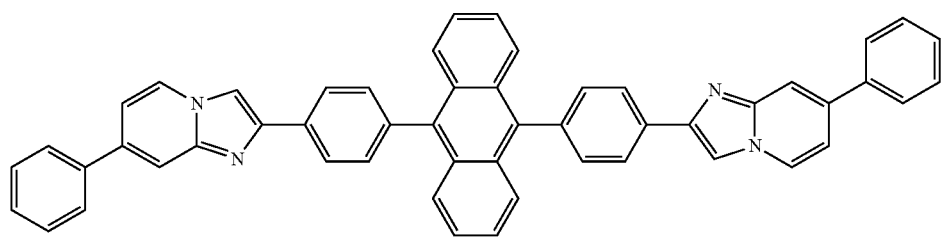
ETL1-30
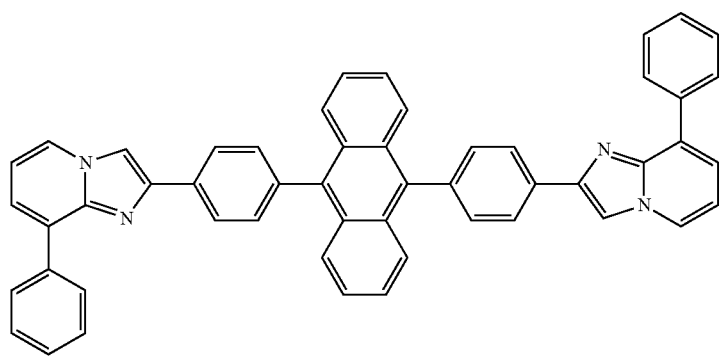

ETL1-31
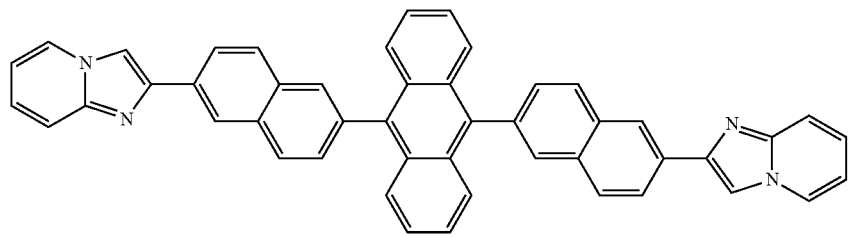
ETL1-32
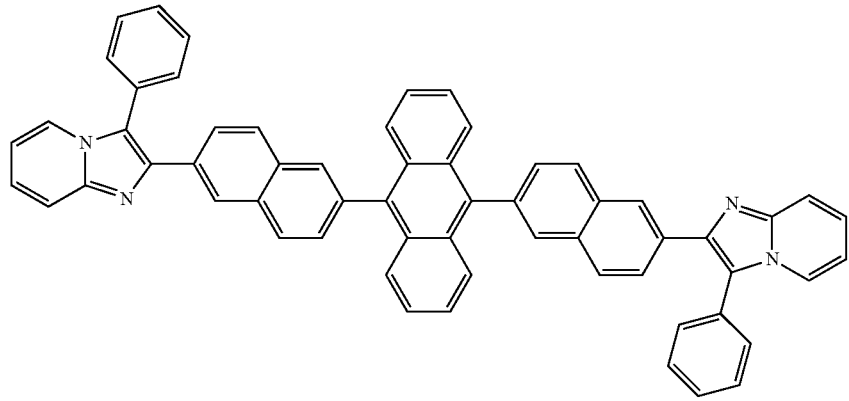
ETL1-33
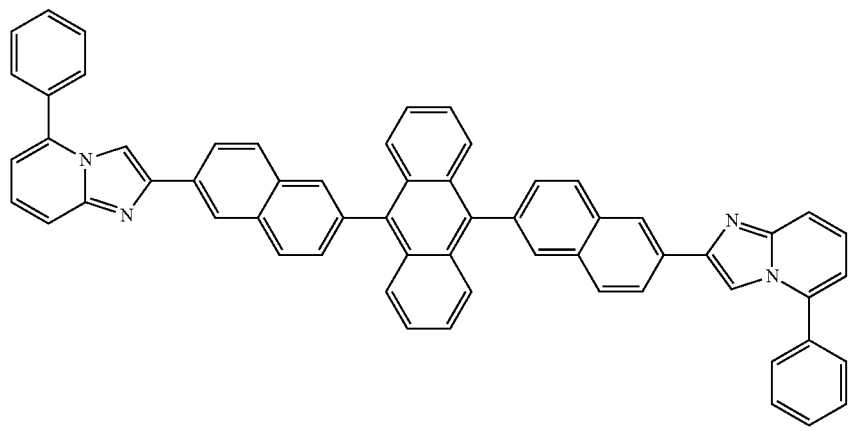
ETL1-34
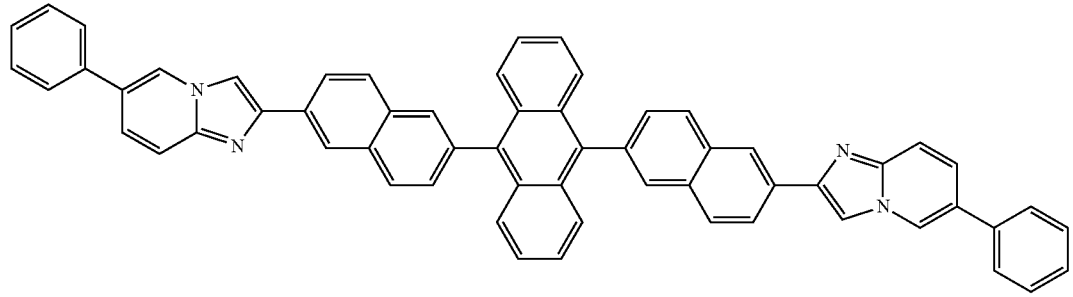
ETL1-35
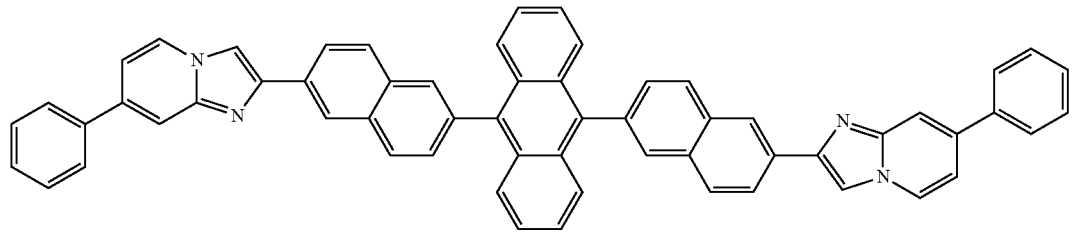

-continued
ETL1-36
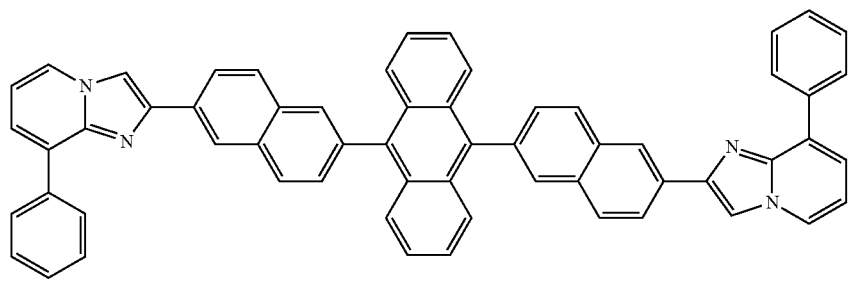
ETL1-37
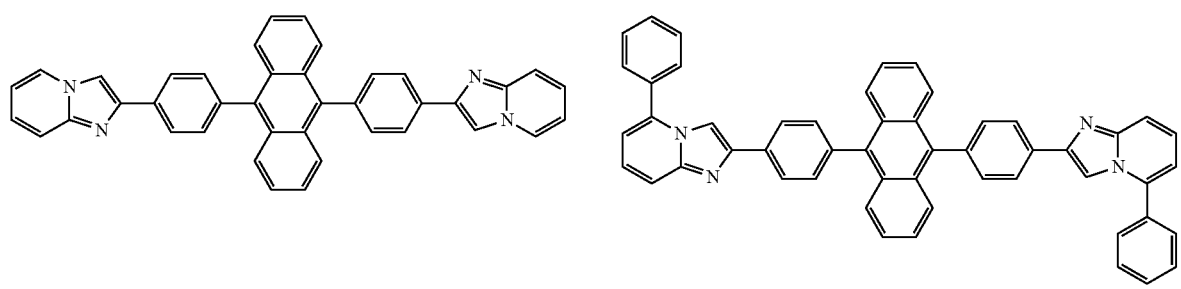
ETL1-38
ETL1-39
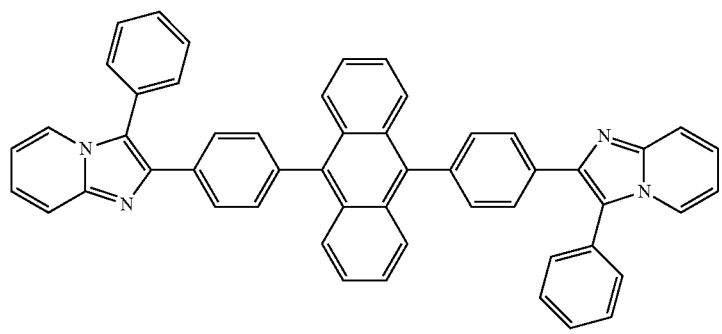
ETL1-40
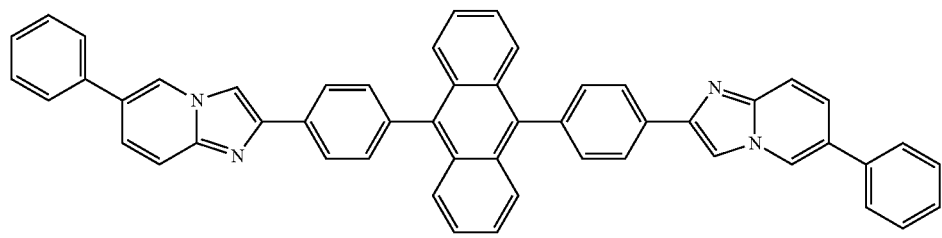
ETL1-41
ETL1-42
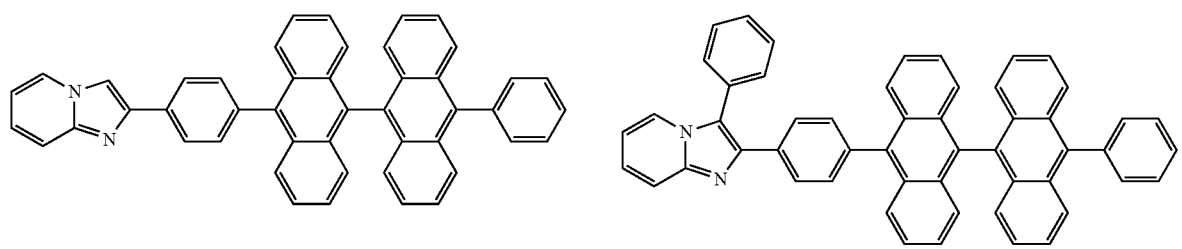

ETL1-43
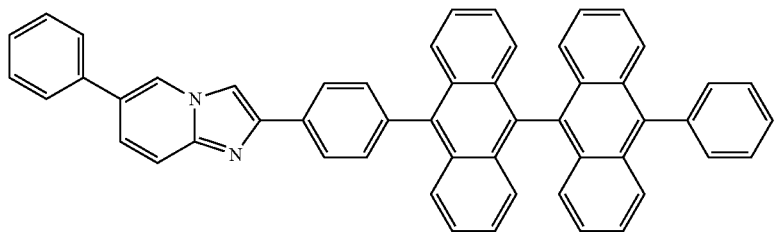
ETL1-44
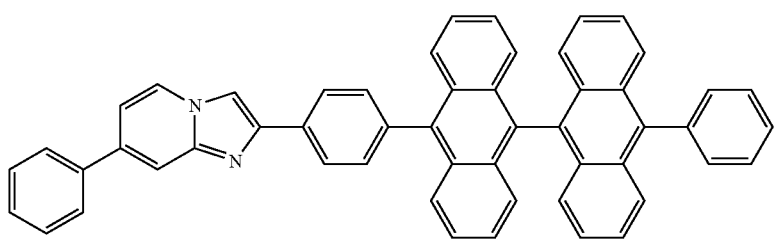
ETL1-45
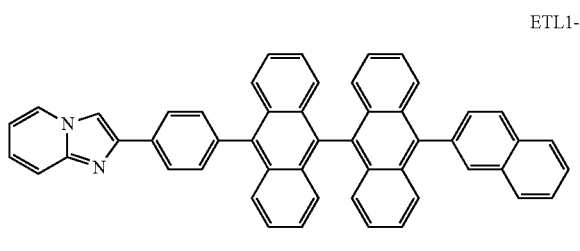
ETL1-46
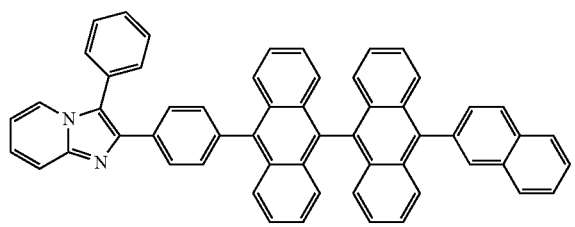
ETL1-47
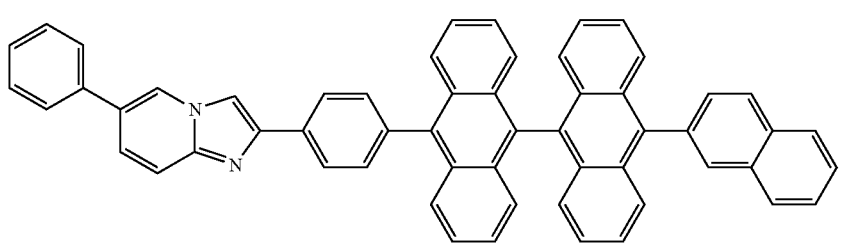
ETL1-48
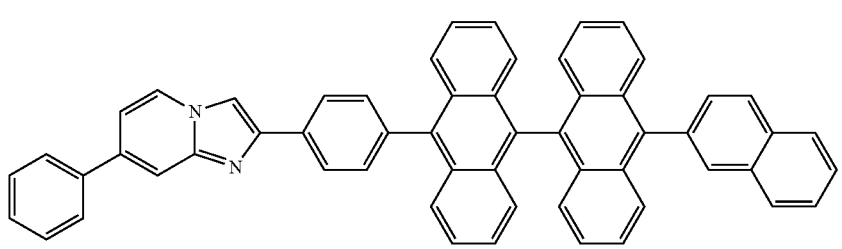
ETL1-49
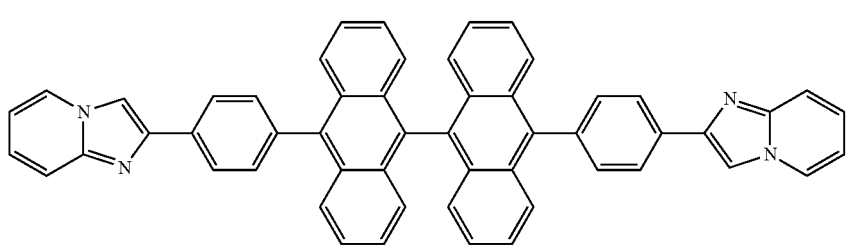

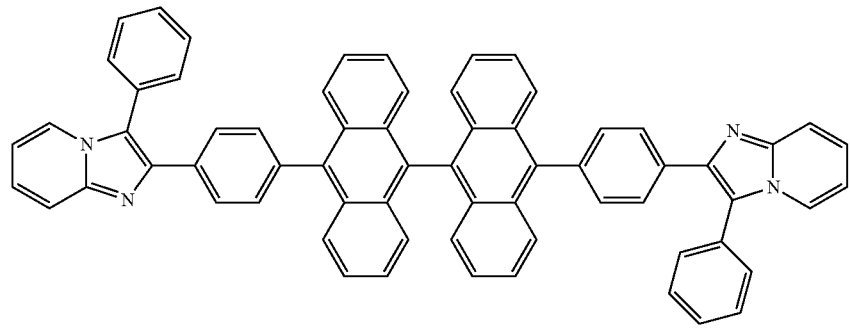
ETL1-50
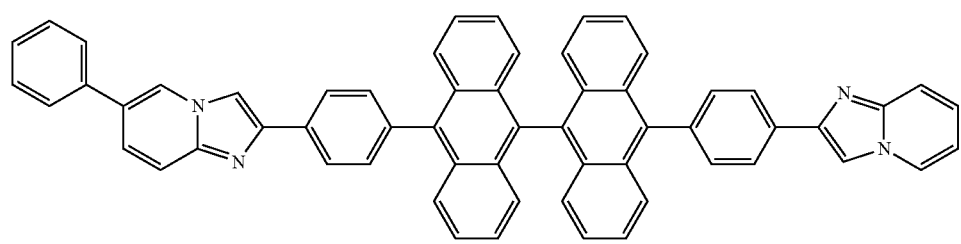
ETL1-51
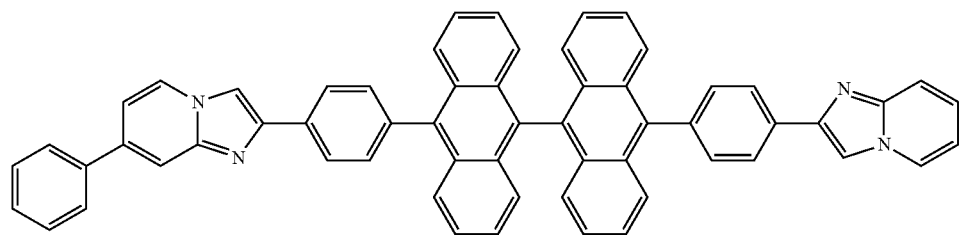
ETL1-52
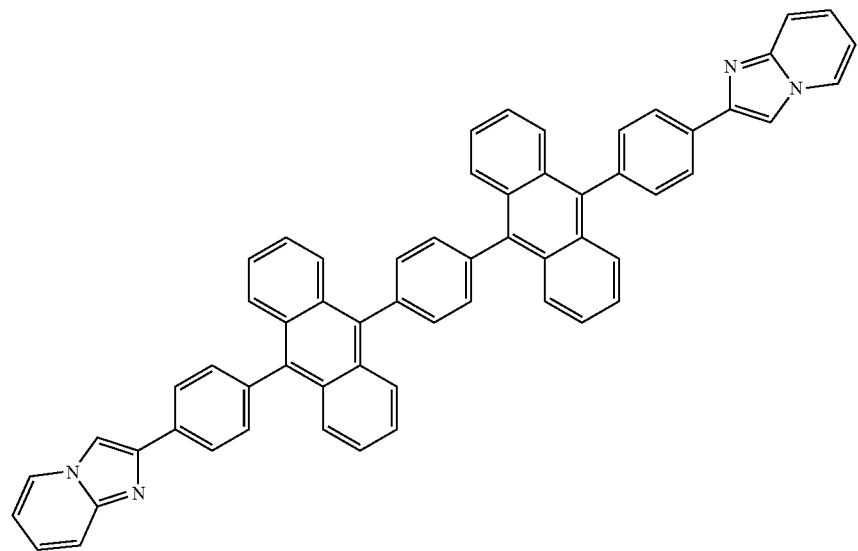
ETL1-53

-continued
ETL1-54
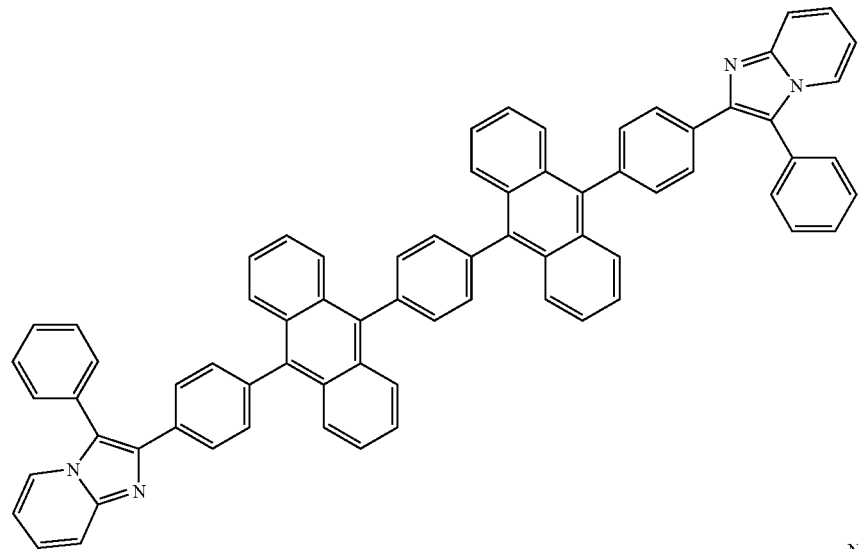
ETL1-55
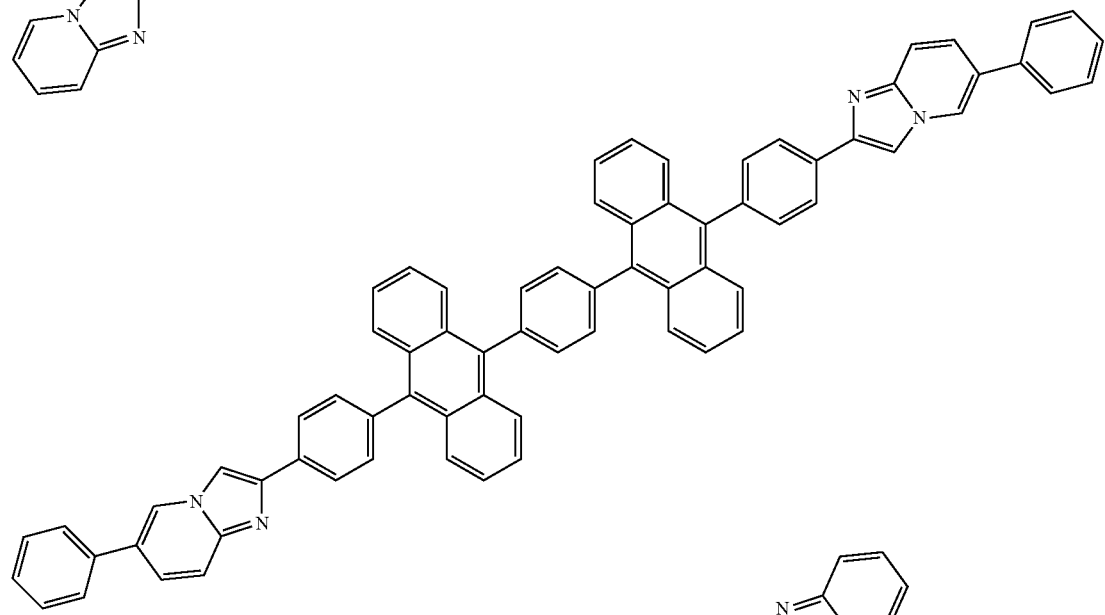
ETL1-56
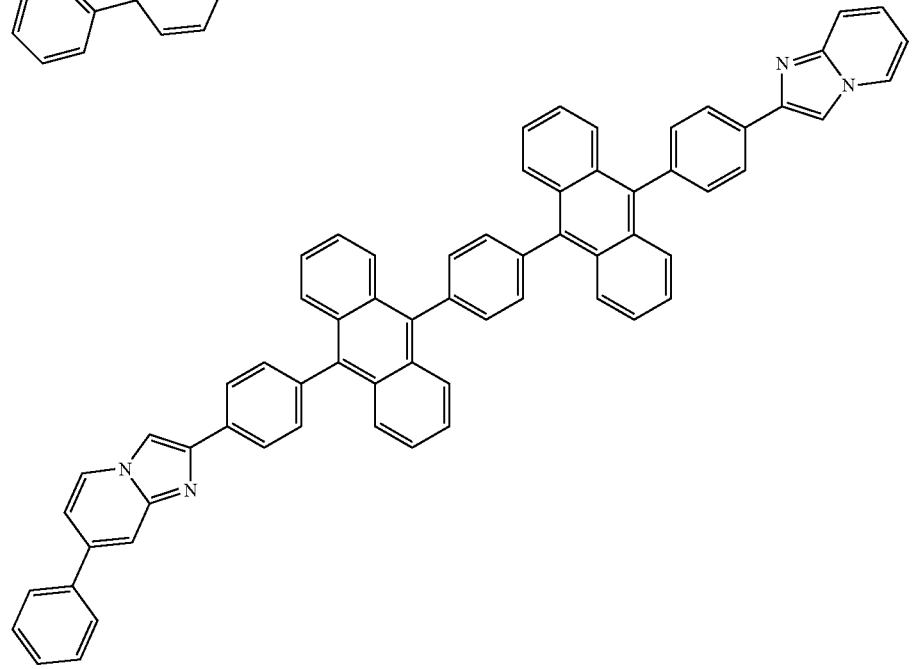

Such an azaindolizine-based compound has excellent electron transport property and electron injection property. Therefore, the luminous efficiency of the light-emitting element 1 can be improved.

The reason why such an azaindolizine-based compound has excellent electron transport property and electron injection property is considered to be as follows.

The entire molecule of the azaindolizine-based compound having an azaindolizine skeleton and an anthracene skeleton in the molecule as described above is connected by a π-conjugated system, and therefore, the electron cloud is spread across the entire molecule.

The portion of the azaindolizine skeleton of the azaindolizine-based compound has a function to receive an electron and a function to send the received electron to the portion of the anthracene skeleton. On the other hand, the portion of the anthracene skeleton of the azaindolizine-based compound has a function to receive an electron from the portion of the azaindolizine skeleton and a function to transfer the received electron to a layer adjacent to the electron transport layer 6 on the anode 3 side, that is, to the light-emitting layer 5.

To be more specific, the portion of the azaindolizine skeleton of the azaindolizine-based compound includes two nitrogen atoms. One of the nitrogen atoms (on the side near the portion of the anthracene skeleton) has an $sp^2$ hybrid orbital, and the other nitrogen atom (on the side far from the portion of the anthracene skeleton) has an $sp^3$ hybrid orbital. The nitrogen atom with an $sp^2$ hybrid orbital forms a portion of the conjugated system of the azaindolizine-based compound molecule and also has higher electronegativity than a carbon atom, and thus more strongly attracts an electron, and therefore functions as a portion that receives an electron. On the other hand, the nitrogen atom with an $sp^3$ hybrid orbital is not a normal conjugated system but has a non-covalent electron pair, and therefore, the electron of the nitrogen atom functions as a portion that sends an electron toward the conjugated system of the azaindolizine-based compound molecule.

On the other hand, the portion of the anthracene skeleton of the azaindolizine-based compound is electrically neutral, and therefore can easily receive an electron from the portion of the azaindolizine skeleton. Further, the portion of the anthracene skeleton of the azaindolizine-based compound has a large orbital overlap with the constituent material of the light-emitting layer 5, particularly, the host material (tetracene-based material) thereof, and therefore can easily transfer an electron to the host material of the light-emitting layer 5.

Such an azaindolizine-based compound has an excellent electron transport property and an excellent electron injection property as described above, and therefore, as a result, the driving voltage of the light-emitting element 1 can be decreased.

The portion of the azaindolizine skeleton is stable even if the nitrogen atom with an $sp^2$ hybrid orbital is reduced and also is stable even if the nitrogen atom with an $sp^a$ hybrid orbital is oxidized. Due to this, such an azaindolizine-based compound has high stability against electrons and holes. As a result, the lifetime of the light-emitting element 1 can be extended.

The anthracene-based compound to be used in the electron transport layer 6 (particularly in the second electron transport layer 6a in a case where the electron transport layer 6 includes the second electron transport layer 6a) may be any as long as it is a compound represented by the above formula IRH2 exemplified as the host material contained in the light-emitting layer 5 described above, but is preferably a compound represented by the above formula IRH2-A, the above formula IRH2-B, the above formula IRH2-C, or the above formula IRH2-D, and more specifically, it is preferably, for example, a compound represented by any of the above formulae IRH2-1 to IRH2-56.

A difference between the HOMO of the constituent material of the electron transport layer 6 (more specifically, the second electron transport layer 6a) and the HOMO of the host material to be used in the light-emitting layer 5 is preferably 0.2 eV or more. According to this, holes coming out of the light-emitting layer 5 to the electron transport layer 6 can be reduced, and thus, the luminous efficiency can be increased.

The HOMO of the constituent material of the second electron transport layer 6a is preferably 5.5 eV or more and 6.0 eV or less, and the LUMO of the constituent material of the second electron transport layer 6a is preferably 2.5 eV or more and 3.0 eV or less.

The HOMO of the constituent material of the first electron transport layer 6b is preferably 5.8 eV or more and 6.5 eV or less, and the LUMO of the constituent material of the first electron transport layer 6b is preferably 2.8 eV or more and 3.5 eV or less.

The thickness of the second electron transport layer 6a is preferably thicker than the thickness of the first electron transport layer 6b. According to this, while suppressing the driving voltage of the light-emitting element 1, electrons can be efficiently transported and injected into the light-emitting layer 5, and also the deterioration of the electron transport layer 6 can be reduced.

The specific thickness of the second electron transport layer 6a is preferably 30 nm or more and 150 nm or less, more preferably 70 nm or more and 90 nm or less. According to this, while suppressing the driving voltage of the light-emitting element 1, electrons can be efficiently transported and injected into the light-emitting layer 5, and also the deterioration of the electron transport layer 6 can be reduced.

The total thickness of the electron transport layer 6 is preferably 55 nm or more and 200 nm or less, more preferably 70 nm or more and 95 nm or less. According to this, electrons can be efficiently transported and injected into the light-emitting layer 5 while suppressing the driving voltage of the light-emitting element 1.

The electron transport layer 6 may be omitted depending on the constituent material, thickness, or the like of the cathode 8 and the light-emitting layer 5.

Electron Injection Layer

The electron injection layer 7 has a function to improve the electron injection efficiency from the cathode 8.

Examples of the constituent material (electron injection material) of the electron injection layer 7 include various types of inorganic insulating materials and various types of inorganic semiconductor materials.

Examples of such an inorganic insulating material include alkali metal chalcogenides (oxides, sulfides, selenides, and tellurides), alkaline earth metal chalcogenides, alkali metal halides, and alkaline earth metal halides, and among these, it is possible to use one type or two or more types in combination. By constituting the electron injection layer 7 by such a material as a main material, the electron injection property can be further improved. In particular, an alkali metal compound (such as an alkali metal chalcogenide or an alkali metal halide) has a very small work function, and by constituting the electron injection layer 7 using the compound, the light-emitting element 1 can have high luminance.

Examples of the alkali metal chalcogenide include $Li_2O$, LiO, $Na_2S$, $Na_2Se$, and NaO.

Examples of the alkaline earth metal chalcogenide include CaO, BaO, SrO, BeO, BaS, MgO, and CaSe.

Examples of the alkali metal halide include CsF, LiF, NaF, KF, LiCl, KCl, and NaCl.

Examples of the alkaline earth metal halide include $CaF_2$, $BaF_2$, $SrF_2$, $MgF_2$, and $BeF_2$.

Further, examples of the inorganic semiconductor material include oxides, nitrides, and oxynitrides containing at least one element selected from Li, Na, Ba, Ca, Sr, Yb, Al, Ga, In, Cd, Mg, Si, Ta, Sb, and Zn, and among these, it is possible to use one type or two or more types in combination.

The average thickness of the electron injection layer 7 is not particularly limited, but is preferably about 0.1 nm or more and 1000 nm or less, more preferably about 0.2 nm or more and 100 nm or less, further more preferably about 0.2 nm or more and 50 nm or less.

The electron injection layer 7 may be omitted depending on the constituent material, thickness, or the like of the cathode 8 and the light-emitting layer 5.

Sealing Member

The sealing member 9 is provided so as to cover the anode 3, the stacked body 14, and the cathode 8, and has a function to hermetically seal these members and block oxygen and moisture. By providing the sealing member 9, an effect of improvement of the reliability of the light-emitting element 1, prevention of the alteration or deterioration (improvement of the durability) of the light-emitting element 1, or the like is obtained.

Examples of the constituent material of the sealing member 9 include Al, Au, Cr, Nb, Ta, Ti, an alloy containing any of these metals, silicon oxide, and various types of resin materials. In a case where a material having electrical conductivity is used as the constituent material of the sealing member 9, in order to prevent a short circuit, it is preferred to provide an insulating film between the sealing member 9 and each of the anode 3, the stacked body 14, and the cathode 8 as needed.

Further, the sealing member 9 may be formed into a flat plate shape and made to face the substrate 2, and a space therebetween may be sealed with, for example, a sealant such as a thermosetting resin.

The light-emitting element 1 as described above can be produced, for example, as follows.

[1] First, a substrate 2 is prepared and an anode 3 is formed on the substrate 2.

The anode 3 can be formed by using, for example, a dry plating method such as a chemical vapor deposition (CVD) method such as plasma CVD or thermal CVD, a vacuum vapor deposition method, or sputtering, a wet plating method such as electroplating, a thermal spraying method, a sol-gel method, an MOD method, metal foil joining, or the like.

[2] Subsequently, a hole injection layer 4 is formed on the anode 3.

The hole injection layer 4 is preferably formed by, for example, a gas phase process using a dry plating method such as a CVD method, vacuum vapor deposition, or sputtering, or the like.

The hole injection layer 4 can also be formed by, for example, supplying a hole injection layer-forming material prepared by dissolving a hole injection material in a solvent or dispersing a hole injection material in a dispersion medium onto the anode 3, followed by drying (removal of the solvent or removal of the dispersion medium).

As the method for supplying the hole injection layer-forming material, for example, any of various coating methods such as a spin coating method, a roll coating method, and an ink jet printing method can also be used. The hole injection layer 4 can be relatively easily formed by using such a coating method.

Examples of the solvent or the dispersion medium to be used in the preparation of the hole injection layer-forming material include various types of inorganic solvents, various types of organic solvents, and mixed solvents containing any of these solvents.

The drying can be performed by, for example, leaving the material to stand in an atmosphere at atmospheric pressure or reduced pressure, by a heating treatment, by spraying an inert gas, or the like.

Further, prior to this step, the upper surface of the anode 3 may be subjected to an oxygen plasma treatment. By doing this, lyophilicity can be imparted to the upper surface of the anode 3, an organic substance adhered to the upper surface of the anode 3 can be removed (washed off), the work function near the upper surface of the anode 3 can be adjusted, and so on.

The conditions for the oxygen plasma treatment are, for example, preferably set as follows: the plasma power: about 100 W or more and 800 W or less; the oxygen gas flow rate: about 50 mL/min or more and 100 mL/min or less; and the conveying speed of a member to be treated (anode 3): about 0.5 mm/sec or more and 10 mm/sec or less.

[3] Subsequently, a light-emitting layer 5 is formed on the hole injection layer 4.

The light-emitting layer 5 can be formed by, for example, a gas phase process using a dry plating method such as vacuum vapor deposition, or the like.

[4] Subsequently, an electron transport layer 6 (a first electron transport layer 6b and a second electron transport layer 6a) is formed on the light-emitting layer 5.

It is preferred that the electron transport layer 6 (the first electron transport layer 6b and the second electron transport layer 6a) is formed by, for example, a gas phase process using a dry plating method such as vacuum vapor deposition, or the like.

The electron transport layer 6 can also be formed by, for example, supplying an electron transport layer-forming material prepared by dissolving an electron transport material in a solvent or dispersing an electron transport material in a dispersion medium onto the light-emitting layer 5, followed by drying (removal of the solvent or removal of the dispersion medium).

[5] Subsequently, an electron injection layer 7 is formed on the electron transport layer 6.

In a case where an inorganic material is used as the constituent material of the electron injection layer 7, the electron injection layer 7 can be formed by using, for example, a gas phase process using a dry plating method such as a CVD method, vacuum vapor deposition, or sputtering, or the like, coating and firing of an inorganic fine particle ink, or the like.

[6] Subsequently, a cathode 8 is formed on the electron injection layer 7.

The cathode 8 can be formed by using, for example, a vacuum vapor deposition method, a sputtering method, metal foil joining, coating and firing of a metal fine particle ink, or the like.

The light-emitting element 1 is obtained through the steps as described above.

Finally, a sealing member 9 is placed thereon so as to cover the obtained light-emitting element 1 and joined to the substrate 2.

Light-Emitting Device

Next, an embodiment of the light-emitting device according to the invention will be described.

Figure 2:
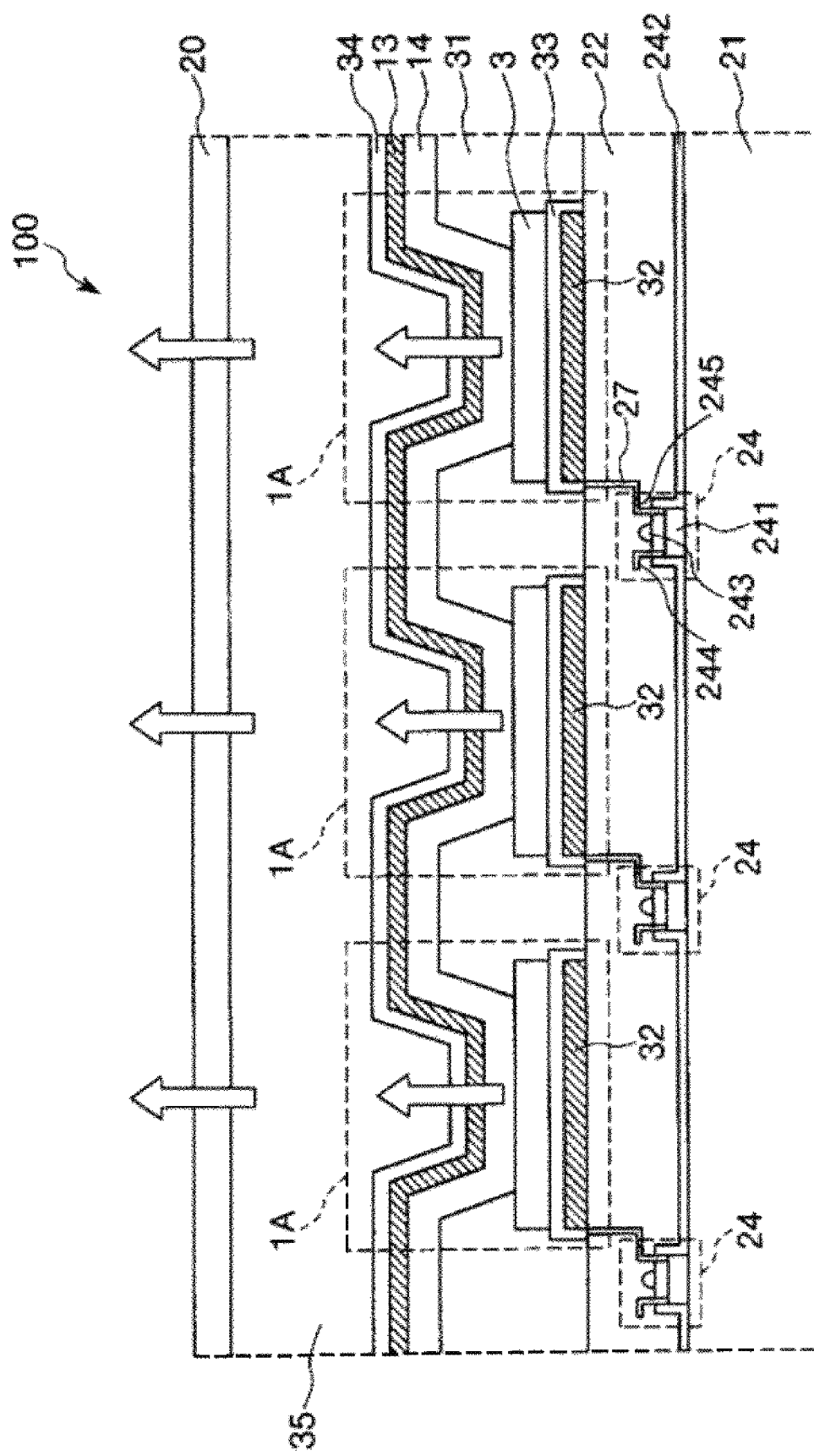
FIG. 2 is a longitudinal cross-sectional view showing an embodiment of a display device to which a light-emitting device according to the invention is applied.

FIG. 2 is a longitudinal cross-sectional view showing an embodiment of a display device to which the light-emitting device according to the invention is applied.

A display device 100 shown in FIG. 2 includes a substrate 21, a plurality of light-emitting elements LA, and a plurality of driving transistors 24 for driving the respective light-emitting elements LA. Here, the display device 100 is a display panel having a top emission structure.

On the substrate 21, the plurality of driving transistors 24 are provided, and a planarization layer 22 constituted by an insulating material is formed so as to cover these driving transistors 24.

Each driving transistor 24 includes a semiconductor layer 241 composed of silicon, a gate insulating layer 242 formed on the semiconductor layer 241, a gate electrode 243 formed on the gate insulating layer 242, a source electrode 244, and a drain electrode 245.

On the planarization layer, the light-emitting elements 1A are provided corresponding to the respective driving transistors 24.

In the light-emitting element LA, on the planarization layer 22, a reflective film 32, an anticorrosive film 33, an anode 3, a stacked body (organic EL light-emitting section) 14, a cathode 13, and a cathode cover 34 are stacked in this order. In this embodiment, the anode 3 of each light-emitting element 1A constitutes a pixel electrode and is electrically connected to the drain electrode 245 of each driving transistor 24 through an electrically conductive section (wiring) 27. Further, the cathode 13 of each light-emitting element 1A acts as a common electrode.

The light-emitting element 1A in FIG. 2 is the light-emitting element 1 which emits light in a near-infrared region of 600 nm or more.

Between the adjacent light-emitting elements LA, a partition wall 31 is provided. Further, on the light-emitting elements LA, an epoxy layer 35 constituted by an epoxy resin is formed so as to cover the light-emitting elements LA.

On the epoxy layer 35, a sealing substrate 20 is provided so as to cover the epoxy layer 35.

The display device 100 as described above can be used as, for example, a near-infrared display for military purposes or the like.

Such a display device 100 can emit light having a longer wavelength in a near-infrared region while achieving high efficiency, and has excellent reliability.

Authentication Device

Next, an embodiment of the authentication device according to the invention will be described.

Figure 3:
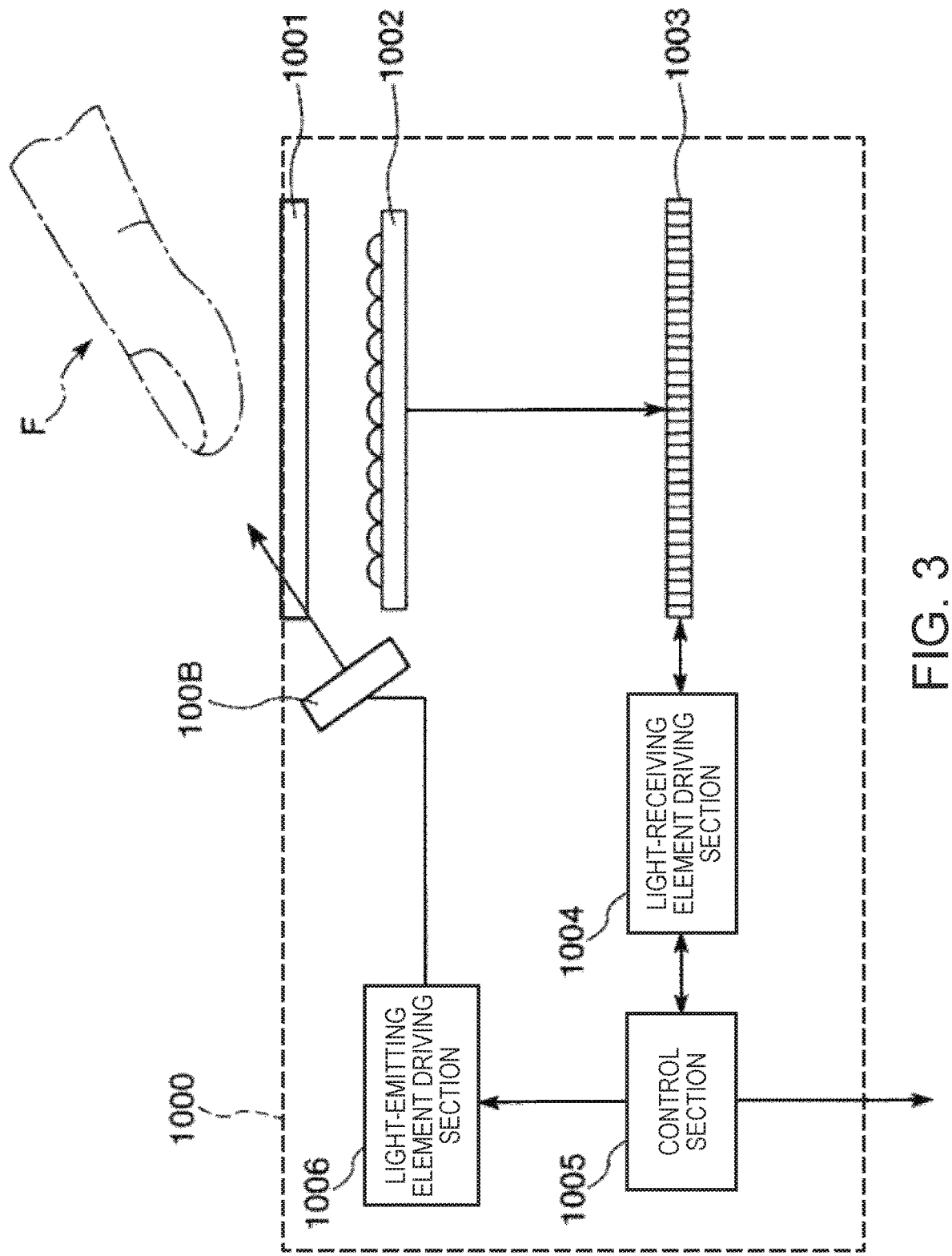
FIG. 3 is a view showing an embodiment of an authentication device according to the invention.

FIG. 3 is a view showing an embodiment of the authentication device according to the invention.

An authentication device 1000 shown in FIG. 3 is a biometric authentication device which authenticates an individual using the biological information of a living body F (in this embodiment, a fingertip).

The authentication device 1000 includes a light source 100B, a cover glass 1001, a microlens array 1002, a light-receiving element group 1003, a light-emitting element driving section 1006, a light-receiving element driving section 1004, and a control section 1005.

The light source 100B includes a plurality of light-emitting elements 1, each of which emits light in a near-infrared region of 600 nm or more, and irradiates light in a near-infrared region onto the living body F which is the object to be imaged. For example, the light-emitting elements 1 of the light source 100B are arranged along the outer circumference of the cover glass 1001.

The cover glass 1001 is a part which the living body F comes into contact with or comes close to.

The microlens array 1002 is provided on the side opposite to the side of the cover glass 1001 which the living body F comes into contact with or comes close to. This microlens array 1002 is constituted by a plurality of microlenses arranged in a matrix.

The light-receiving element group 1003 is provided on the side opposite to the cover glass 1001 with respect to the microlens array 1002. The light-receiving element group 1003 is constituted by a plurality of light-receiving elements provided in a matrix corresponding to the plurality of microlenses of the microlens array 1002. As each light-receiving element of the light-receiving element group 1003, for example, a CCD (Charge Coupled Device), a CMOS, or the like can be used.

The light-emitting element driving section 1006 is a driving circuit which drives the light source 100B.

The light-receiving element driving section 1004 is a driving circuit which drives the light-receiving element group 1003.

The control section 1005 is, for example, an MPU, and has a function to control the driving of the light-emitting element driving section 1006 and the light-receiving element driving section 1004.

Further, the control section 1005 has a function to perform authentication of the living body F by comparison between the light reception result of the light-receiving element group 1003 and the previously stored biometric authentication information.

For example, the control section 1005 forms an image pattern (for example, a vein pattern) associated with the living body F based on the light reception result of the light-receiving element group 1003. Then, the control section 1005 compares the formed image pattern and the image pattern previously stored as the biometric authentication information, and performs authentication (for example, vein authentication) of the living body F based on the comparison result.

Such an authentication device 1000 enables biometric authentication using near-infrared light. Further, the authentication device 1000 includes, as the light source 100B, the light-emitting element 1, which can emit light having a longer wavelength in a near-infrared region while achieving high efficiency, and therefore has excellent reliability.

Such an authentication device 1000 can be incorporated into various types of electronic apparatuses.

Electronic Apparatus

Figure 4:
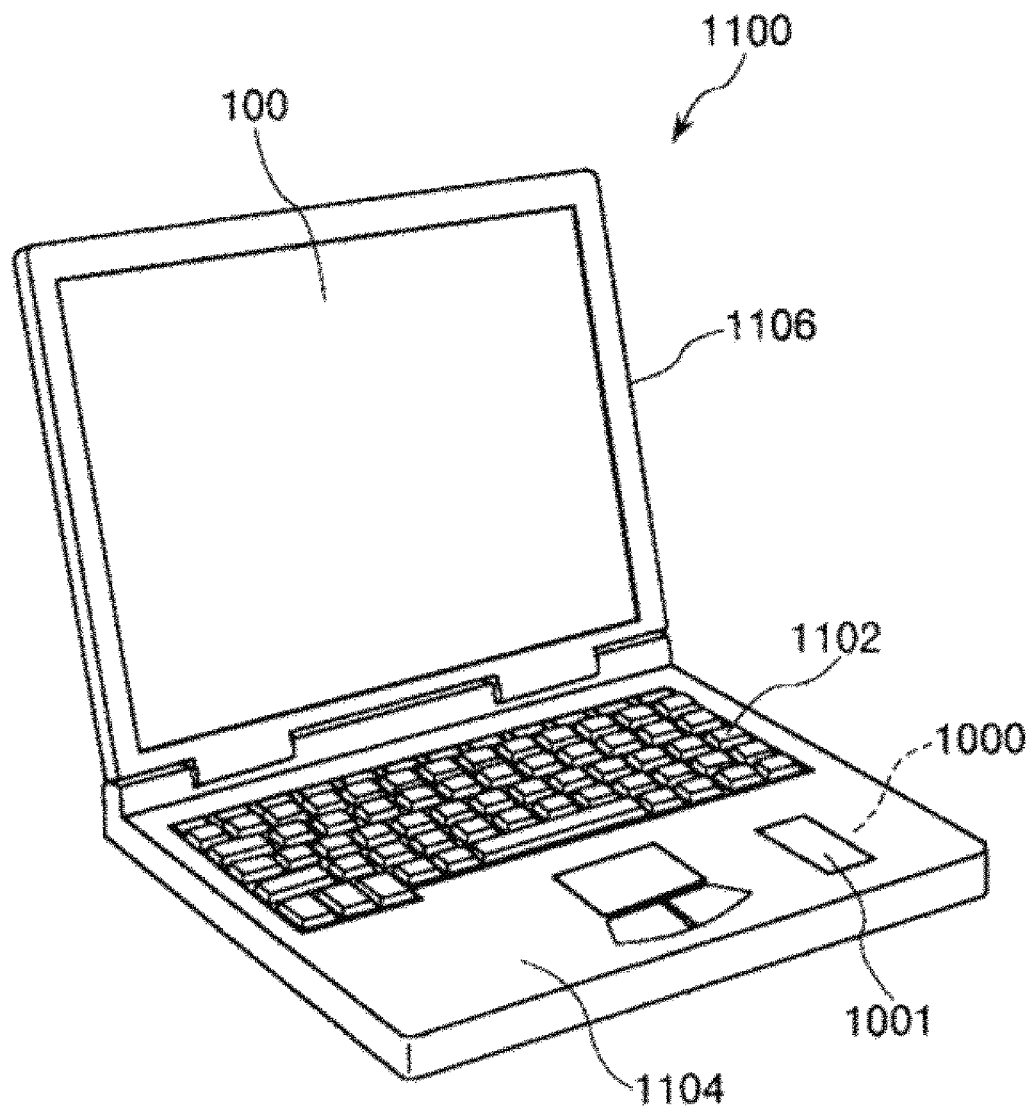
FIG. 4 is a perspective view showing the configuration of a mobile-type (or notebook-type) personal computer to which an electronic apparatus according to the invention is applied.

FIG. 4 is a perspective view showing the configuration of a mobile-type (or notebook-type) personal computer to which an electronic apparatus according to the invention is applied.

In this drawing, a personal computer 1100 is configured to include a main body 1104 provided with a keyboard 1102 and a display unit 1106 provided with a display section, and the display unit 1106 is supported rotatably with respect to the main body 1104 through a hinge structure.

In the personal computer 1100, the main body 1104 is provided with the above-mentioned authentication device 1000.

Such a personal computer 1100 includes the light-emitting element 1, which can emit light having a longer wavelength in a near-infrared region while achieving high efficiency, and therefore has excellent reliability.

The electronic apparatus according to the invention can be applied not only to the personal computer (mobile-type personal computer) shown in FIG. 4, but also to, for example, a smartphone, a tablet terminal, a timepiece, a wearable apparatus, a mobile phone, a digital still camera, a television, a video camera, a view finder-type or monitor direct view-type video tape recorder, a laptop-type personal computer, a car navigation device, a pager, an electronic organizer (also including an electronic organizer with a communication function), an electronic dictionary, an electronic calculator, an electronic gaming machine, a word processor, a workstation, a videophone, a security television monitor, electronic binoculars, a POS terminal, an apparatus provided with a touch panel (for example, a cash dispenser in financial institutions and an automatic ticket vending machine), a medical apparatus (for example, an electronic thermometer, a sphygmomanometer, a blood glucose meter, a sphygmometer, a plethysmograph, an electrocardiographic device, an ultrasonic diagnostic device, or a display device for an endoscope), a fish finder, various types of measurement apparatuses, meters and gauges (for example, meters and gauges for vehicles, aircrafts, and ships), a flight simulator, other various types of monitors, a projection-type display device such as a projector, and the like.

Further, examples of the electronic apparatus according to the invention as an apparatus configured to include the above-mentioned light source 100B other than an apparatus configured to include the authentication device 1000 include a medical apparatus (biosensor) such as a blood oximeter, a blood glucose meter, a skin analyzer, a body fat meter, an observation machine for a fluorescent substance in the living body, a skin cancer diagnostic device, a pupil observation device, and a blood vessel observation apparatus, and an infrared scanner apparatus.

Hereinabove, the light-emitting element, the light-emitting device, the light source, the authentication device, and the electronic apparatus according to the invention have been described with reference to the embodiments shown in the drawings, however, the invention is not limited thereto.

The light-emitting element and the light-emitting device according to the invention each may be used as a light source for lighting.

EXAMPLES

Next, specific examples of the invention will be described.

1-1. Production of Light-Emitting Material

A thiadiazole-based compound represented by the above formula IRD1-1 was synthesized through the following steps.

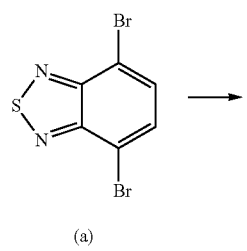

(a)

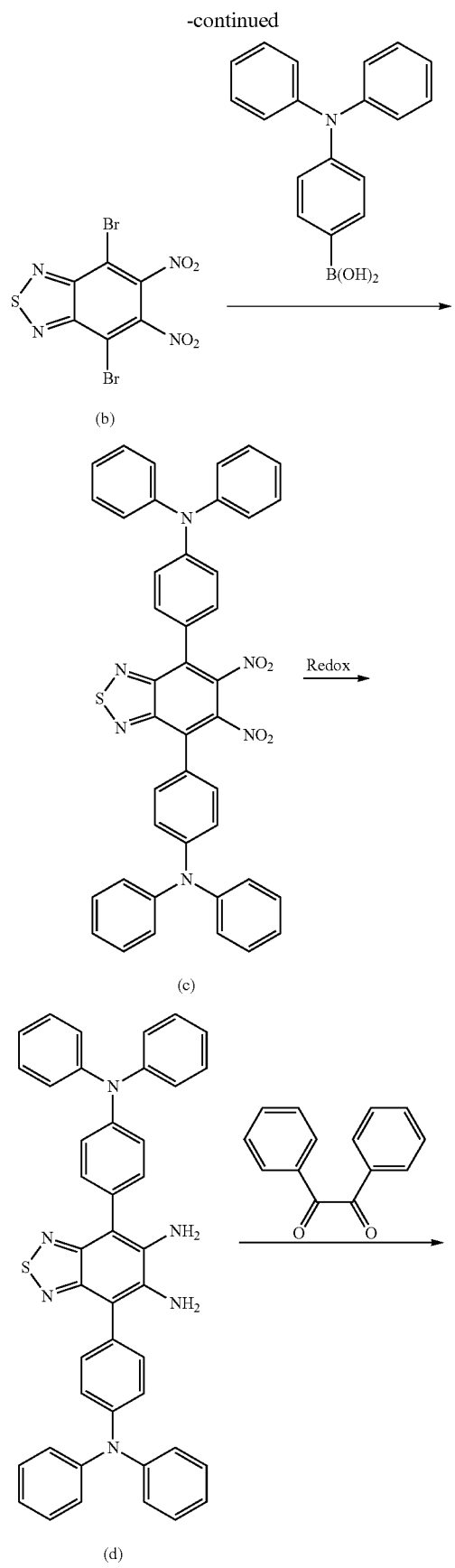

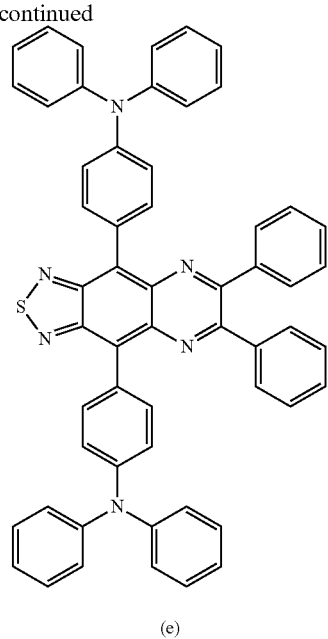

(e)

Synthesis (A1-1)

In a 5-L flask, 1500 mL of fuming nitric acid was placed and cooled. Thereto, 1500 mL of sulfuric acid was added in divided portions such that the temperature was maintained at 10 to 50° C. Further, 150 g of a compound (a) which is dibromobenzothiadiazole as a starting material was added thereto in small portions over 1 hour. At this time, the temperature of the solution was maintained at 5° C. or lower. After the entire amount was added, a reaction was allowed to proceed at room temperature (25° C.) for 20 hours. After the reaction, the reaction mixture was poured into 3 kg of ice, followed by stirring overnight. Thereafter, the mixture was filtered, followed by washing with methanol and heptane.

The residue after filtration was thermally dissolved in 200 mL of toluene, and the resulting solution was gradually cooled to room temperature and then filtered. The resulting residue was washed with a small amount of toluene, and then dried under reduced pressure.

By doing this, 60 g of a compound (b) (4,7-dibromo-5,6-dinitro-benzo[1,2,5]thiadiazole) with an HPLC purity of 95% was obtained.

Synthesis (A1-2)

In an Ar atmosphere, in a 5-L flask, 30 g of the compound (b) which is the obtained dibromo compound, 160 g of triphenylamine boronic acid, 2500 mL of toluene, and a 2 M aqueous solution of cesium carbonate (152 g/234 mL of distilled water) were placed, and a reaction was allowed to proceed overnight at 90° C. After the reaction, filtration, liquid separation, and concentration were performed, and 52 g of the resulting crude material was separated using a silica gel column (5 kg of $SiO_2$), whereby a red-purple solid was obtained.

By doing this, 6 g of a compound (c) (5,6-dinitro-4,7-diphenyl-benzo[1,2,5]thiadiazole) with an HPLC purity of 96% was obtained.

Synthesis (A1-3)

In an Ar atmosphere, in a 1-L flask, 6 g of the compound (c) which is the obtained dinitro compound, 7 g of reduced iron, and 600 mL of acetic acid were placed, and a reaction was allowed to proceed at 80° C. for 4 hours, and then the mixture was cooled to room temperature. After the reaction, the reaction mixture was poured into 1.5 L of ion exchanged water, and then, 1.5 L of ethyl acetate was further added thereto. After the addition, a solid was deposited, and therefore, 1 L of tetrahydrofuran and 300 g of sodium chloride were added thereto, and liquid separation was performed. The aqueous layer was reextracted with 1 L of tetrahydrofuran, followed by concentration and drying. The resulting residue was again washed with a small amount of water and methanol, whereby an orange solid was obtained.

By doing this, 7 g of a compound (d) (4,7-diphenyl-benzo[1,2,5]thiadiazolo-5,6-diamine) with an HPLC purity of 80% was obtained.

Synthesis (A1-4)

In an Ar atmosphere, in a 1-L flask, 4.5 g of the compound (d) which is the obtained diamine compound, 3.7 g of benzil, and 300 mL of acetic acid as a solvent were placed, and a reaction was allowed to proceed at 80° C. for 2 hours. After the reaction, the reaction mixture was cooled to room temperature, and then poured into 1 L of ion exchanged water. The resulting crystal was filtered and washed with water, whereby 7 g of a black-green solid was obtained. Then, this black-green solid was purified using a silica gel column (1 kg of $SiO_2$).

By doing this, 4 g of a compound (e) (a compound represented by the above formula IRD1-1) with an HPLC purity of 99% was obtained. This compound (e) was subjected to mass analysis, and the result was as follows: M+: 492.

Further, the obtained compound (e) was purified by sublimation at a set temperature of 340° C. The HPLC purity of the compound (e) after the purification by sublimation was 99%.

1-2. Production of Host Material

A tetracene-based compound represented by the above formula IRH1-5 or the like, and an anthracene-based compound represented by the above formula IRH2-30, the above formula ETL1-3, or the like were synthesized with reference to the production methods described in JP-A-2013-177327 and JP-A-2013-179123, respectively.

2. Production of Light-Emitting Element

Reference Example 1

<1> First, a transparent glass substrate having an average thickness of 0.5 mm was prepared. Subsequently, on this substrate, an ITO electrode (anode) having an average thickness of 100 nm was formed by a sputtering method.

Then, the substrate was subjected to ultrasonic cleaning while immersing the substrate in acetone and 2-propanol in this order, and thereafter subjected to an oxygen plasma treatment and an argon plasma treatment. Each of these plasma treatments was performed at a plasma power of 100 W and a gas flow rate of 20 sccm for a treatment time of 5 sec.

<2> Subsequently, a compound represented by the above formula HIL-1 was deposited on the ITO electrode by a vacuum vapor deposition method, whereby a hole injection layer (HIL) having an average thickness of 50 nm was formed.

<3> Subsequently, the constituent material of a light-emitting layer was deposited on the hole injection layer by a vacuum vapor deposition method, whereby a light-emitting layer having an average thickness of 25 nm was formed. As the constituent material of the light-emitting layer, a compound (thiadiazole-based compound) represented by the above formula IRD1-1 was used as a light-emitting material (guest material), and a compound (tetracene-based material) represented by the above formula IRH1-5 was used as a host material. Further, the content (doping concentration) of the light-emitting material (dopant) in the light-emitting layer was set to 1.5 wt %.

<4> Subsequently, a compound (anthracene-based material) represented by the above formula IRH2-30 was deposited on the light-emitting layer by a vacuum vapor deposition method, whereby a second electron transport layer (ETL2) having an average thickness of 75 nm was formed.

<5> Subsequently, a compound (azaindolizine-based compound) represented by the above ETL1-3 was deposited on the second electron transport layer by a vacuum vapor deposition method, whereby a first electron transport layer (ETL1) having an average thickness of 10 nm was formed.

<6> Subsequently, lithium fluoride (LiF) was deposited on the first electron transport layer by a vacuum vapor deposition method, whereby an electron injection layer having an average thickness of 1 nm was formed.

<7> Subsequently, Al was deposited on the electron injection layer by a vacuum vapor deposition method, whereby a cathode having an average thickness of 100 nm constituted by Al was formed.

<8> Subsequently, a protective cover (sealing member) made of glass was placed thereon so as to cover the respective formed layers, and then fixed and sealed with an epoxy resin.

A light-emitting element was produced through the above-mentioned steps.

Examples 2 to 4 and Reference Examples 5 to 7

Light-emitting elements were produced in the same manner as in the above-mentioned Reference Example 1 except that the content (doping concentration) of the light-emitting material (dopant) contained in the light-emitting layer in the step <3> was changed as shown in Table 1, respectively.

Reference Example 8

A light-emitting element was produced in the same manner as in the above-mentioned Reference Example 1 except that the average thickness of the hole injection layer (HIL) formed in the step <2> was set to 70 nm, a compound (benzo-bis-thiadiazole-based compound) represented by the above formula IRD2-1 was used as the light-emitting material (dopant) used in the step <3>, and further, the average thickness of the second electron transport layer (ETL2) formed in the step <4> was set to 85 nm.

Examples 9 to 11 and Reference Examples 12 to 14

Light-emitting elements were produced in the same manner as in the above-mentioned Reference Example 8 except that the content (doping concentration) of the light-emitting material (dopant) contained in the light-emitting layer in the step <3> was changed as shown in Table 1, respectively.

Comparative Example 1

A light-emitting element was produced in the same manner as in the above-mentioned Reference Example 1 except that the average thickness of the hole injection layer (HIL) formed in the step <2> was set to 30 nm, a compound represented by the following formula RD-1 was used as the light-emitting material (dopant) used in the step <3>, and further, the average thickness of the second electron transport layer (ETL2) formed in the step <4> was set to 65 nm.

Comparative Examples 2 to 7

Light-emitting elements were produced in the same manner as in the above-mentioned Comparative Example 1 except that the content (doping concentration) of the light-emitting material (dopant) contained in the light-emitting layer in the step <3> was changed as shown in Table 1, respectively.

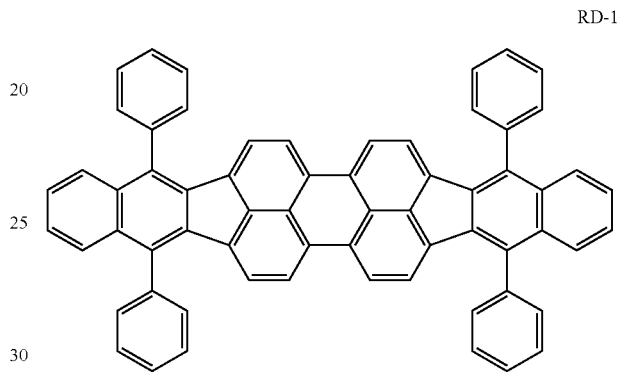

RD-1

3. Evaluation

With respect to the respective Examples, the respective Reference Examples, and the respective Comparative Examples, a constant current of 100 mA/cm$^2$ was allowed to flow through each of the light-emitting elements using a constant current power supply (KEITHLEY 2400, manufactured by TOYO Corporation), and the emission peak wavelength at that time was measured using a high-speed spectroradiometer (S-9000, manufactured by Soma Optics Co., Ltd.). Further, the external quantum efficiency (luminous efficiency) (EQE (%)) in a wavelength region of 600 nm to 1000 nm was also measured using an optical power meter (Optical Power Meter 8230, manufactured by ADC Corporation).

Further, in the measured external quantum efficiencies, with respect to the respective light-emitting materials, the relative value of the external quantum efficiency was obtained for each light-emitting material by taking the external quantum efficiency of the light-emitting material having a doping concentration of 1.5 wt % as a standard. In addition, in the measured emission peak wavelengths, with respect to the respective light-emitting materials, the shift amount of the emission peak wavelength was obtained for each light-emitting material by taking the emission peak wavelength of the light-emitting material having a doping concentration of 100 wt % as a standard.

These measurement results are shown in Table 1.

Figure 5:
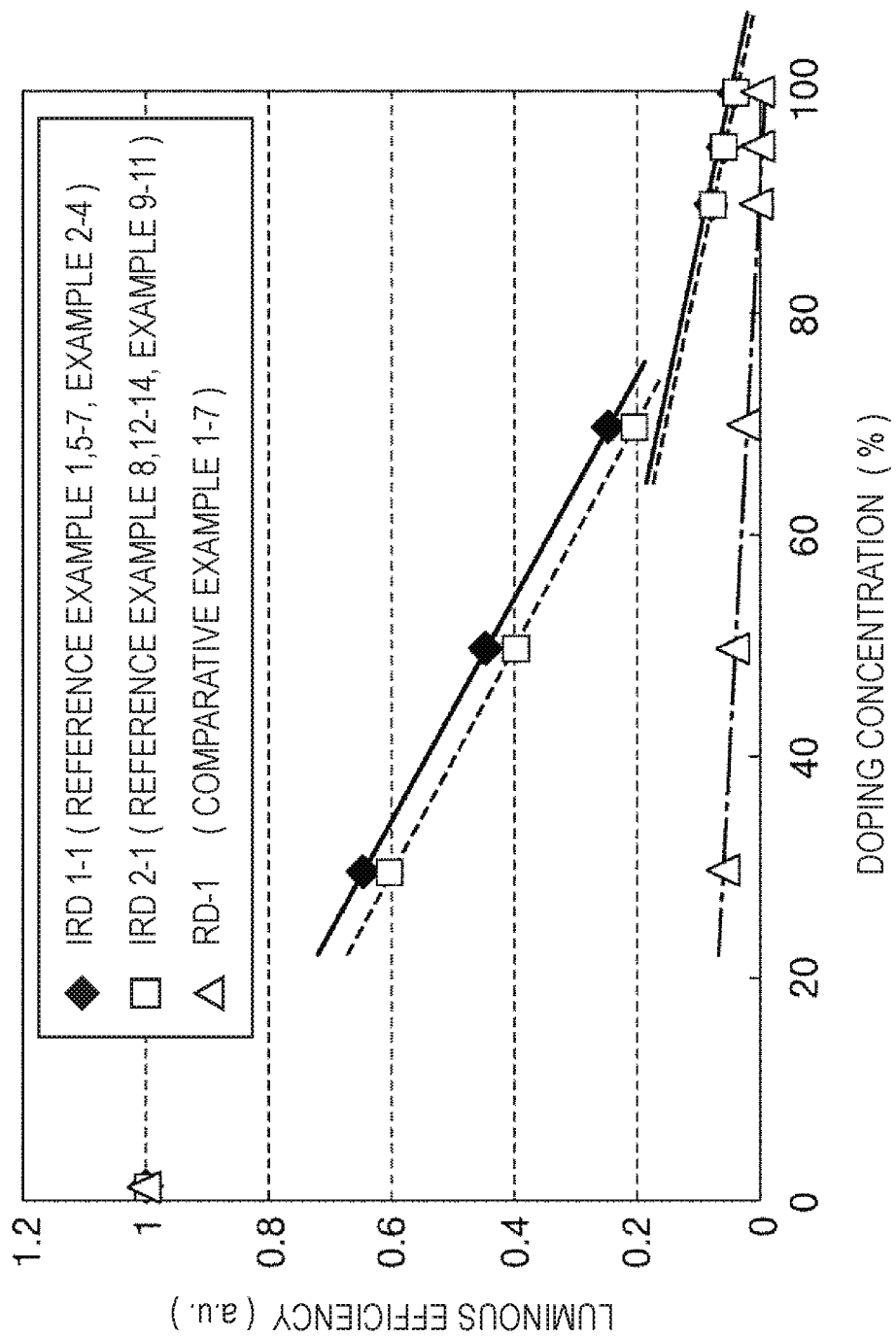
FIG. 5 is a graph showing a relationship between the relative value of the external quantum efficiency and the doping concentration for each light-emitting material.

Further, a relationship between the relative value of the external quantum efficiency and the doping concentration for each light-emitting material is shown in FIG. 5.

TABLE 1

| | Film thickness (nm) | | | | Material | | | | | Doping concentration (wt %) |
|---|---|---|---|---|---|---|---|---|---|---|
| | Light-emitting | | | | | Light-emitting | | | | |
| | HIL | layer | ETL2 | ETL1 | HIL | Host | material | ETL2 | ETL1 | |
| Reference Example 1 | 50 | 25 | 75 | 10 | HIL-1 | IRH1-5 | IRD1-1 | H2-30 | ETL1-3 | 1.5 |
| Example 2 | 50 | 25 | 75 | 10 | | | | | | 30 |
| Example 3 | 50 | 25 | 75 | 10 | | | | | | 50 |
| Example 4 | 50 | 25 | 75 | 10 | | | | | | 70 |
| Reference Example 5 | 50 | 25 | 75 | 10 | | | | | | 90 |
| Reference Example 6 | 50 | 25 | 75 | 10 | | | | | | 95 |
| Reference Example 7 | 50 | 25 | 75 | 10 | — | | | | | 100 |
| Reference Example 8 | 70 | 25 | 85 | 10 | HIL-1 | IRH1-5 | IRD2-1 | H2-30 | ETL1-3 | 1.5 |
| Example 9 | 70 | 25 | 85 | 10 | | | | | | 30 |
| Example 10 | 70 | 25 | 85 | 10 | | | | | | 50 |
| Example 11 | 70 | 25 | 85 | 10 | | | | | | 70 |
| Reference Example 12 | 70 | 25 | 85 | 10 | | | | | | 90 |
| Reference Example 13 | 70 | 25 | 85 | 10 | | | | | | 95 |
| Reference Example 14 | 70 | 25 | 85 | 10 | — | | | | | 100 |
| Comparative Example 1 | 30 | 25 | 65 | 10 | HIL-1 | IRH1-5 | RD-1 | H2-30 | ETL1-3 | 1.5 |
| Comparative Example 2 | 30 | 25 | 65 | 10 | | | | | | 30 |
| Comparative Example 3 | 30 | 25 | 65 | 10 | | | | | | 50 |
| Comparative Example 4 | 30 | 25 | 65 | 10 | | | | | | 70 |
| Comparative Example 5 | 30 | 25 | 65 | 10 | | | | | | 90 |
| Comparative Example 6 | 30 | 25 | 65 | 10 | | | | | | 95 |
| Comparative Example 7 | 30 | 25 | 65 | 10 | — | | | | | 100 |

| | Measurement condition | Luminous efficiency | | Peak wavelength | Shift |
|---|---|---|---|---|---|
| | Current density (mA/cm$^2$) | Absolute value (%) | Relative value*1 | Absolute value (nm) | amount*2 (nm) |
| Reference Example 1 | 100 | 4.0 | 1 | 770 | 70 |
| Example 2 | 100 | 2.6 | 0.65 | 800 | 40 |
| Example 3 | 100 | 1.8 | 0.45 | 820 | 20 |
| Example 4 | 100 | 1.0 | 0.25 | 835 | 5 |
| Reference Example 5 | 100 | 0.3 | 0.075 | 840 | 0 |
| Reference Example 6 | 100 | 0.25 | 0.0625 | 840 | 0 |
| Reference Example 7 | 100 | 0.2 | 0.05 | 840 | 0 |
| Reference Example 8 | 100 | 1.0 | 1 | 890 | 65 |
| Example 9 | 100 | 0.6 | 0.6 | 925 | 30 |
| Example 10 | 100 | 0.38 | 0.38 | 940 | 15 |
| Example 11 | 100 | 0.2 | 0.2 | 950 | 5 |
| Reference Example 12 | 100 | 0.07 | 0.07 | 955 | 0 |
| Reference Example 13 | 100 | 0.05 | 0.05 | 955 | 0 |
| Reference Example 14 | 100 | 0.04 | 0.04 | 955 | 0 |
| Comparative Example 1 | 100 | 5.0 | 1 | 610 | 75 |
| Comparative Example 2 | 100 | 0.3 | 0.06 | 670 | 15 |
| Comparative Example 3 | 100 | 0.2 | 0.04 | 675 | 10 |
| Comparative Example 4 | 100 | 0.1 | 0.02 | 680 | 5 |
| Comparative Example 5 | 100 | 0.02 | 0.004 | 685 | 0 |
| Comparative Example 6 | 100 | 0.015 | 0.003 | 685 | 0 |
| Comparative Example 7 | 100 | 0.01 | 0.002 | 685 | 0 |

*1The relative value of EQE was normalized by the EQE of the material having a doping concentration of 1.5 wt % for each material.
*2The shift amount of the wavelength was obtained by taking the wavelength of the material having a doping concentration of 100 wt % as a standard for each material.

As apparent from Table 1 and FIG. 5, with respect to the light-emitting elements of Reference Examples 1, and 5 to 7 and Examples 2 to 4 in which the compound represented by the above formula IRD1-1 was used as the light-emitting material, when looking at the relationship between the relative value of the external quantum efficiency (EQE) and the doping concentration, in the case of Examples 2 to 4 in which the doping concentration (the content of the light-emitting material) was 30 wt % or more and 70 wt % or less, and Reference Examples 5 to 7 in which the doping concentration was 90 wt % or more and 100 wt % or less, the relationship is expressed as linear functions having different slopes, and the result demonstrated that the decrease in the external quantum efficiency (EQE) was suppressed when the doping concentration was 30 wt % or more and 70 wt % or less in Examples 2 to 4. Further, as shown in Table 1, in Examples 2 to 4 in which the doping concentration was 30 wt % or more and 70 wt % or less, the result demonstrated that the shift of the peak wavelength was reduced as compared with Reference Example 1 in which the doping concentration was 1.5 wt %.

Further, as apparent from Table 1 and FIG. 5, with respect to the light-emitting elements of Reference Examples 8, and 12 to 14 and Examples 9 to 11 in which the compound represented by the above formula IRD2-1 was used as the light-emitting material, when looking at the relationship between the relative value of the external quantum efficiency (EQE) and the doping concentration, in the case of Examples 9 to 11 in which the doping concentration (the content of the light-emitting material) was 30 wt % or more and 70 wt % or less, and Reference Examples 12 to 14 in which the doping concentration was 90 wt % or more and 100 wt % or less, the relationship is expressed as linear functions having different slopes, and the result demonstrated that the decrease in the external quantum efficiency (EQE) was suppressed when the doping concentration was 30 wt % or more and 70 wt % or less in Examples 9 to 11 in the same manner as in the case of using the compound represented by the above formula IRD1-1 as the light-emitting material. Further, as shown in Table 1, in Examples 9 to 11 in which the doping concentration was 30 wt % or more and 70 wt % or less, the result demonstrated that the shift of the peak wavelength was reduced as compared with Reference Example 8 in which the doping concentration was 1.5 wt %.

On the other hand, in the case of the light-emitting elements of Comparative Examples 1 to 7 in which the compound represented by the above formula RD-1 was used as the light-emitting material, as apparent from Table 1 and FIG. 5, when looking at the relationship between the relative value of the external quantum efficiency (EQE) and the doping concentration, the relationship is expressed as a linear function having one slope in a wide concentration range of Comparative Examples 2 to 7 in which the doping concentration (the content of the light-emitting material) was 30 wt % or more and 100 wt % or less, and the result demonstrated that a high decrease in the external quantum efficiency (EQE) was observed even when the doping concentration was 30 wt % or more and 70 wt % or less in Comparative Examples 2 to 4.

The entire disclosure of Japanese Patent Application No. 2017-047586 is hereby incorporated herein by reference.

What is claimed is:

1. A light-emitting element, comprising:
   an anode;
   a cathode; and
   a light-emitting layer which is provided between the anode and the cathode, contains a light-emitting material and a host material that holds the light-emitting material, and emits light having a peak wavelength in a near-infrared region by applying a current between the anode and the cathode,
   wherein the content of the light-emitting material in the light-emitting layer is 30 wt % or more and 70 wt % or less, and
   the light-emitting material contains at least one of a compound represented by the following general formula (IRD1) and a compound represented by the following formula IRD2-1:

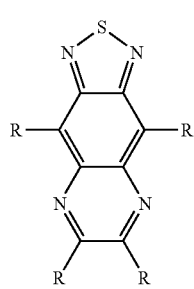

(IRD1)

wherein R each independently represents an aryl group, an arylamino group, triarylamine, or a group containing at least one of the derivatives thereof,

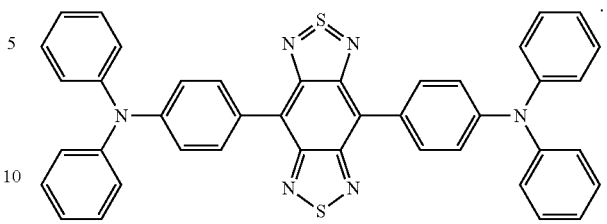

IRD2-1

2. The light-emitting element according to claim 1, wherein the compound represented by the general formula (IRD1) is a compound represented by the following formula IRD1-1:

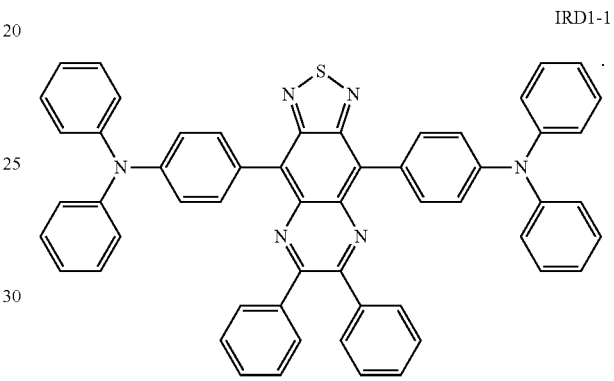

IRD1-1

3. A light-emitting device, comprising the light-emitting element according to claim 2.

4. A light source, comprising the light-emitting element according to claim 2.

5. An authentication device, comprising the light-emitting element according to claim 2.

6. An electronic apparatus, comprising the light-emitting element according to claim 2.

7. The light-emitting element according to claim 1, wherein the host material contains a compound represented by the following formula IRH1:

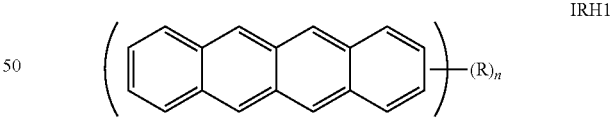

IRH1 wherein n represents a natural number of 1 to 12, and R each independently represents a hydrogen atom, an alkyl group, an aryl group which may have a substituent, or an arylamino group.

8. The light-emitting element according to claim 1, wherein the light-emitting layer emits light having the peak wavelength of 700 nm or more and 960 nm or less.

9. The light-emitting element according to claim 1, wherein the content of the light-emitting material in the light-emitting layer is 50 wt % or more and 70 wt % or less.

10. A light-emitting device, comprising the light-emitting element according to claim 1.

11. A light source, comprising the light-emitting element according to claim 1.

12. An authentication device, comprising the light-emitting element according to claim 1.

13. An electronic apparatus, comprising the light-emitting element according to claim 1.

\* \* \* \* \*